(12) United States Patent
Nakanishi et al.

(10) Patent No.: US 7,962,824 B2
(45) Date of Patent: Jun. 14, 2011

(54) MEMORY CONTROLLER, NONVOLATILE MEMORY DEVICE, NONVOLATILE MEMORY SYSTEM AND DATA WRITING METHOD

(75) Inventors: Masahiro Nakanishi, Kyoto (JP); Manabu Inoue, Osaka (JP); Masayuki Toyama, Osaka (JP); Tomoaki Izumi, Osaka (JP); Tetsushi Kasahara, Osaka (JP); Kazuaki Tamura, Osaka (JP); Kiminori Matsuno, Osaka (JP)

(73) Assignee: Panasonic Corporation, Osaka (JP)

( * ) Notice: Subject to any disclaimer, the term of this patent is extended or adjusted under 35 U.S.C. 154(b) by 1429 days.

(21) Appl. No.: 11/434,494

(22) Filed: May 16, 2006

(65) Prior Publication Data

US 2007/0011581 A1    Jan. 11, 2007

(30) Foreign Application Priority Data

May 16, 2005    (JP) .................................. 2005-142558

(51) Int. Cl.
    *G06F 11/00*    (2006.01)
(52) U.S. Cl. ...................................................... 714/747
(58) Field of Classification Search .................... 714/747
    See application file for complete search history.

(56) References Cited

U.S. PATENT DOCUMENTS

| 4,835,777 | A | * | 5/1989 | DeLuca et al. ................. 714/822 |
| 6,288,935 | B1 | | 9/2001 | Shibata et al. |
| 6,608,784 | B2 | | 8/2003 | Kanamori et al. |
| 2004/0172576 | A1 | * | 9/2004 | Yoshii et al. ....................... 714/6 |
| 2004/0216027 | A1 | * | 10/2004 | Ueno ............................. 714/758 |

FOREIGN PATENT DOCUMENTS

| JP | 2001-93288 A | 4/2001 |
| JP | 2003-76615 A | 3/2003 |

* cited by examiner

*Primary Examiner* — Scott T Baderman
*Assistant Examiner* — Enam Ahmed
(74) *Attorney, Agent, or Firm* — Smith Patent Office

(57) ABSTRACT

With nonvolatile memory device employing a nonvolatile memory suc h as multiple-valued NAND flash memory or the like in which each memory cell holds data in a plurality of pages, there is such a problem that, if an error occurred under writing data, data stored in other page in the same group of the current page is changed, and hence the object of the present invention is to solve this problem. In writing data into a nonvolatile memory 110, when error occurred under writing data into a certain page, an error page identification part 128 identifies an error type and a physical address of the page where error occurred. An error corrector 129 then corrects errors occurred in other pages belonging to the same group of error occurrence page.

25 Claims, 43 Drawing Sheets

FIG. 1

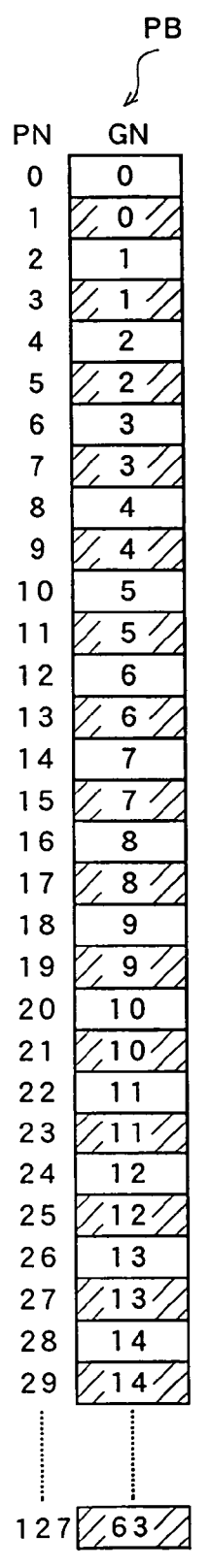

| PN | GN |
|---|---|
| 0 | 0 |
| 1 | 0 |
| 2 | 1 |
| 3 | 1 |
| 4 | 2 |
| 5 | 2 |
| 6 | 3 |
| 7 | 3 |
| 8 | 4 |
| 9 | 4 |
| 10 | 5 |
| 11 | 5 |
| 12 | 6 |
| 13 | 6 |
| 14 | 7 |
| 15 | 7 |
| 16 | 8 |
| 17 | 8 |
| 18 | 9 |
| 19 | 9 |
| 20 | 10 |
| 21 | 10 |
| 22 | 11 |
| 23 | 11 |
| 24 | 12 |
| 25 | 12 |
| 26 | 13 |
| 27 | 13 |
| 28 | 14 |
| 29 | 14 |
| ... | ... |
| 127 | 63 |

| PN | GN |
|---|---|
| 0 | 0 |
| 1 | 1 |
| 2 | 0 |
| 3 | 1 |
| 4 | 2 |
| 5 | 3 |
| 6 | 2 |
| 7 | 3 |
| 8 | 4 |
| 9 | 5 |
| 10 | 4 |
| 11 | 5 |
| 12 | 6 |
| 13 | 7 |
| 14 | 6 |
| 15 | 7 |
| 16 | 8 |
| 17 | 9 |
| 18 | 8 |
| 19 | 9 |
| 20 | 10 |
| 21 | 11 |
| 22 | 10 |
| 23 | 11 |
| 24 | 12 |
| 25 | 13 |
| 26 | 12 |
| 27 | 13 |
| 28 | 14 |
| 29 | 15 |
| ... | ... |
| 127 | 63 |

FIG. 3

| PN | PB |
|---|---|
| | GN |
| 0 | 0 |
| 1 | 1 |
| 2 | 2 |
| 3 | 3 |
| 4 | 0 |
| 5 | 1 |
| 6 | 4 |
| 7 | 5 |
| 8 | 2 |
| 9 | 3 |
| 10 | 6 |
| 11 | 7 |
| 12 | 4 |
| 13 | 5 |
| 14 | 8 |
| 15 | 9 |
| 16 | 6 |
| 17 | 7 |
| 18 | 10 |
| 19 | 11 |
| 20 | 8 |
| 21 | 9 |
| 22 | 12 |
| 23 | 13 |
| 24 | 10 |
| 25 | 11 |
| 26 | |
| 27 | |
| 28 | 12 |
| 29 | 13 |
| ⋮ | ⋮ |
| 127 | 63 |

FIG. 10

| PN | | | | | |
|---|---|---|---|---|---|
| 0 | PSA 0 | PSA 1 | PSA 2 | PSA 3 | MR |
| 1 | PSA 4 | PSA 5 | PSA 6 | PSA 7 | MR |
|   | PSA 8 | PSA 9 | PSA 10 | PSA 11 | MR |
| 126 | PAS 504 | PAS 505 | PAS 506 | PAS 507 | MR |
| 127 | PAS 508 | PAS 509 | PAS 510 | PAS 511 | MR |

FIG. 15

| PN | 154a | 154b |
|---|---|---|
| 0 | 4 | 0 |
| 1 | 5 | 0 |
| 2 | 8 | 0 |
| 3 | 9 | 0 |
| 4 | 0 | 1 |
| 5 | 1 | 1 |
| 6 | 12 | 0 |
| 7 | 13 | 0 |
| 8 | 2 | 1 |
| 9 | 3 | 1 |
| 10 | 16 | 0 |
| 11 | 17 | 0 |
| 12 | 6 | 1 |
| 13 | 7 | 1 |
| 14 | 20 | 0 |
| 15 | 21 | 0 |
| 16 | 10 | 1 |
| 17 | 11 | 1 |
| 18 | 24 | 0 |
| 19 | 25 | 0 |
| 20 | 14 | 1 |
| 21 | 15 | 1 |
| 22 | 28 | 0 |
| 23 | 29 | 0 |
| 24 | | |
| 25 | | |
| 26 | | |
| 27 | | |
| 28 | | |
| 29 | | |
| ⋮ | ⋮ | ⋮ |
| 127 | 121 | 1 |
| | 2 | |

FIG. 16

| Word number | 125a | 125b | 125c | |
|---|---|---|---|---|
| 0 | | LA0 | 0 | 0 |
| 1 | | LA1 | 0 | 0 |
| 2 | | LA2 | 0 | 0 |
| 3 | | LA3 | 0 | 0 |
| RP→ 4 | | LA4 | 1 | 0 |
| 5 | | LA5 | 1 | 0 |
| 6 | | LA6 | 1 | 0 |
| 7 | | LA7 | 1 | 0 |
| 8 | | LA8 | 1 | 1 |
| 9 | | LA9 | 1 | 1 |
| 10 | | LA10 | 1 | 1 |
| 11 | | LA11 | 1 | 1 |
| WP→ 12 | | LA12 | 0 | 0 |
| 13 | | LA13 | 0 | 0 |
| 14 | | LA14 | 0 | 0 |
| 15 | | LA15 | 0 | 0 |
| 16 | | LA16 | 0 | 0 |
| ⋮ | | | | |
| 27 | | LA27 | 0 | 0 |
| 28 | | LA28 | 0 | 0 |
| 29 | | LA29 | 0 | 0 |
| 30 | | LA30 | 0 | 0 |
| 31 | | LA31 | 0 | 0 |

MEMORY CONTROLLER, NONVOLATILE MEMORY DEVICE, NONVOLATILE MEMORY SYSTEM AND DATA WRITING METHOD

BACKGROUND OF THE INVENTION

1. Field of the Invention

The present invention relates to a nonvolatile memory Device provided with a rewritable nonvolatile memory, a memory controller for controlling this device, a nonvolatile memory System, and a data writing method.

2. Discussion of the Related Art

Demand for a nonvolatile memory Device provided with a rewritable nonvolatile main storage memory has been expanding primarily in the field of a semiconductor memory card. The memory card is provided with a flash memory as the nonvolatile memory and a memory controller for controlling it. The memory controller is designed to execute reading and writing controls for flash memories according to reading and writing instructions given by an access device such as digital still camera, personal computer or the like. With the flash memory, writing errors occur relatively frequently since characteristics of storage elements are quite-variable compared to those of volatile memories such as RAM. To overcome this inconvenience, some memory cards incorporating a nonvolatile memory perform alternative processing to replace a storage area where writing error occurred with other storage area (Japanese Unexamined Patent Publication No. 2003-76615). In this disclosure, for the nonvolatile flash memory, a flash memory in which each memory cell is closed in one page as represented by binary NAND is normally employed.

In the meantime, high expectations are placed on multiple-valued NAND flash memories to be used as low-cost flash memories and it is more likely that flash memories of this sort will become main stream of main storage memory for the memory card in the future. Japanese Unexamined Patent Publication No. 2001-93288 discloses a technology in which page structure of multiple-valued NAND flash memory is improved for the sake of realization of high-rate access. Conventional flash memory which is of binary memory type is designed in such that one memory cell holds a data of a certain bit in one page. On the other hand, multiple-valued NAND flash memory is configured in such that each memory cell lies astride over a plurality of pages, for example two pages, that is, holds a plurality of bits data.

FIGS. 1 to 3 are block diagrams showing nonvolatile memories in which each memory cell are configured lying astride over a plurality of pages as the multiple-valued NAND flash memory. In FIGS. 1 to 3, pages bearing the same page group number (GN) are two pages in which data being held by one memory cell is contained. A page without hatching is referred to as the first page and a page with diagonal hatching is referred to as the second page.

For example, a multiple-valued NAND flash memory depicted in FIG. 1 constitutes one memory cell while an even number page and an odd number page form a pair. The group number identified by GN in the drawings is a page pair in which the same page shares one memory cell. In each of page pairs, a page with lower order of address is set to be the first page and a page with higher order (a page with hatching) is set to be the second page. In FIG. 1, the first page and the second page are adjoining while the first page and the second page are separated in FIGS. 2 and 3. This is because they are isolated in order to reduce effects (disturbance) upon data stored in one page by writing into the other page.

However, when one memory cell is constituted lying astride over two pages, there is such a problem that if an error occurs in writing into the one page, the data stored in the other page will be changed. This problem will be discussed hereafter referring to FIGS. 4 to 6.

FIG. 4 is a characteristics diagram showing voltage distribution of a memory cell of multiple-valued NAND flash memories shown in FIGS. 1 to 3. This memory cell stores information of 2 bits. A horizontal axis represents voltage V obtained from the memory cell and a vertical axis represents probability P to attain the voltage.

Now, in four distributions shown in FIG. 4, codes "11", "10", "00" and "01" are assigned from the left. A right digit (bit) of each code corresponds to a first page and a left digit (bit) corresponds to a second page. Each memory cell is expressed as "11" in erased state. When writing is attempted to the first page from this state, and writing is made normally, each memory cell remains in "11" state or changes from "11" state to "10" state. After that, when writing is attempted to the second page, and writing is made normally, each memory cell remains from "11" state to "11" state or changes to "01" state. Otherwise, it remains from "10" state to "10" state or changes to "00" state.

FIG. 5 is a characteristics diagram showing a state writing into a memory cell has been normally completed. In FIG. 5, it is assumed that information "01" that is a target value is written by writing into the first page and the second page. As for writing step, first "11" state is obtained by writing into the first page and "01" state is obtained by writing into the second page.

FIG. 6 is a characteristics diagram showing a state when writing into memory cell has failed to be completed normally. FIG. 6 illustrates such a case, when writing into the second page, in a step applied voltage to a memory cell is changed from "11" state to "01" state, it is put into "10" or "00" state due to trouble such as voltage variation within the flash memory. Hereinafter, this is referred to as "flash trouble". Further, when writing into the second page, in a step applied voltage to the memory cell is changed from "11" state to "01" state, there is such a case power supply to be supplied to the nonvolatile memory is turned OFF at a point of time when the voltage reached "10" or "00" state, and the state results in "10" or "00". Hereinafter, this is referred to as "Power shutdown".

Further, with the memory card, since the power is normally supplied from an access device side, if the power supply for the access device is turned OFF carelessly under writing data or the memory card is forcibly taken out from the access device, a power shutdown will occur.

SUMMARY OF THE INVENTION

Problems related to system for a case where the multiple-valued NAND flash memory is applied to conventional nonvolatile memory System as shown in FIG. 3 will be described hereafter. First, using FIG. 7, conventional error correction taken for a case where the multiple-valued NAND flash memory is used and a flash trouble occurs will be explained. FIG. 7A shows such a state that data are written sequentially from a buffer shown at the left end in the drawing to a physical block PB10 as shown by A, B and C.

Now, as FIG. 7A shows, suppose that a flash trouble occurred when writing page 17 that is the second page in group GN7 into a certain physical block, for example, physical block PB10. In this illustration, a star mark denotes a trouble. Since group GN7 is composed of pages 11 and 17, data stored in page 11 is in some cases changed.

FIG. 7B is a drawing explaining operations of error correction processing taken at the flash trouble occurrence. With conventional error correction processing, data stored in pages 0 to 16 of the physical block 10 is copied to corresponding page of the PB5 and further, data to be stored in page 17 of the PB10, i.e., data of logical addresses LA68 to 71, is retry written into page 17 of the PB5. Further, when the power shutdown occurred, a new data is written again from page 17 at the point of time when the power is turned on next. In this case, the data recorded in pages 0 to 16 is also copied to corresponding page of the PB5.

However, when the data being stored in page 11 of the PB10 has been changed, restoration of the data by conventional nonvolatile memory Device is not possible, and therefore, use of incorrect data is continued. When the data is an important data such as file system, it is possible such a serious problem, that reading from nonvolatile memory Device is not possible at all, is caused. In other words, if the error correction processing described in Japanese Unexamined Patent Publication No. 2003-76615 is applied to the multiple-valued NAND flash memory described in Japanese Unexamined Patent Publication No. 2001-93288, there is such a problem that the reliability is remarkably reduced.

In view of the foregoing, an object of the present invention is to present a high-reliability memory controller, nonvolatile memory Device, nonvolatile memory System and data writing method which are capable of correcting such an error that failure in writing into a prescribed page results in changes in the data stored in other page constituting a memory cell same as the prescribed page.

To solve the problems, a memory controller of the present invention that writes data from outside to a nonvolatile memory composed of a plurality of pages in which each memory cell holds data in a plurality of pages constituting a group, and reads data in said nonvolatile memory comprises: an error corrector for correcting an error occurred to data stored in other pages of the same group of writing error occurrence page.

To solve the problems, a nonvolatile memory device of the present invention comprises a nonvolatile memory which has a plurality of pages and in which each memory cell holds data over a plurality of pages constituting a group, and a memory controller for writing data given from outside and for reading data from said nonvolatile memory, wherein said controller has an error corrector for correcting an error occurred to data stored in other page in a same group of error page with writing error.

To solve the problems, a nonvolatile memory system of the present invention comprises an access device and a nonvolatile memory Device, wherein said access device is to send to said nonvolatile memory Device a writing command and data; said nonvolatile memory Device comprises a nonvolatile memory which has a plurality of pages and in which each memory cell holds data over a plurality of pages constituting a group, and a memory controller for writing data given from outside and for reading data from said nonvolatile memory; and said memory controller has an error corrector for correcting an error occurred to data stored in other page in a same group of error page with writing error.

To solve the problems, a data writing method of the present invention is to write data given from outside to a nonvolatile memory which is composed of a plurality of pages and in which each memory cell holds data in a plurality of pages constituting a group, wherein error occurred to data stored in other page in a same group of error page with writing error is erased.

Said memory controller may further comprises a reading/writing controller for writing data into said nonvolatile memory and for reading data in said nonvolatile memory; and an error page identification part for identifying, when an error occurred to writing into a certain page of said nonvolatile memory, a page of error occurrence.

Said error page identification part may comprise: a power shutdown judgment unit for judging occurrence of power shutdown; and a memory trouble judgment unit for judging occurrence of trouble in said nonvolatile memory.

Said error corrector may comprise: a page information indication unit for outputting page information relating to pages constituting a same group; a restoration page identification part for identifying, based on said error occurrence page and said page information, a page constituting a group same as the error occurrence page as a restoration page; and a substitution/restoration processor for executing restoration of a data including the restoration page identified by said restoration page identification part.

Said memory controller may further comprise a buffer memory for temporarily storing data given from outside, wherein said buffer memory has a storage capacity more than storage capacity of an area including all pages for each of groups.

Said buffer memory may be a nonvolatile RAM.

Said nonvolatile memory may comprise a plurality of physical blocks, and said substitution/restoration processor executes copy processing by transcribing data written into an error free page of a physical block under writing to a separate invalid physical block of said nonvolatile memory and restoration processing by writing again data, that has error in writing and is remained in said buffer memory, into a restoration page of said invalid physical block.

Said nonvolatile memory may comprise a plurality of physical blocks, and said substitution/restoration processor executes: copy processing by transcribing data written into error free page of the physical block under writing to a separate invalid physical block of said nonvolatile memory; restoration processing by writing data, which has error in writing and is remained in said buffer memory, again into restoration page of said invalid physical block; and retry processing by writing data that has error in writing into a physical block again into said invalid physical block.

Said nonvolatile RAM may be composed of any one of members of ferroelectric random access memory (FeRAM), magnetic recording type random access memory (MRAM), Ovonic unified memory (OUM), and resistance RAM (RRAM).

Said nonvolatile memory may comprise a plurality of physical blocks, and said error corrector comprises:

a page information indication unit for outputting information of page number N (N is an integer more than or equal to 2) constituting a same group; a writing block acquisition part for acquiring, as writing destination of data given from outside, writing object physical blocks as many as N based on page number N obtained from said page information indication unit; and a substitution processor for correcting an error by copying data stored in said writing object physical block that is different from a writing object physical block including said error page into a separate invalid physical block.

Said substitution processor may execute copying processing by transcribing data written into an error free page of the physical block under writing to a separate invalid physical block of said nonvolatile memory.

Said substitution processor may execute the copying processing by transcribing data written into an error free page of the physical block under writing to a separate invalid physical block of said nonvolatile memory, and retry processing by writing data that has error in writing of physical block again into said invalid physical block.

Said reading/writing controller, when writing same writing data into same page of the plurality of said writing object physical blocks, may write alternately so that timing of writing into each of blocks may not be overlapped.

Said reading/writing controller, when writing same writing data into a different page of the plurality of said writing object physical blocks, may write simultaneously to each block.

Said nonvolatile memory may comprise a plurality of physical blocks; said error corrector comprises: a page information indication unit for outputting page number N (N is an integer more than or equal to 2) constituting a same group and page type information; a writing block acquisition part for acquiring, as writing destination of data given from outside, writing object physical blocks as many as N based on page number N obtained from said page information indication unit; an aggregation processor for rewriting data written into said writing object physical block with a predetermined timing by aggregation into at least one physical block; and a substitution processor for correcting an error, when an error occurred, by copying data stored in said writing object physical block including said error page into a separate invalid physical block; and wherein said memory controller further includes an address management unit for selecting a physical block of writing destination based on said page type information and writing destination page.

Said substitution processor may comprise, in addition to said copy processing, retry processing for writing data that has error in writing into said physical block under writing again into said invalid physical block.

Said nonvolatile memory may comprise a plurality of physical blocks; said error corrector comprises: a page information indication unit for outputting the number of pages N (N is an integer more than or equal to 2) constituting a same memory cell, a writing block acquisition part for acquiring, as writing destination of data given from outside, the writing object physical blocks as many as N based on the number of pages N obtained from said page information indication unit; an aggregation processor for rewriting the data written into said writing object physical block with a predetermined timing by aggregation into at least one physical block; and a substitution processor for correcting an error, when an error occurred, by copying a data stored in said writing object physical block, that is different from a physical block including said error occurrence page, into a separate invalid physical block.

Said substitution processor may further include, in addition to said copy processing, retry processing for writing data that has error in writing into said physical block under writing again into said invalid physical block.

Said reading/writing controller may execute writing control so that timing of writing into each of said writing object physical blocks may not be overlapped.

According to the present invention, even if an error specific to the memory, in which a certain memory cell stores data of a plurality of pages, is occurred, it is possible to correct the error. With this configuration, such an effect is obtained that even a memory card, to which is applied a flash memory such as multiple-valued NAND which will become the mainstream in the future, can secure higher reliability equivalent to or more than that of a memory card using conventional memory in which a memory cell stores data as much as one page.

BRIEF DESCRIPTION OF THE DRAWINGAS

FIG. 1 is a configuration view showing a multiple-valued NAND nonvolatile memory;

FIG. 2 is a configuration view showing the multiple-valued NAND nonvolatile memory;

FIG. 3 is a configuration view showing the multiple-valued NAND nonvolatile memory;

FIG. 10 is an explanatory view showing format of physical block provided in a nonvolatile memory 110;

FIG. 15 is an address map showing a format of page information table;

FIG. 16 is an address map showing a storage format of a buffer memory;

Figure 30:
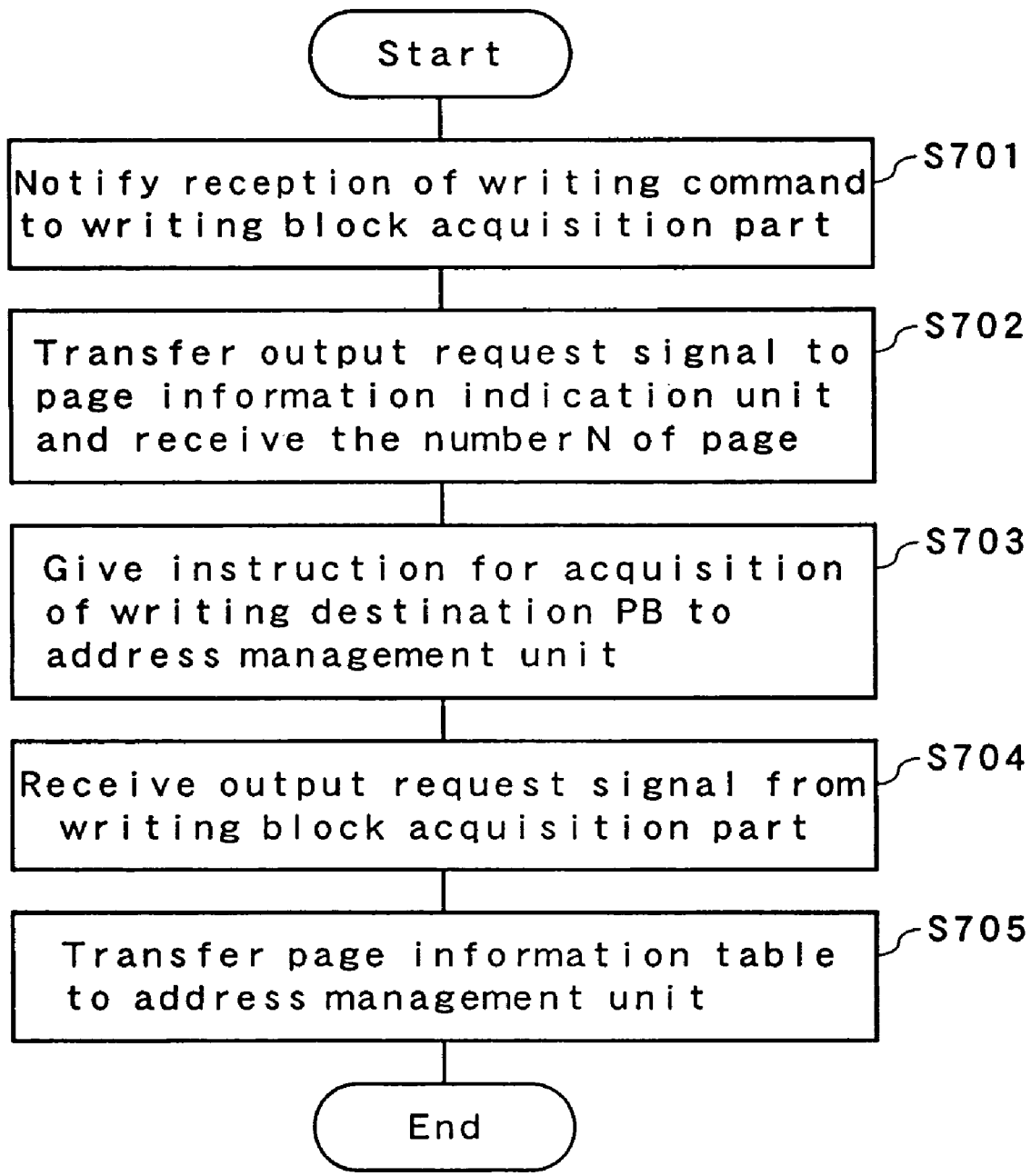
Figure 31A:
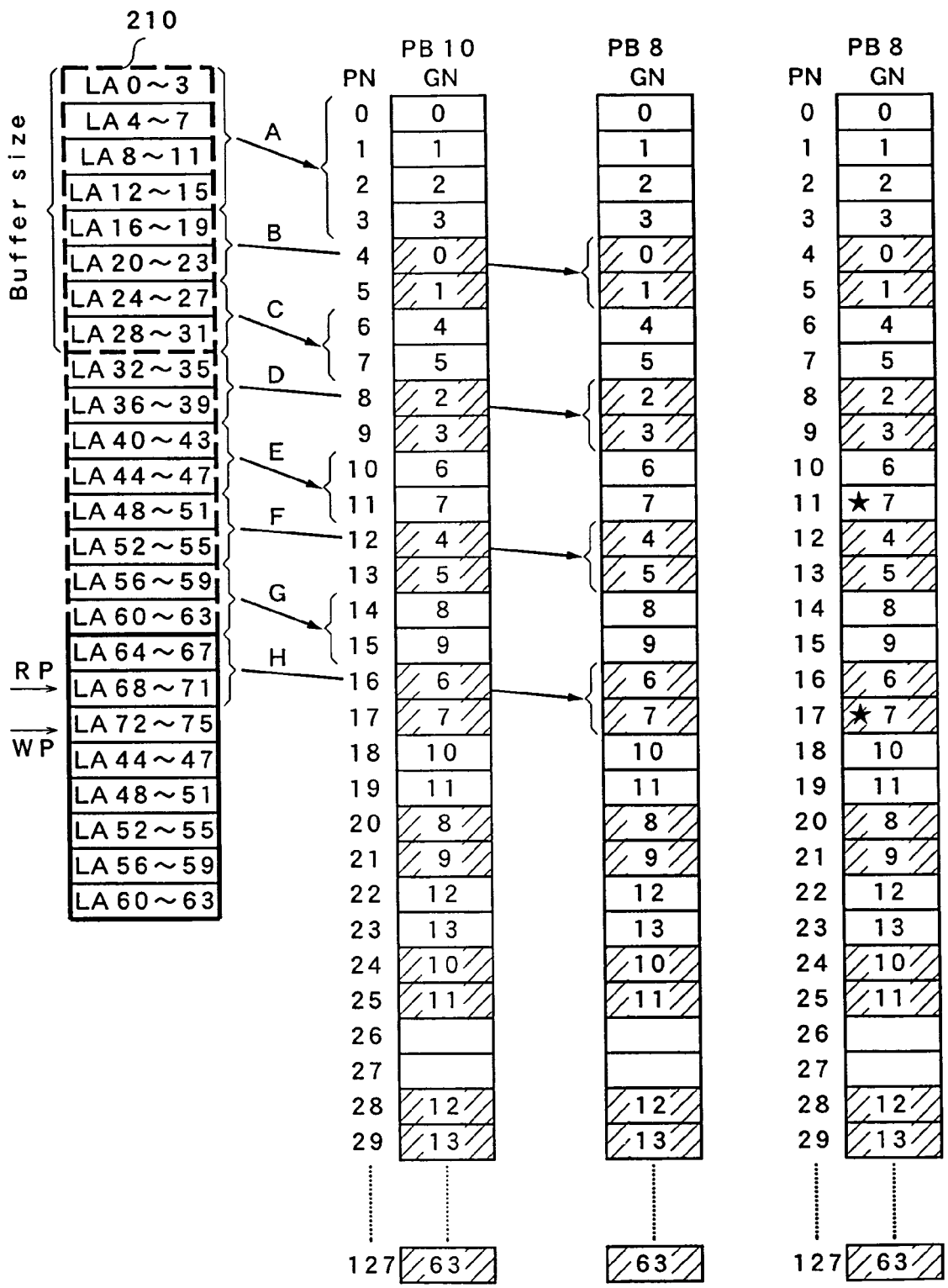
Figure 31B:
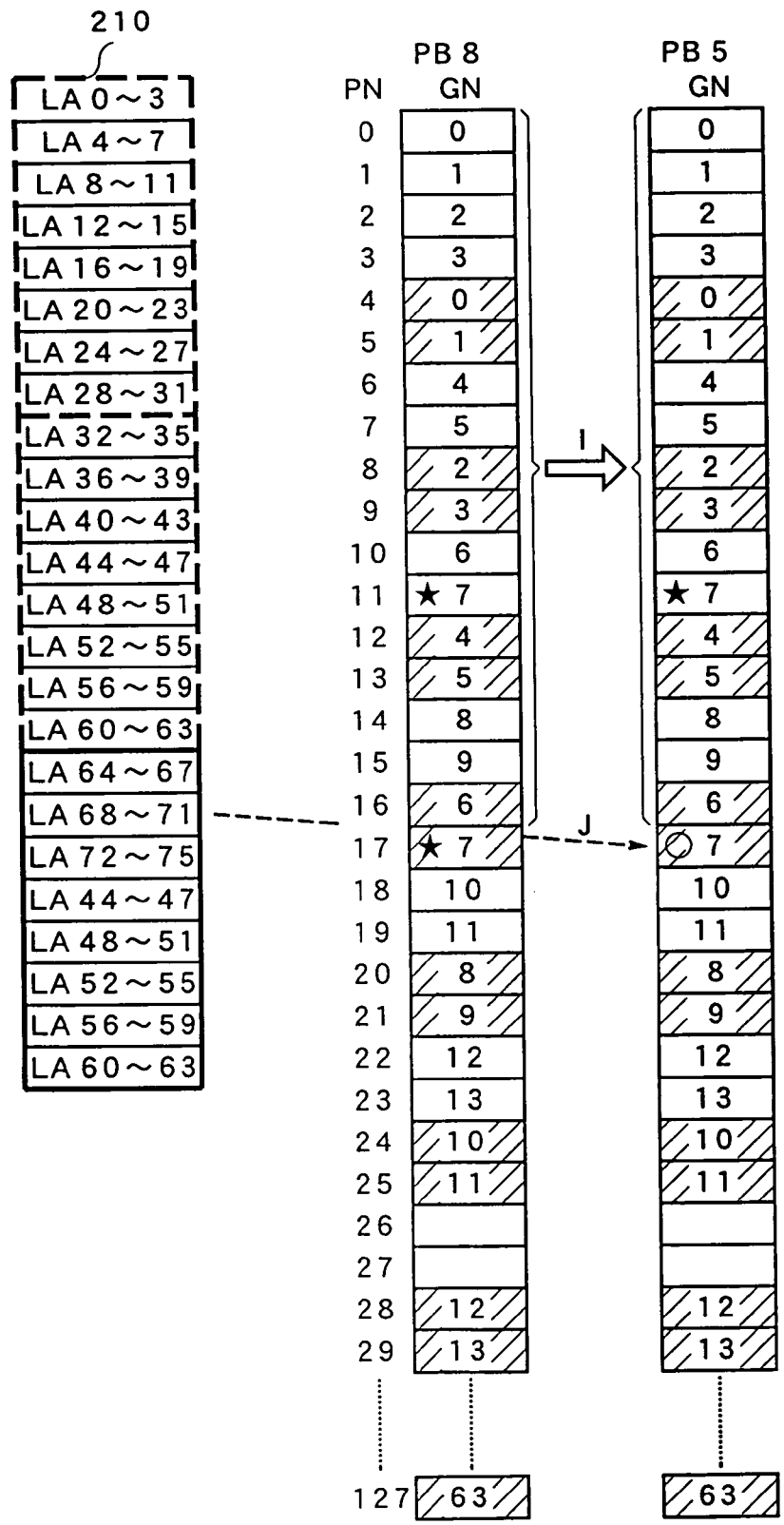
Figure 32A:
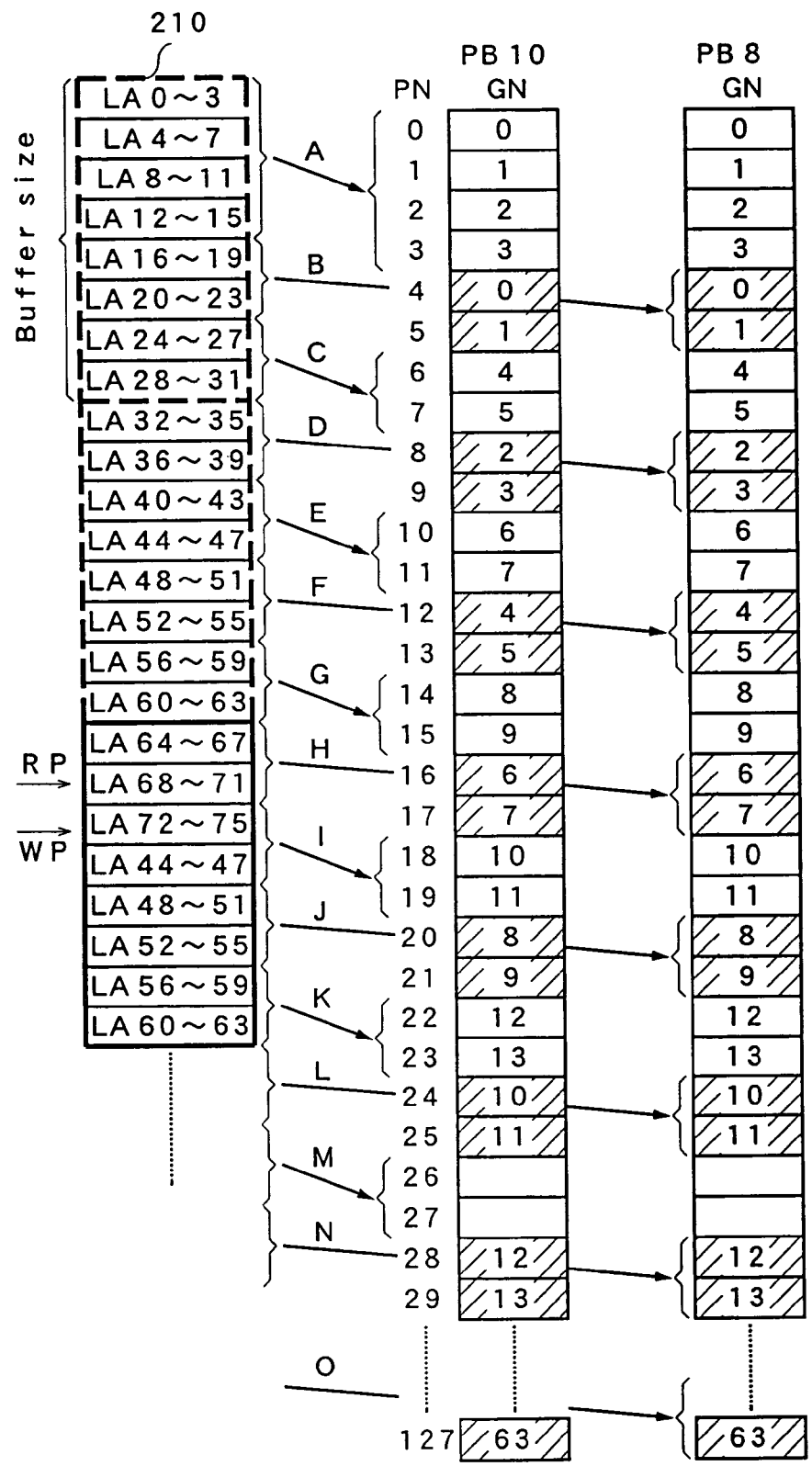
Figure 32B:
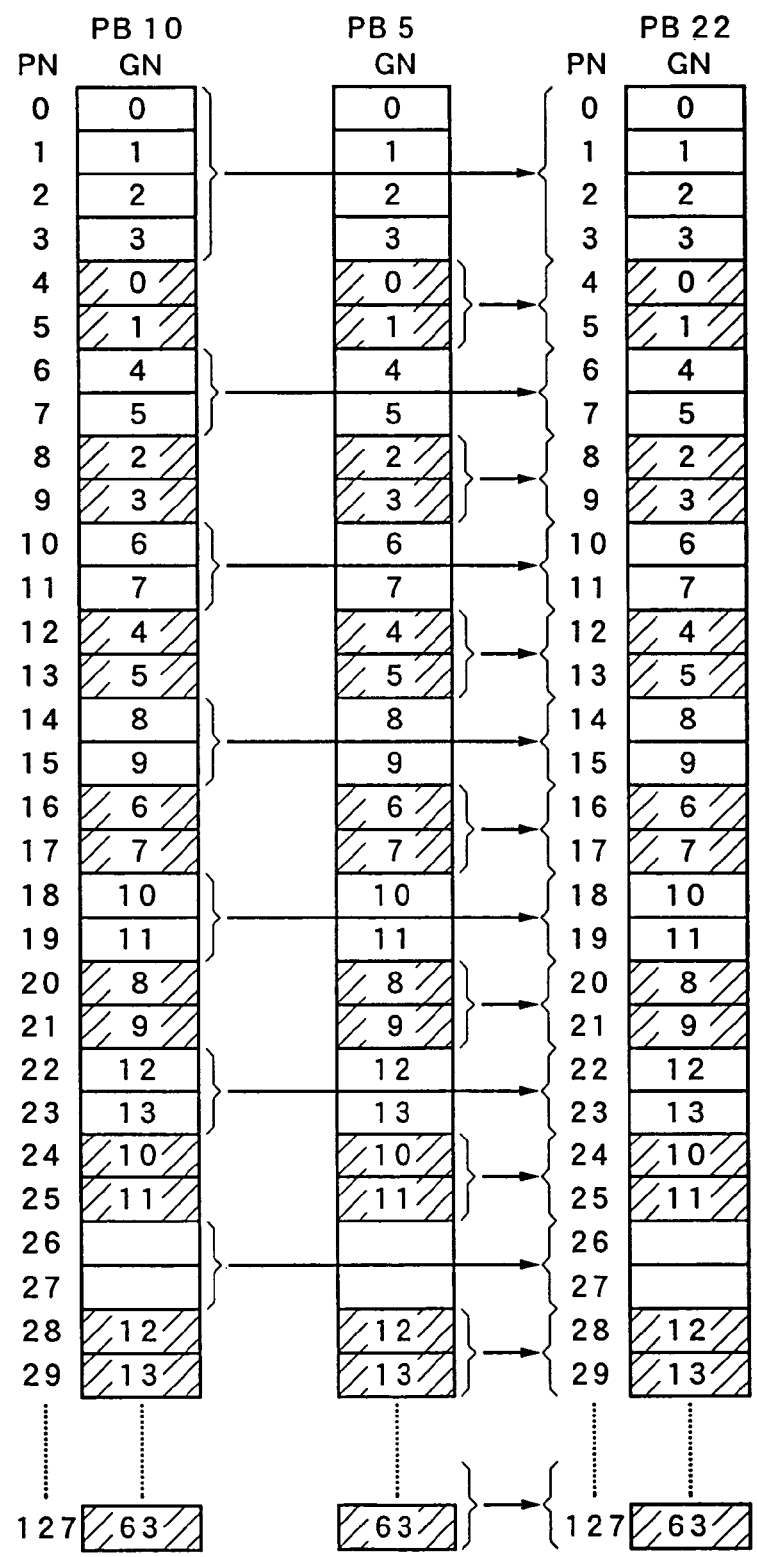
Figure 33:
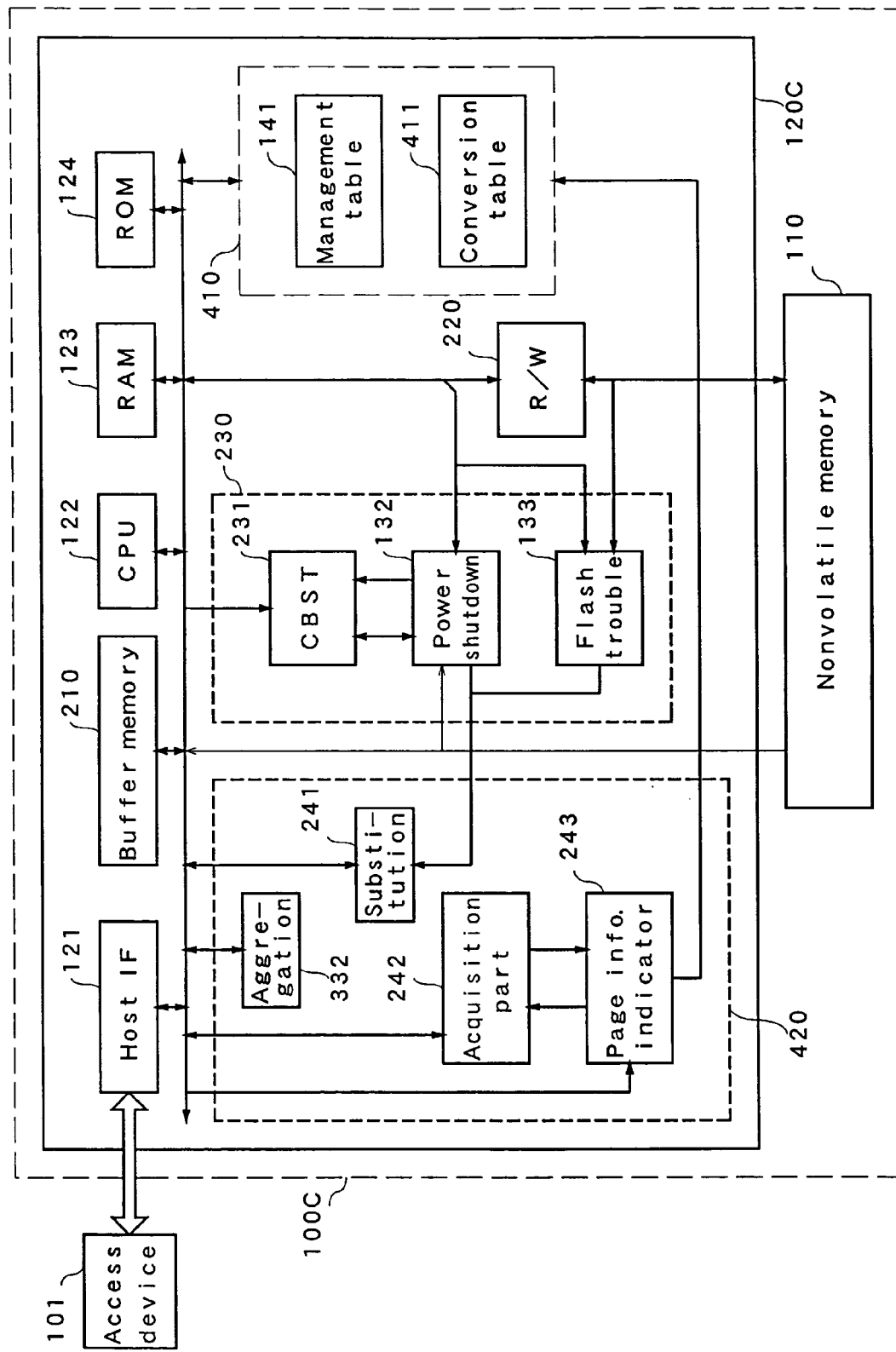
Figure 34A:
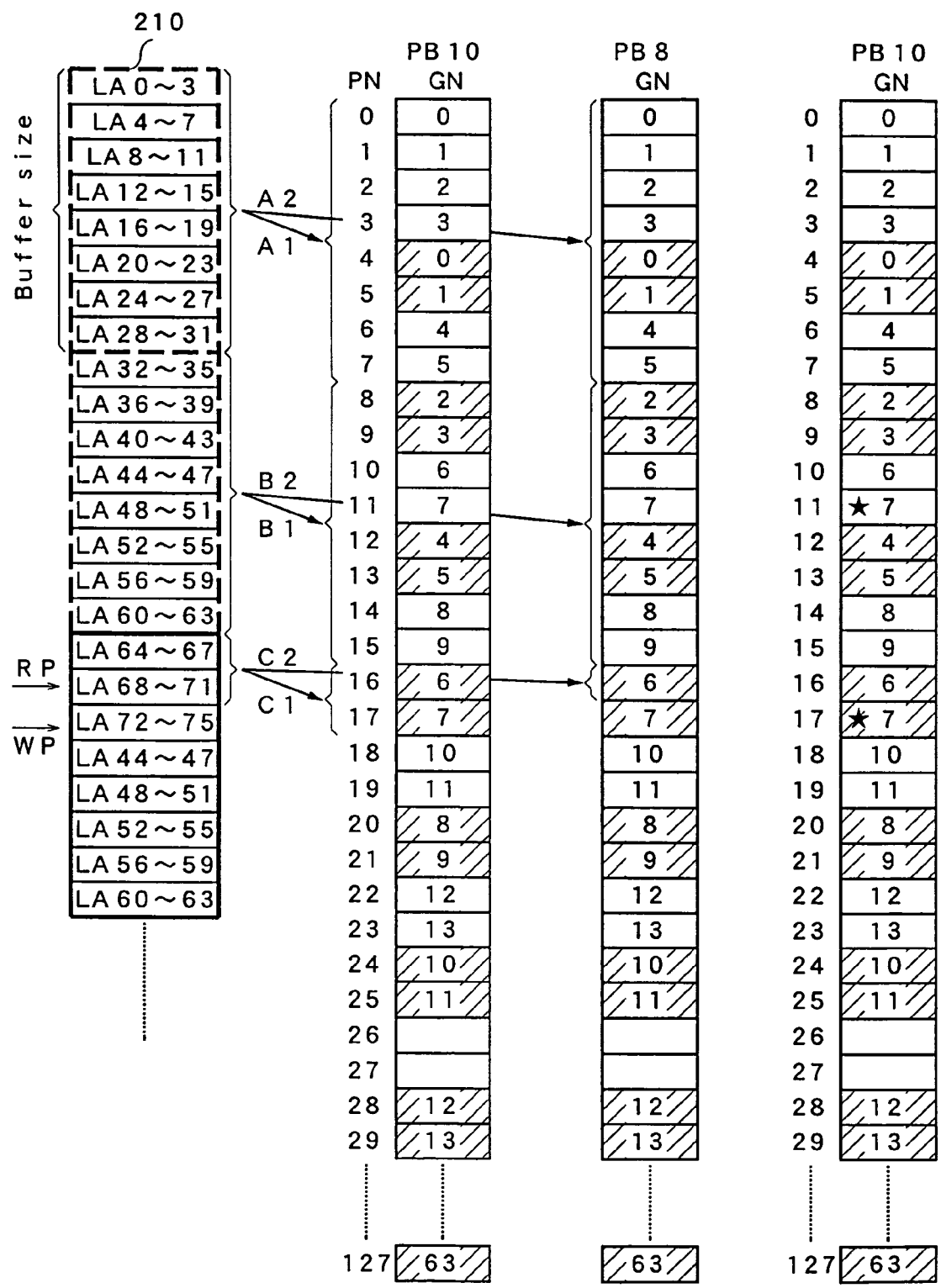
Figure 34B:
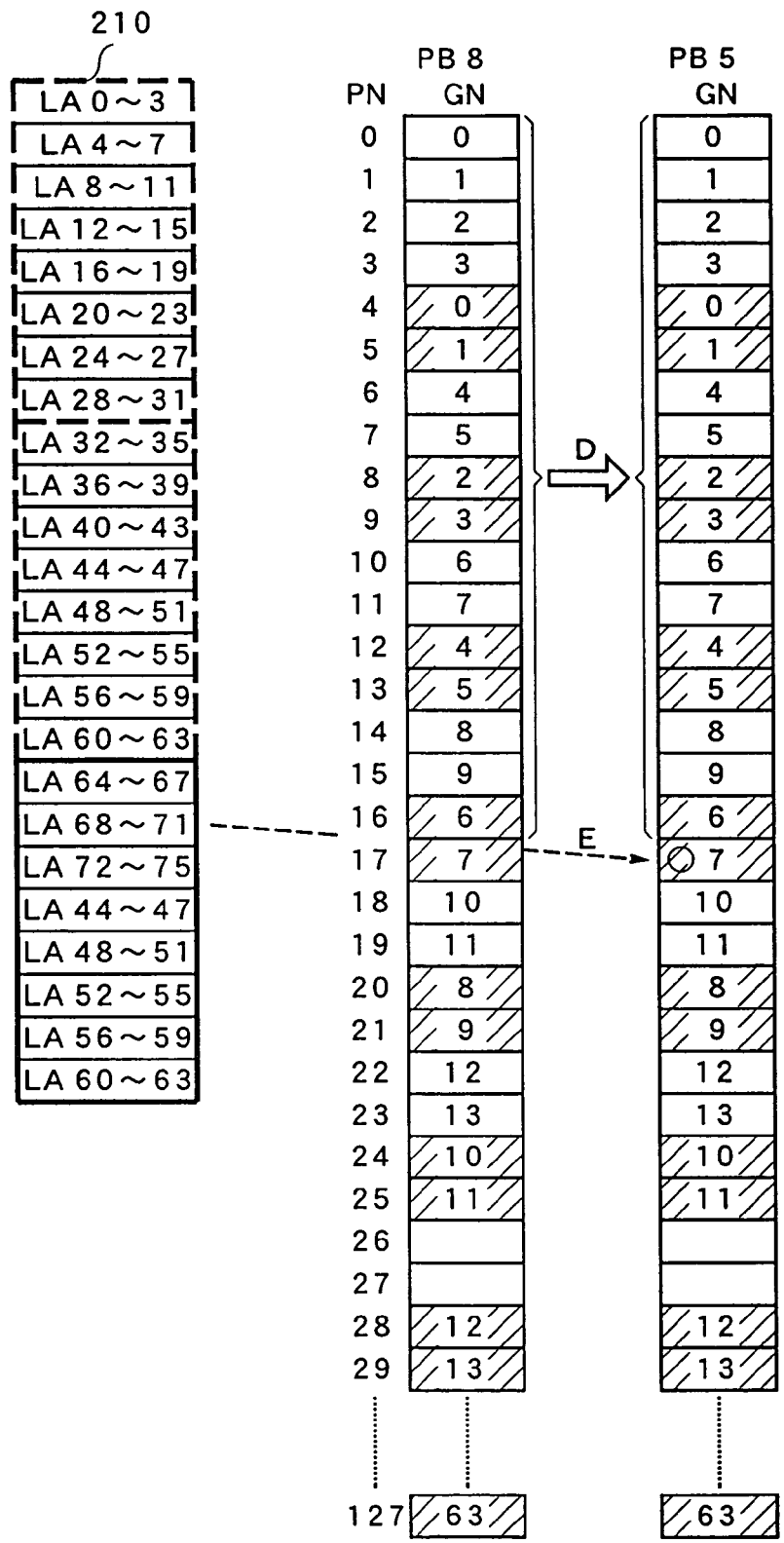
Figure 35:
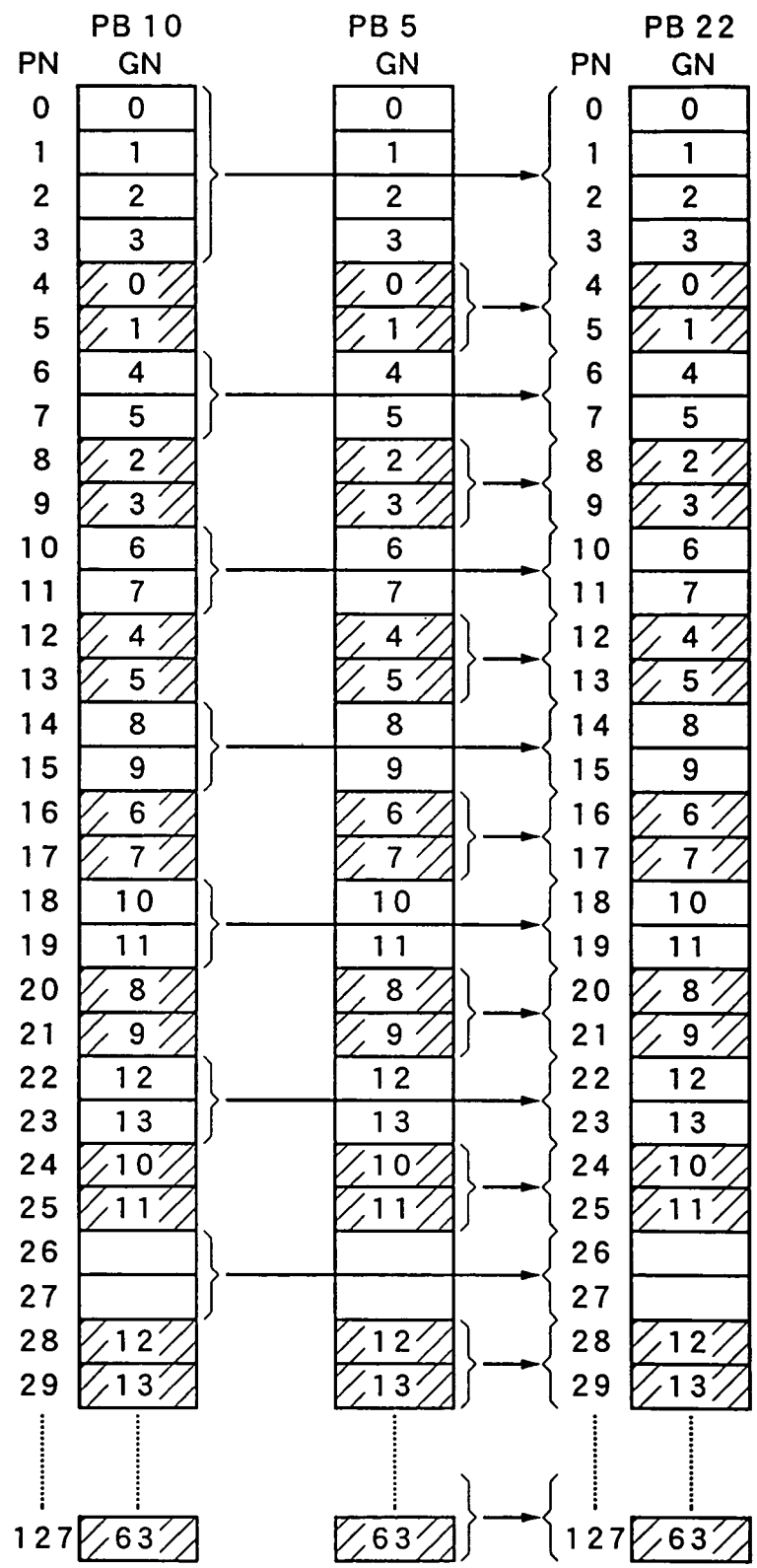

FIG. 30 is a flowchart showing contents of processing by a writing block acquisition part 242 and a page information indicator 331 according to embodiment 3;

FIG. 31A is a view explaining error correction processing at a flash trouble occurrence according to embodiment 3;

FIG. 31B is a view explaining error correction processing at the flash trouble occurrence according to embodiment 3;

FIG. 32A is a view explaining aggregation processing according to embodiment 3;

FIG. 32B is a view explaining the aggregation processing according to embodiment 3;

FIG. 33 is a block diagram of nonvolatile memory System according to embodiment 4 of the present invention;

FIG. 34A is a view explaining error correction processing at a flash trouble occurrence according to embodiment 4;

FIG. 34B is a view explaining error correction processing at the flash trouble occurrence according to embodiment 4; and FIG. 35 is a view explaining aggregation processing according to embodiment 4.

DESCRIPTION OF THE PREFERRED EMBODIMENT

Embodiment 1

Figure 4:
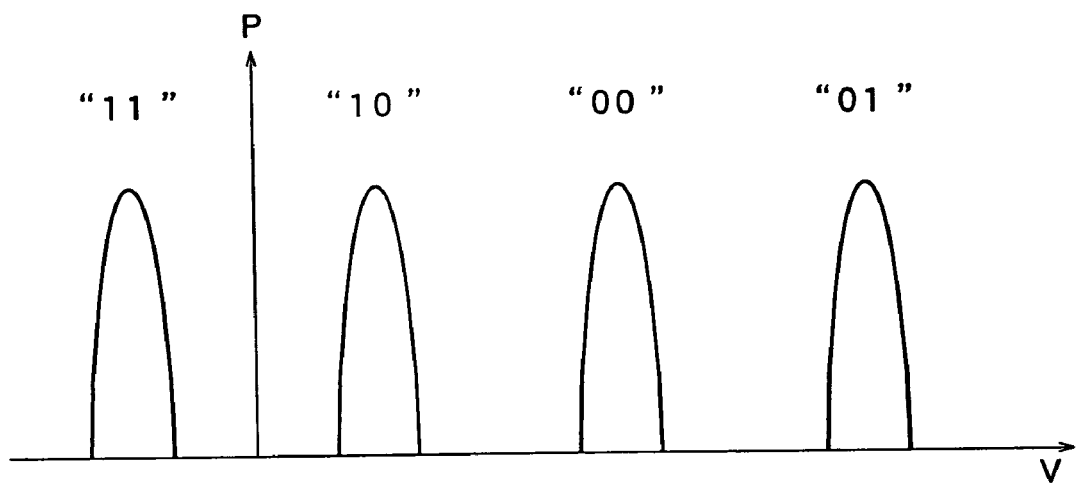
FIG. 4 is a characteristics view showing voltage distribution of a memory cell of a multiple-valued NAND flash memory.
Figure 5:
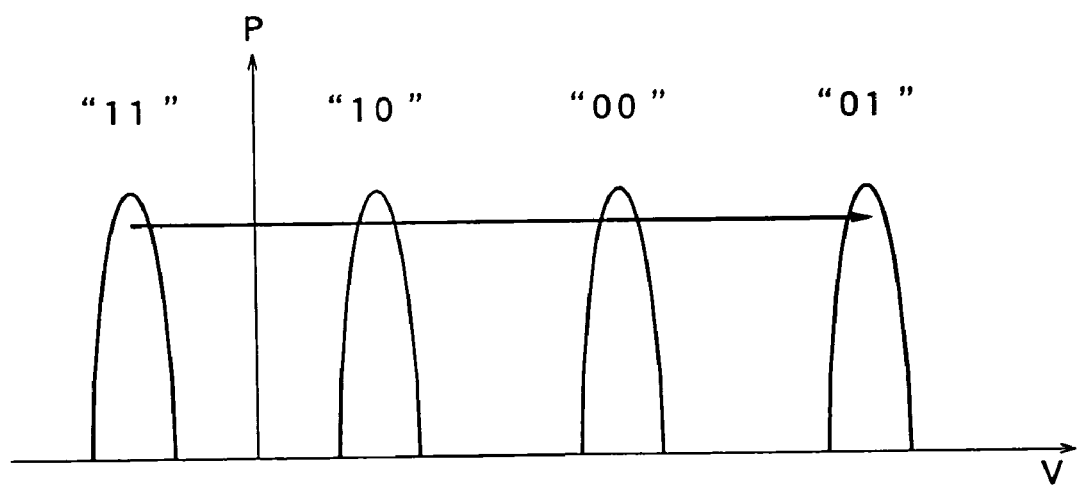
FIG. 5 is a characteristics view showing a state when a normal writing into the memory cell is completed.
Figure 6:
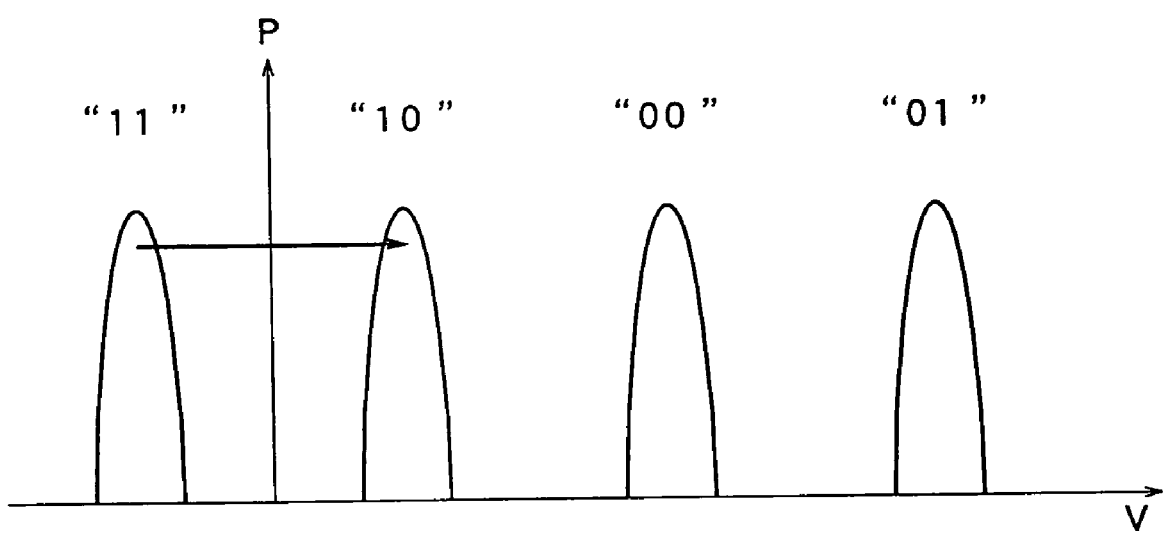
FIG. 6 is a characteristics view showing a state when the normal writing into memory cell is failed.
Figure 7A:
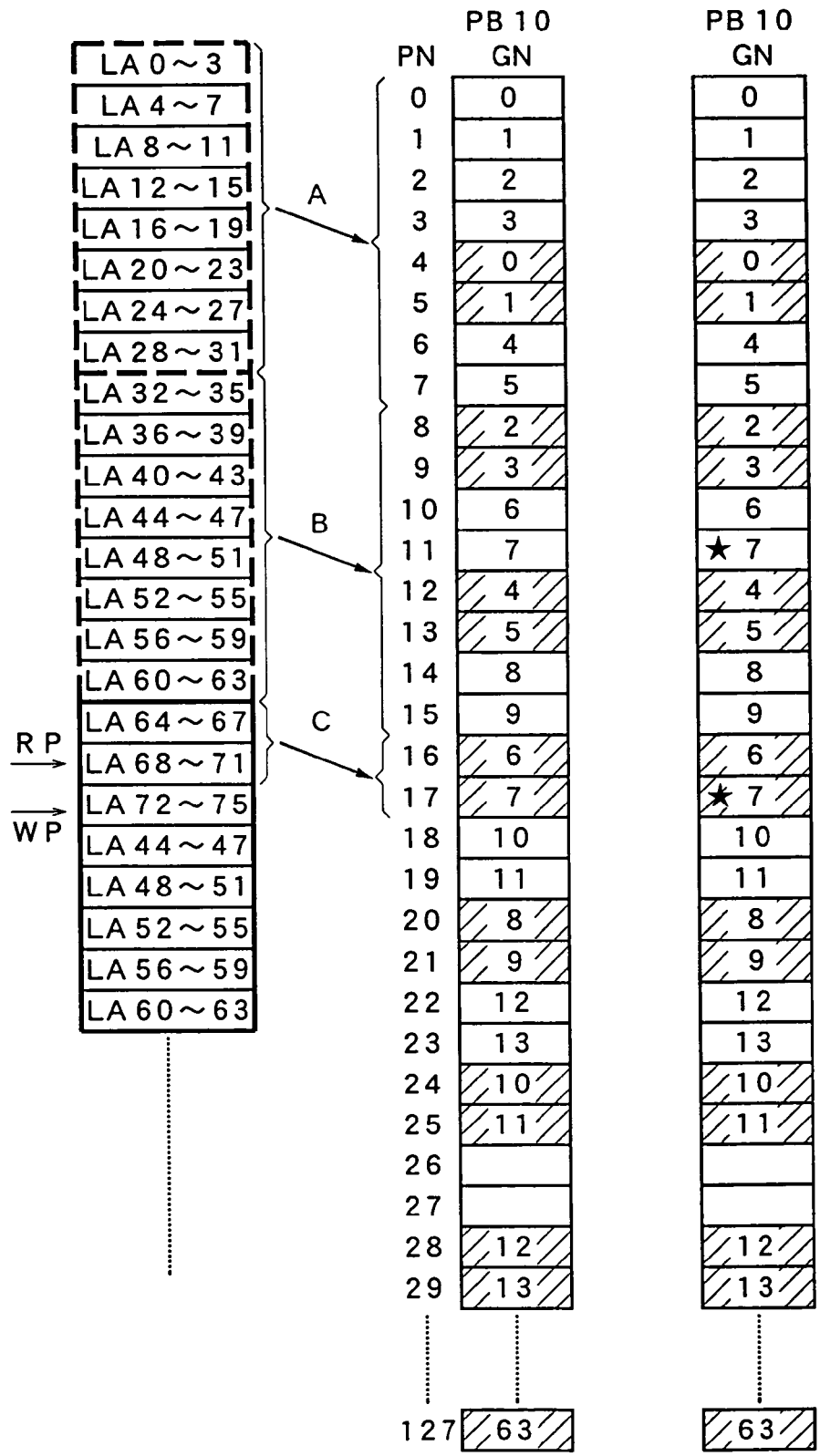
FIG. 7A is a flowchart showing data writing processing in ordinary processing in conventional nonvolatile memory System.
Figure 7B:
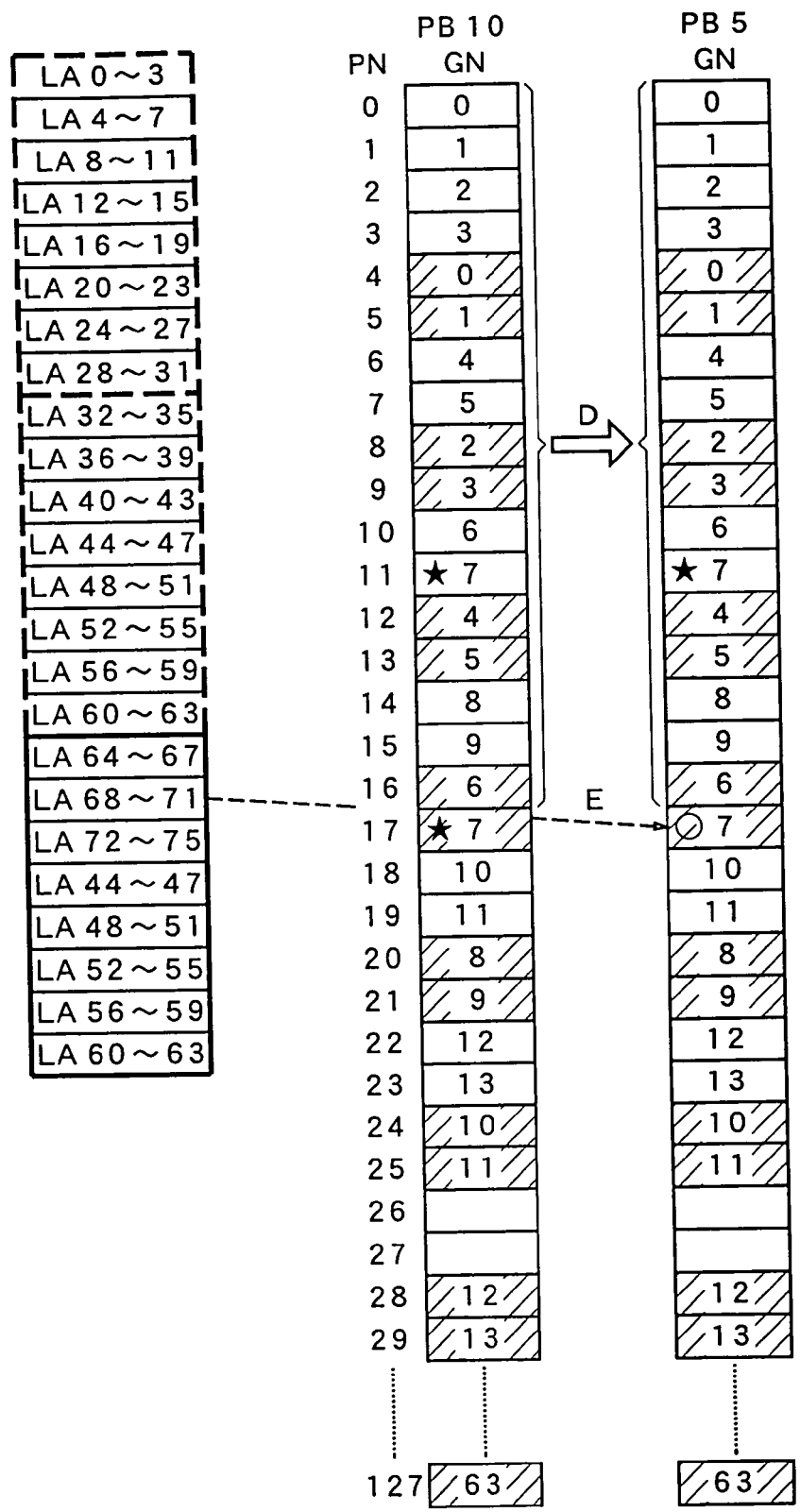
FIG. 7B is a flowchart showing substitution processing in ordinary processing in conventional nonvolatile memory System.
Figure 8:
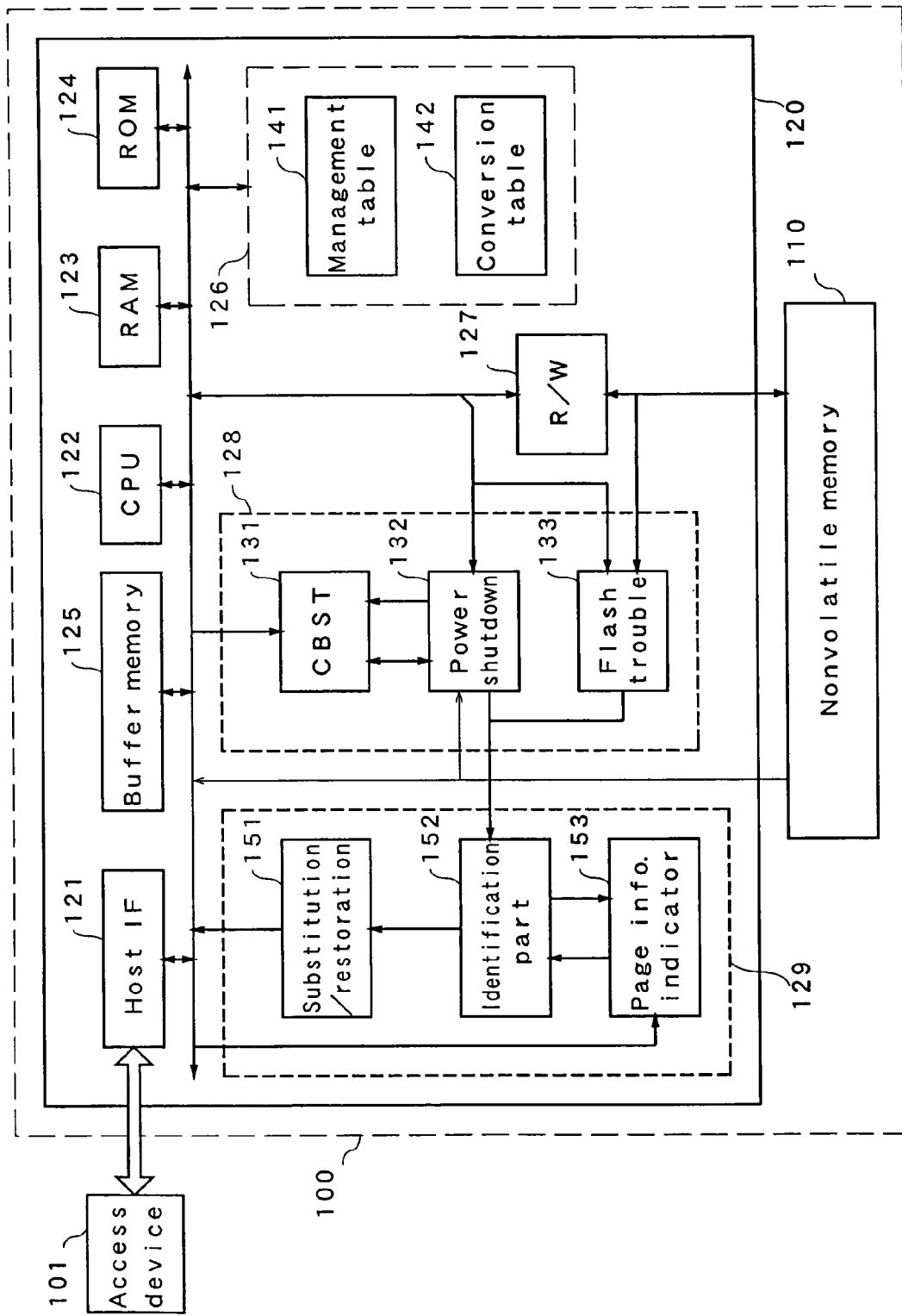
FIG. 8 is a block diagram of nonvolatile memory System according to embodiment 1 of the present invention.

A nonvolatile memory System according to embodiment 1 of the present invention will be explained hereafter. FIG. 8 is a block diagram of a nonvolatile memory System. The nonvolatile memory System is composed of a nonvolatile memory Device 100 and an access device 101.

Figure 9:
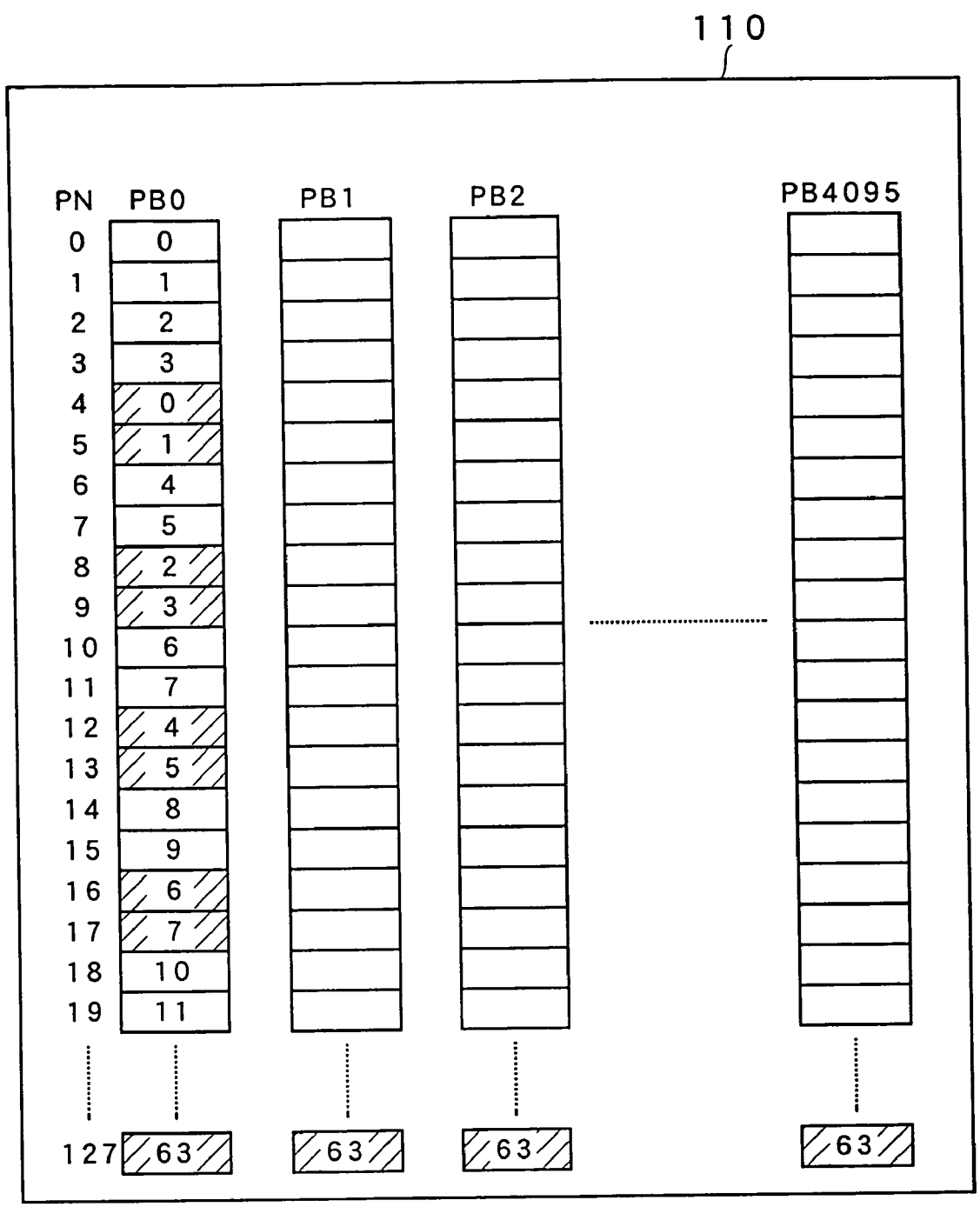
FIG. 9 is a configuration view showing a nonvolatile memory Device according to embodiment 1.

The nonvolatile memory Device 100 has the nonvolatile memory 110 including a flash memory and a memory controller 120. The nonvolatile memory 110 is a multiple-valued NAND flash memory in which one memory cell holds data lying astride over two pages. The nonvolatile memory 110 is composed of, for example, 4096 physical blocks PB0 to PB4095 as shown in FIG. 9. The physical block is an erasing unit each composed of 128 pages. Each page is an access unit from the memory controller 120 and has storage capacity of 2112 bytes. In this example, the memory has the same group composition as shown in FIG. 3.

The access device 101 is to give reading/writing command of user data (hereafter referred simply to the data) to the nonvolatile memory Device 100, to transmit a logical address at which the data is stored, and to execute data transmission and receiving. Upon receiving the reading/writing command from the access device 101, the memory controller 120 writes the data received into the nonvolatile memory 110 or outputs the data from the nonvolatile memory 110 to outside.

Next, details of the memory controller 120 will be described. The memory controller 120 in the nonvolatile memory Device 100 is provided with a host IF 121 and a CPU 122 for executing controls of the whole memory controller 120. Further, it has RAM 123 that is a working area of the CPU 122 and ROM 124 in which programs to be executed by the CPU 122 are stored. Further, the memory controller 120 has a buffer memory 125 for temporarily storing the data when accessing to the nonvolatile memory 110 and an address management unit 126 for assigning an address of the nonvolatile memory 110.

A reading/writing controller 127 is, based on the address designated by the address management unit 126, to write the data into the nonvolatile memory 110 and to read the data in the nonvolatile memory 110.

An error page identification part 128 is, when an error occurred under writing into a certain page in the nonvolatile memory 110, to identify a physical address of the page (hereafter referred to as an error page number) and type of the error and to transmit an error type flag for identification of type of the error to an error corrector 129. The error page identification part 128 has a current block status table (referred to CBST in the drawing) 131, power shutdown judgment unit 132 and flash trouble judgment unit 133.

The current block status table 131 is to store writing state into the physical block currently accessing. The current block status table 131 is composed of nonvolatile RAMs such as a ferroelectric random access memory (FeRAM), a magnetic recording type random access memory (MRAM), an Ovonic unified memory (OUM) and a resistance RAM (RRAM) or the like, in which are recorded a logical block address currently being written, physical block address and writing status of each page.

The power shutdown judgment unit 132 makes judgment of power shutdown occurrence status that is one of causes for error occurrence. The power shutdown judgment unit 132 identifies the error page number where an error occurred, based on current block status stored in the current block status table 131, ready/busy flag transferred after data writing into the nonvolatile memory 110 from the nonvolatile memory 110 and the current page number representing the physical address of the page currently being written that is transferred from the address management unit 126. The error page number and the error type flag are then transferred to the error corrector 129.

The flash trouble judgment unit 133 is a judgment unit for making judgment of trouble occurrence status in the flash memory that is also one of causes for error occurrence. The flash trouble judgment unit 133 identifies the error page number where the error occurred based on the error status transferred from the nonvolatile memory 110 after the data writing into the nonvolatile memory 110 and the current page number transferred from the address management unit 126, and transfers the error page number and error type flag to the error corrector 129.

FIG. 10 shows format of a physical block in the nonvolatile memory 110. As shown in the drawing, one physical block is composed of 128 pages of page numbers (PN) 0 to 127, each page is composed of data area and management area MR as much as four sectors, one sector is composed of 512 bytes, one page is composed of four sectors and is 2048 bytes. Meanwhile, in FIG. 10, physical arrangement symbols are assigned from left upper portion in the order of PSA0, PSA1 . . . , PSA511. The PSA is abbreviation of Physical Sector Address. The management area MR is 64 bytes per page and has a logical block address and status flag corresponding to the page number. The status flag shows valid block, invalid block or bad block by a physical block unit. Required number of pages to store information as much as one cluster is eight pages.

Figure 11:
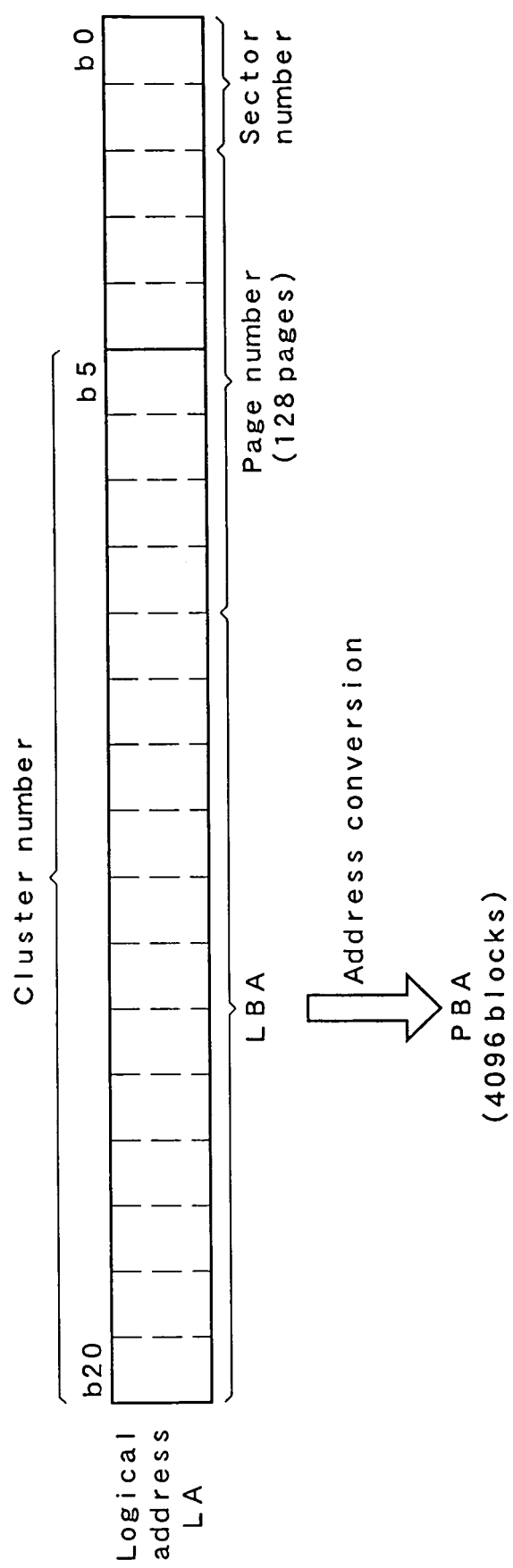
FIG. 11 is an explanatory view showing format of a logical address LA.

FIG. 11 is a view showing format of the logical address LA. As shown in the drawing, sector number, page number and logical block address LBA are shown from lower order bit, and as much as 12 bits corresponding to the logical block address LBA are subjected to address conversion, i.e., corresponds to the address of the logical physical conversion table 142. Sector size defined by file system of the access device 101 is 512 bytes and cluster size is 16 k bytes and therefore, LSB of a cluster number corresponds to bit 5 (b5). And b8 to b2 of the logical address LA correspond to the page number.

The address management unit 126 includes a physical area management table 141 and a logical physical conversion table 142. The address management unit 126 is to select a destination physical block into which data transferred from the access device 101 is written referring to these tables, and to execute so-called address management such as indication of writing destination page in the physical block, i.e., indication of current page number. In the physical area management table 141, a status of a physical block that is an erasing unit in the nonvolatile memory 110, i.e., a status flag showing whether or not an effective data is stored. The logical physical conversion table 142 is a table necessary for converting logical address transferred by the access device 101 into physical address in the nonvolatile memory 110.

Figure 12:
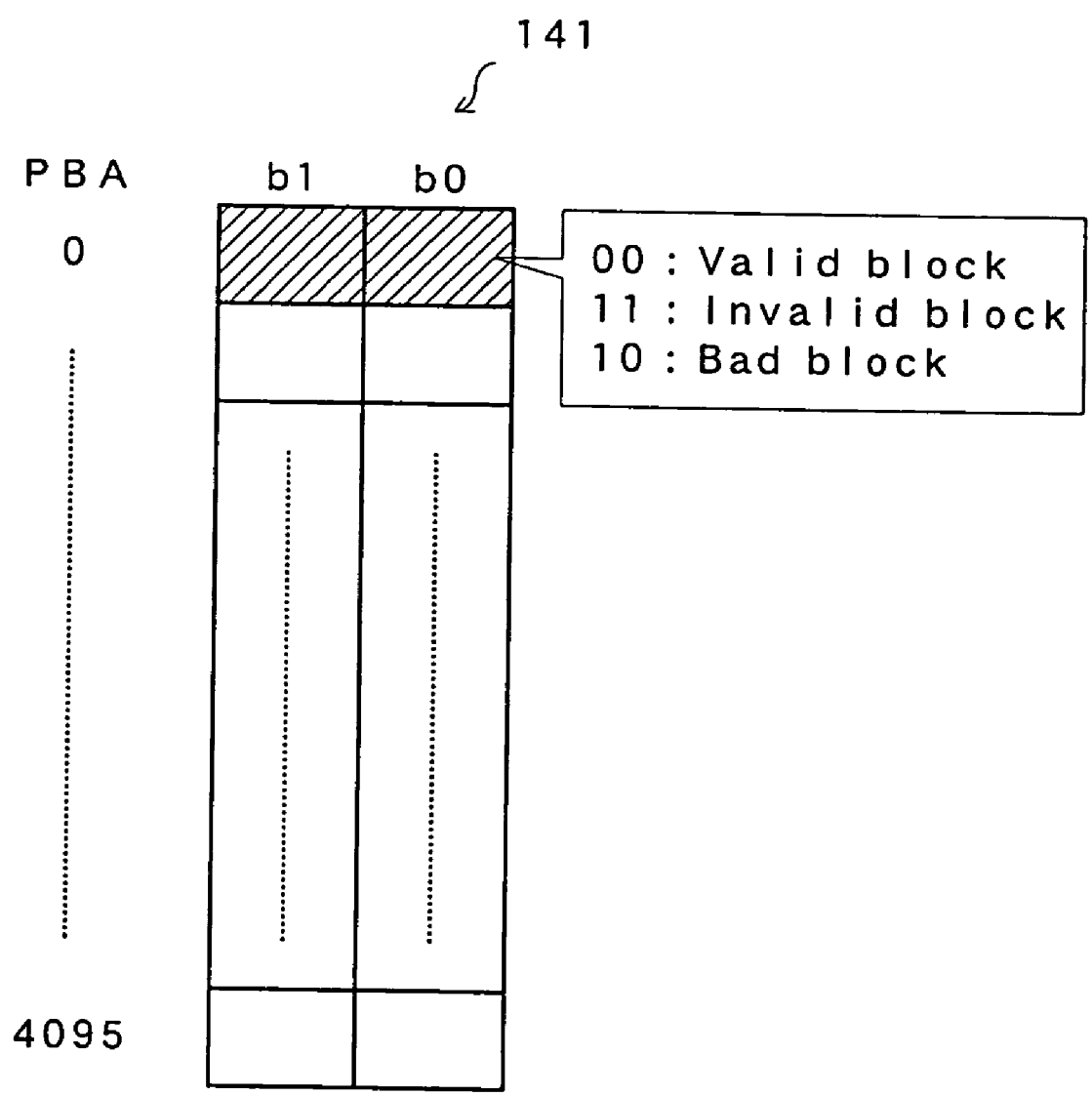
FIG. 12 is an explanatory view showing a format of a physical area management table 141.
Figure 13:
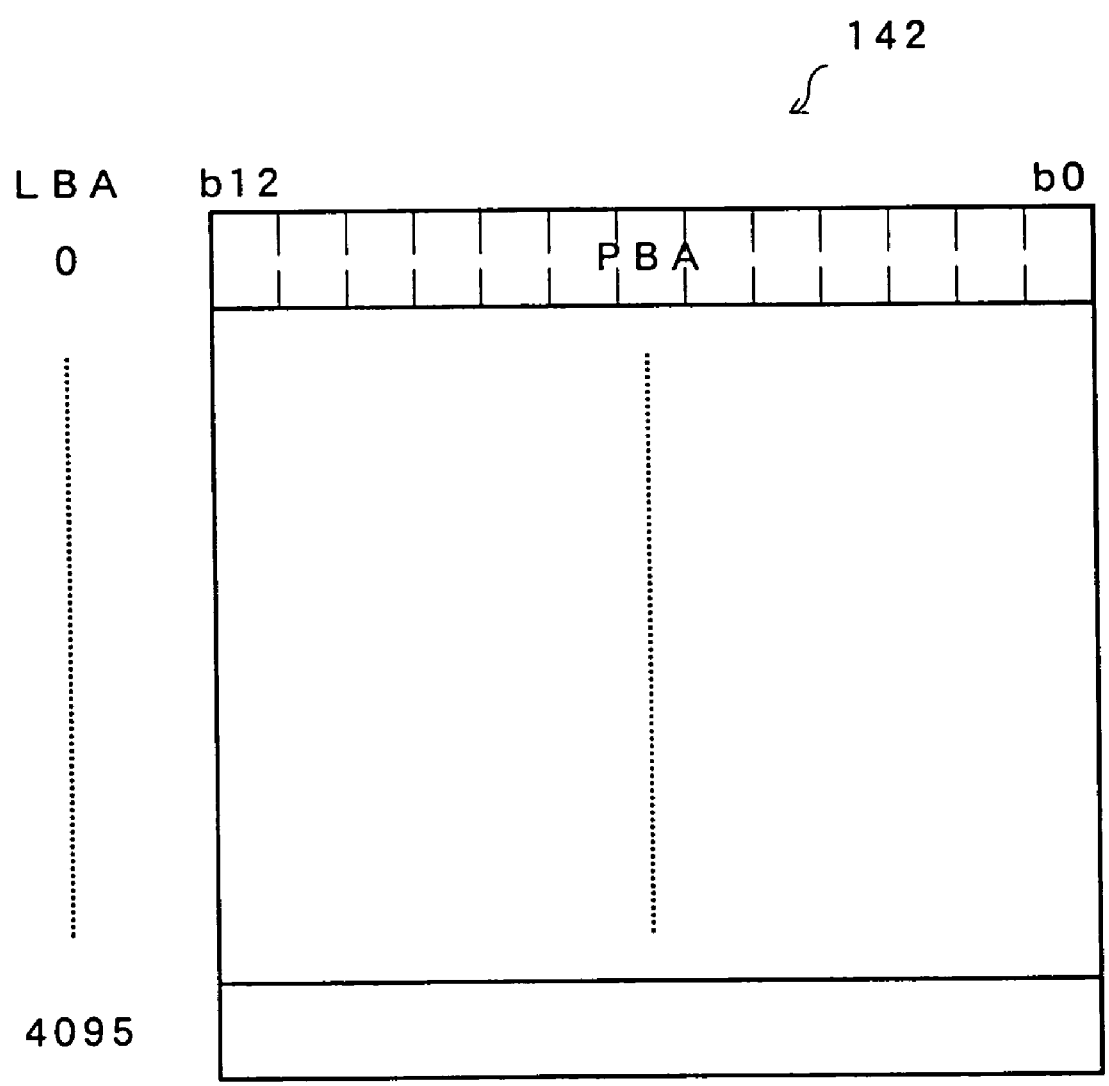
FIG. 13 is an explanatory view showing a format of a logical physical conversion table 142.

FIG. 12 shows a format of the physical area management table 141. As it is known from the drawing, an address of the physical area management table 141 corresponds to a physical block address PBA of the nonvolatile memory 110 and retains status flag of each physical block. As the status flag, value 00 in binary form denotes a valid block in which valid data is stored, value 11 denotes an invalid block in which data is erased or unnecessary data is written, and value 10 denotes a bad block which is no more usable due to solid error on the memory cell or the like. FIG. 13 shows format of the logical physical conversion table 142. This table 142 holds a physical block address PBA corresponding to each of logical block address LBA.

Figure 14:
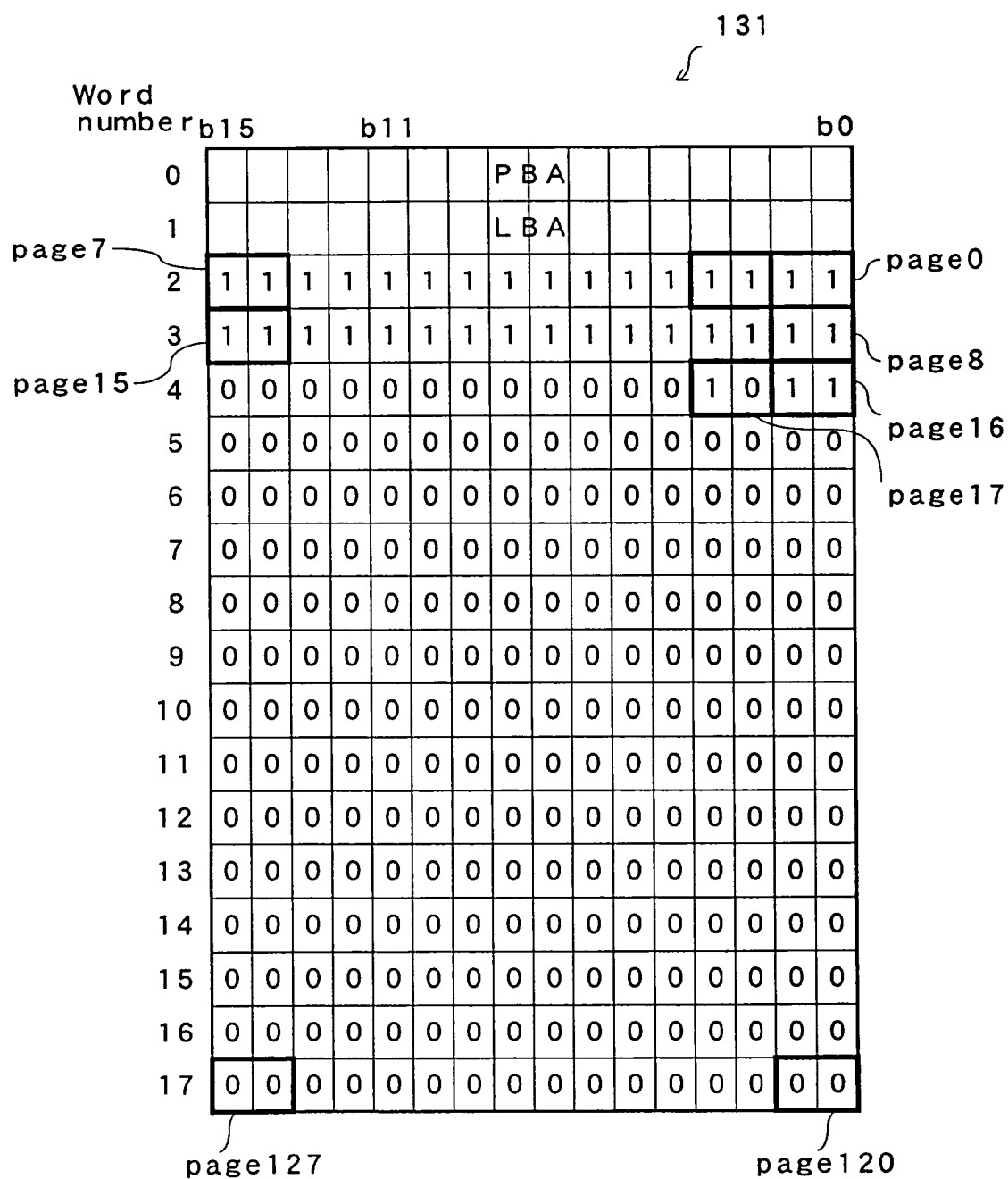
FIG. 14 is an explanatory view showing a current block status table.

FIG. 14 shows the current block status table 131. The current block status table 131 is composed of 18 words and one word is composed of 16 bits. The physical block address PBA of 12 bits is stored temporarily in b11 to b0 of word 0 and the logical block address LBA of 12 bits is stored temporarily in b11 to b0 of word 1. A writing status area is composed of words from the word 2 to word 17. In this area, an identification flag for identifying writing status of each page (pages 0 to page 127) constituting the current block is stored temporarily. This identification flag is composed of 2 bits per page. The power shutdown judgment unit 132 sets an identification flag based on the current page number output by the address management unit 126 and the ready/busy flag output by the nonvolatile memory 110. Higher order bits are set based on the current page number and lower order bits are set by the ready/busy flag. The identification flag expressed by value 00 in binary form denotes that nothing is written in the page, and value 10 in binary form denotes that the page is currently being written, and value 11 in binary form denotes that the page is already written.

Meanwhile, when the CPU 122 transfers an instruction to the address management unit 126 to acquire an invalid physical block as a current block corresponding to the writing command by the access device 101, the power shutdown judgment unit 132 clears the current block status table 131. Then, the physical block address PBA is set to the word 0 and the logical block address LBA is set to the word 1 and after that, an identification flag is set depending on writing processing of each page of the current block.

The error corrector 129 comprises a substitution/restoration processor 151, a restoration page identification part 152 and a page information indicator 153.

The substitution/restoration processor 151 executes, based on the error page number, copy processing, retry processing and restoration processing. The copy processing is to copy data already stored in the physical block (block to be written) including the error occurrence page to other erased block, and the retry processing is a processing to write again the data that once attempted to be written in the error occurrence page in the block to be written to the page corresponding to the error page of error occurrence in the erased block. If it is assumed that the restoration page is another page constituting a memory cell same as the error page, the restoration processing is to give an instruction to the page corresponding to the restoration page of the erased block to write the restoration data.

The page information indicator 153 has a page information table 154 and is to store the page information relating to the page of the data to be held in the memory cell. FIG. 15 is an address map showing format of the page information table 154 included in the page information indicator 153. The page information table 154 is composed of 129 words where 128 words from the head word are arrayed in the order of page numbers (PN) 0 to 127. A page number related information 154a and page type information 154b are stored in each word. The page number related information 154a stores other page numbers in the same group. The page type information 154b stores a flag to identify whether a page number designated by PN in the figure is a first page or a second page. Here, "0" denotes the first page and "1" denotes the second page. As mentioned previously, the first page means a page at lower order address side than the second page.

In a final word of the page information table 154, the number of pages composed of one memory cell, 2 in this example, is stored. Meanwhile, the page information table 154 shown in FIG. 15 is a tabulation of page composition of the multiple-valued NAND flash memory shown in FIG. 9 and contents thereof change depending on the type of the multiple-valued NAND flash memory.

Further, the page information table is composed of the volatile RAM such as SRAM, nonvolatile RAM such as ferroelectric random access memory (FeRAM) or ROM. In the case of volatile RAM, the CPU 122 may simply construct it in SRAM or the like based on the device code which the CPU 122 read from the nonvolatile memory 110 in initialization processing at starting up the power supply. As one of specific methods of construction, the page information table for every device type is stored in advance into the ROM 124 or the like, and it may be selectively transferred from the ROM 124 to SRAM based on the device code. Furthermore, with a multiple-valued NAND flash memory having comparatively simple page construction as shown in FIG. 1, there is an even number/odd number relation (regularity), and therefore, the page information indicator 153 needs no page information table, and it is possible to calculate a page number related information by bit operation based on the device code. Specifically, it is possible to calculate the information based on Equation (1) as long as a multiple-valued NAND flash memory as shown in FIG. 1 is employed. In the equation, operator "^" is an operator that leads to exclusive OR.

$$\text{Page number related information} = \text{Page number}\char`\^ 0x01 \qquad (1)$$

In the equation, 0x expresses hexadecimal form.

FIG. 16 is an address map showing storage format of the buffer memory 125. The buffer memory 125 is composed of a nonvolatile RAM having one cluster, i.e., 16 k bytes capacity. As the nonvolatile RAM, the ferroelectric random access memory (FeRAM), a magnetic recording type random access memory (MRAM), an Ovonic unified memory (OUM), a resistance RAM (RRAM) or the like are used. Although the buffer memory 125 may be composed of the volatile RAM such as the SRAM, reliability is slightly reduced.

The buffer memory 125 is composed of 32 words. Each word is composed of a data area 125a of 512 bytes, a logical address area 125b of 21 bits and a data holding status flag 125c of 2 bits. Data area as much as four words stores temporarily data as much as one page. A logical address area 125a shows logical address of the data of that page. In the data status holding flag 125c, "00" in binary form denotes that nothing is written in the data area and in a state waiting for data from the access device 101, "11" denotes that the data is held and in a state waiting for data transfer to the nonvolatile memory 110, and "10" denotes that the data is currently being transferred to the nonvolatile memory 110. In the example shown in FIG. 16, word numbers 0 to 3 denote a state where although the data was stored, it is transferred to the nonvolatile memory 110 and writing has been completed, word numbers 4 to 7 denote that the stored data is currently being transferred to the nonvolatile memory 110, word numbers 8 to 11 denote that the data being stored is in a state waiting for transfer to the nonvolatile memory 110. The CPU 122 determines read pointers RP and write pointer WP of the buffer memory 125 referring to a data holding status flag. The read pointer RP is to identify the area currently being read (word numbers 4 to 7 here), and the write pointer WP is to identify the area of next writing (word numbers 12 to 15 here). These pointers are stored temporarily in the RAM 123 and are renewed one by one. In this example, the read pointer RP refers to the word number 4 and the write pointer WR refers to the word number 12.

The restoration page identification part 152, as will be explained later referring to the flowchart, transfers the error page number received from the error page identification part 128 and the error type flag to the substitution/restoration processor 151. Then, based on the error page number, it either refers to the page information table possessed by the page information indicator 153 or determines the restoration page by executing computation of Equation (1), and then transfers it to the substitution/restoration processor 151.

The following description explains operations of the nonvolatile memory Device 100.

[Initial State]

First, contents of the nonvolatile memory 110, and logical physical conversion table 142 or the like immediately after shipment will be explained. In the nonvolatile memory 110, there are a system area in which system information such as device code, security information or the like are stored, and the ordinary area where user executes data reading and writing. Various information stored in the system area is written by the maker before shipment.

Good blocks in an ordinary area in the nonvolatile memory 110 after shipment are all in erased state, and a status flag and a logical block address are being set in the management area MR (hatching portion in FIG. 10) in the first page of the physical block. Since this status flag is in initial state, it is expressed by value 11 (invalid block) or value 10 (bad block).

As for the logical block address, value FFF is being set in hexadecimal form. The value FFF does not means that physical address of the nonvolatile memory 110 is of address FFF, but means that no physical address is being set. Therefore, a physical block with physical address of FFF in the nonvolatile memory 110 is an unusable physical block, and the logical address managed by the access device 101 designates a space smaller than 4096 address from 0000 address to FFF address by 256 k byte that is a physical block size.

[Initialization Processing at Power Supply Startup]

Figure 17A:
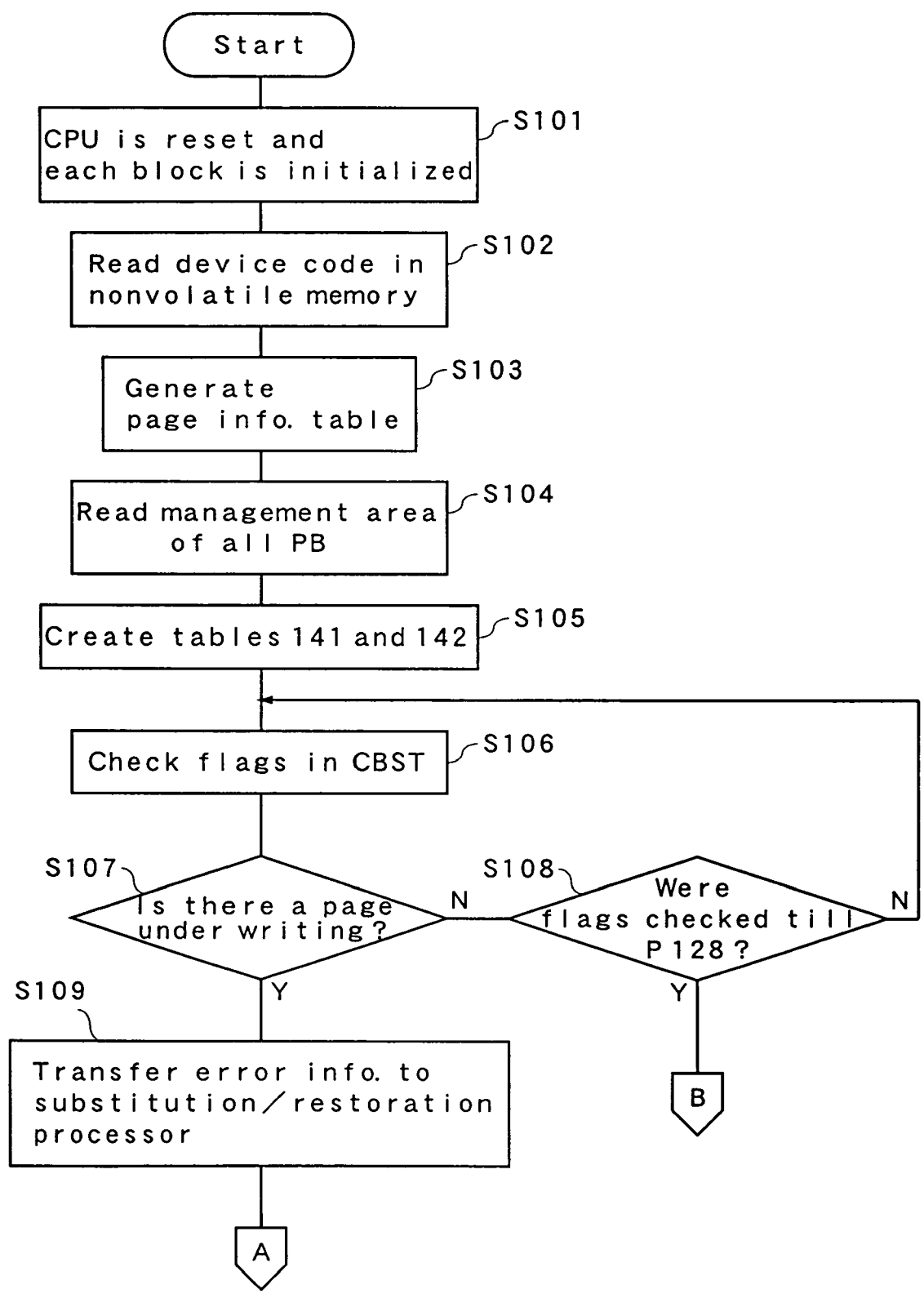
FIG. 17A is a flowchart showing contents of initialization processing and error correction processing.
Figure 17B:
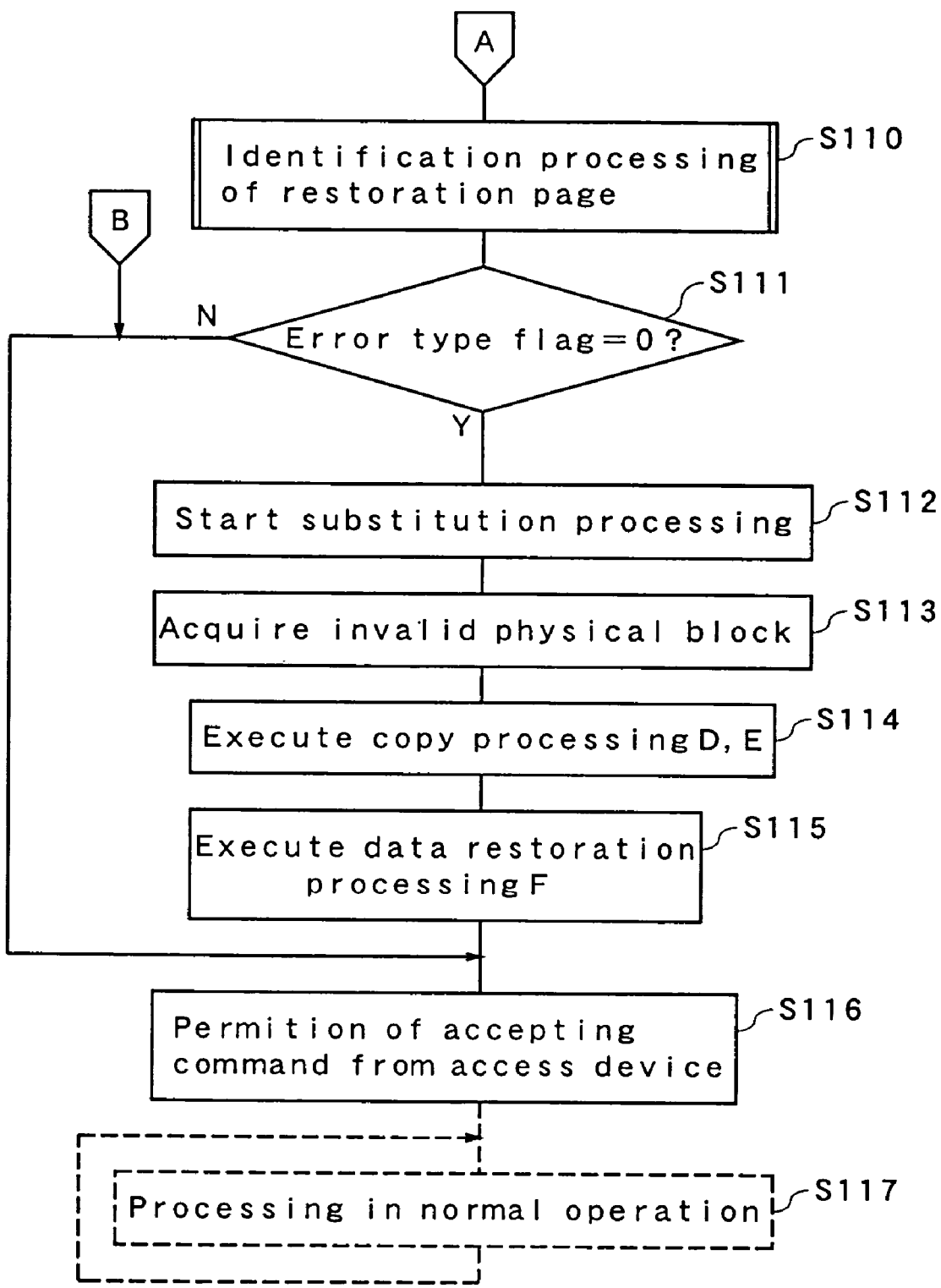
FIG. 17B is a flowchart showing the contents of the initialization processing and error correction processing.

FIGS. 17A and 17B are flowcharts showing processing to be taken after power-up. When the power supply is turned ON, first the CPU 122 is reset, initialization processing is carried out based on the program stored in the ROM 124 (S101). In the initialization processing as mentioned above, first the RAM 123 and buffer memory 125 are all cleared. The device code is read from the system area in the nonvolatile memory 110 via the reading/writing controller 127, and type and capacity of the nonvolatile memory 110 are identified based on the device code (S102).

Next, the page information table 154 is generated in the page information indicator 153 based on the device code read from the nonvolatile memory 110 (S103). Alternatively, the page information indicator 153 may grasp the page construction information by computation function (corresponding to Equation (1)) based on the device code.

Next, the power shutdown judgment unit 132 reads a management area of the first page of all physical blocks of the nonvolatile memory 110 via the reading/writing controller 127 (S104). Thereafter, the physical area management table 141 and logical physical conversion table 142 are created in the address management unit 126 (S105).

After that, the CPU 122 checks whether or not any error occurred due to the power shutdown accompanied by writing operation prior to a power startup by checking the current block status table 131. In the following description, status immediately after shipment, i.e., there is no page under writing, is explained and a case where any page under writing exists will be explained later in detail. When there is no page under writing, it immediately proceeds from S107, S108 of the flowchart in FIG. 17A to step S116 in FIG. 17B, and it is now ready to accept reading/writing command or the like from the access device 101.

After entered into the state ready to accept the command or the like, when the nonvolatile memory Device 100 has not been formatted yet, the access device 101 formats the nonvolatile memory Device 100 based on the FAT file system and constructs a logical address space. Thereafter, it proceeds to processing at ordinary operation.

[Processing at Ordinary Operation]

Next, processing at ordinary operation after initialization will be explained. Since the aim of the present invention is to improve error correction at the writing process, the following description deals with writing process only. Further, in many cases, writing from the access device 101 is normally made in cluster unit, writing in cluster unit is solely explained here for simplicity reason.

First, the access device 101 transfers a writing command of 16 k byte (one cluster) of logical addresses LA0 to LA31 to the nonvolatile memory Device 100. Upon receiving the writing command, the host IF 121 notifies the reception to the CPU 122 and the CPU 122 writes the transferred data and logical address into the buffer memory 125.

The nonvolatile memory Device 100 transfers the data as much as one cluster and the logical address being transferred from the access device 101 together with the writing command to the buffer memory 125 via the host IF 121. Since the buffer memory 125 is nonvolatile RAM, the data or the like stored temporarily prior to power supply startup is still left in the buffer memory 125 even immediately after initialization processing at the power startup. However, all areas are being cleared thoroughly at the time immediately after shipment. For simplicity, the following description explains a status immediately after shipment.

The data holding status flag of the buffer memory 125 are in value 00 in binary form, namely, in a state waiting for data transfer from the access device 101. In this case, data and logical address are being stored from lower order address side of the buffer memory 125, namely, in ascending order from the word number 0.

In the case nothing is stored in the buffer memory 125, data holding flag in the buffer memory 125 are all in value 00, and both write pointer WP and read pointer RP point to the word number 0. The CPU 122 then stores a data as much as one cluster from the storage position of the word number 0 to which the write pointer points in the nonvolatile memory 110 in ascending order, increments the write pointers one by one, and sets the data holding flag of the word stored to value 11. At the point when data is being stored temporarily in all areas of the buffer memory 125, writing processing of one cluster from the access device 101 is completed. The CPU 122 notifies to the access device 101 via the host IF 121 that "corresponding cluster has normally been written".

When the host IF 121 receives the writing command from the access device 101 simultaneously with the above, the CPU 122, using this as a trigger, gives an instruction to the address management unit 126 to acquire one physical block for writing destination. The address management unit 126 refers to the physical area management table 141, searches invalid blocks from the address selected at random in ascending order, and an invalid physical block detected for the first time, for example, the PB10, is considered to be a writing object physical block. This allows realization of wear leveling in which writing an object block is not concentrated to a specific block. The address management unit 126 transmits an erasing command of the PB10 to the nonvolatile memory 110 via the reading/writing controller 127 and executes data writing after the PB10 is erased.

Figure 18A:
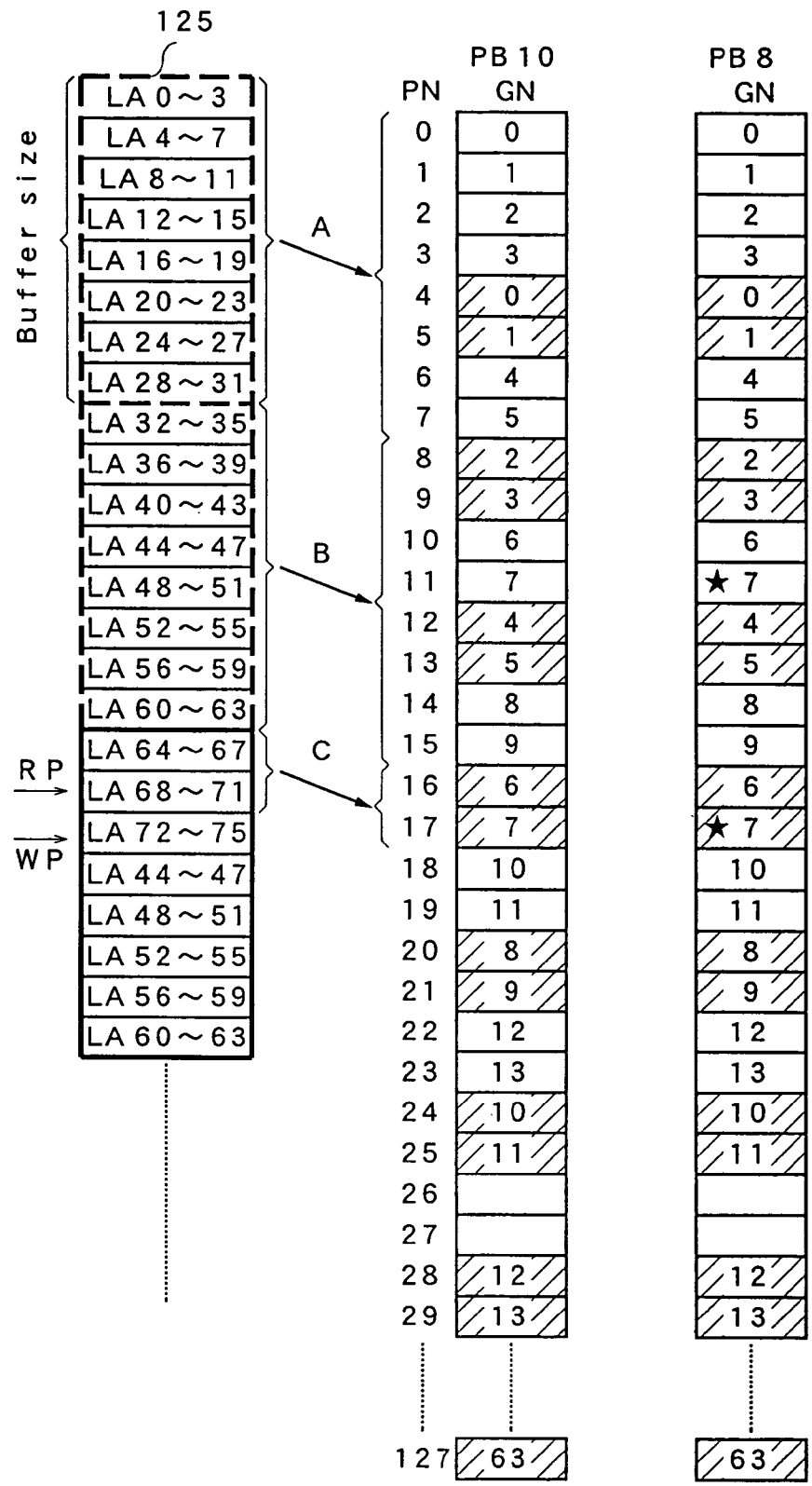
FIG. 18A is a view explaining operations of error correction processing to be taken at a flash trouble occurrence.

Next, writing of data temporarily stored in the buffer memory 125 into the physical block in the nonvolatile memory 110 will be explained referring to FIG. 18A. The PB10 and PB5 denote physical block in the nonvolatile memory 110. The left end of FIG. 18A is the buffer memory 125 and area in the range of LA0 to LA31 is a buffer size. The area recorded in this buffer is shifted gradually downwardly in FIG. 18A, and the buffer memory 125 is in a state enclosed by the solid line at error occurrence, i.e., at the point of time when writing has been made to page 17 of the PB10.

The CPU 122 causes the buffer memory 125 to store and at the same time executes data writing processing to the PB10 depending on the storage state. Specifically, when the write pointer WP points a position more than four words ahead of the read pointer RP, a data writing instruction to the PB10 is issued to the address management unit 126. For example, when the read pointer RP points word number 0 and the write pointer WP points word number 4, it is meant that the data is stored temporarily in word numbers 0 to 3 of the buffer memory 125, and a data writing instruction as much as one page is issued to the PB10.

The CPU 122 transfers the data LA0 to LA3 stored in the area of word numbers 0 to 3 of the buffer memory 125 to the reading/writing controller 127 and sets the data holding flag of word numbers 0 to 3 of the buffer memory 125 to value 10. Simultaneously with this, the address management unit 126 refers to the logical address LA stored in the buffer memory 125, considers page number in the logical address format shown in FIG. 11 as the page number (current page number) of writing destination, and transfers it to the reading/writing controller 127 and the error page identification part 128.

The reading/writing controller 127 writes a data into corresponding page of the PB10 in the nonvolatile memory 110 and upon completion of writing, the nonvolatile memory 110 puts the ready/busy flag into ready state, and notifies the state to the error page identification part 128 and the CPU 122. In the case normal writing has not been made due to error occurrence as a result of notification, it proceeds to error correction processing.

Besides, when no error occurred, the CPU 122, after received said ready/busy flag, sets data holding flag of word numbers 0 to 3 of the buffer memory 125 to value 00, and updates so that the read pointer RP may point word number 4. When the write pointer is pointing word number more than word number 8, it writes the data stored in word numbers 4 to 7 into the PB10.

In the manner as stated above, the data stored in the buffer memory 125 is written sequentially into corresponding page of the PB10. As for temporary storage of data from the access device 101 to the buffer memory 125, writing is made with circulating manner depending on above mentioned write pointer. In other words, the write pointer returns to the word number 0 subsequent to word number 28. On this occasion, if data holding status flag value of word number 0 is not 00, it means that temporary storage into the buffer memory 125 is prohibited. In this case, if the access device 101 is transferring data of the writing command, the memory controller 120 outputs a wait signal to the access device 101 via the host IF 121 to interrupt data transfer. The access device 101 continues interruption of data transfer until this wait signal is released. In this fashion, data of the logical addresses LA0 to LA31 stored in the buffer memory 125 are stored in pages 0 to 7 of the PB10. This processing is represented by arrow A depicted in FIG. 18A When the access device 101 writes continually data as much as one cluster of the logical addresses LA32 to LA63, processing similar to this is carried out to store the data into pages 8 to 15 of the PB10. This processing is represented by arrow B in FIG. 18A. Further, when the access device 101 executes continually writing processing as much as one cluster of the logical addresses LA64 to LA95, a series of processings similar to those mentioned above are carried out to store the data into pages 16 to 23 of the PB10.

[Error Correction Processing to be Taken at Flash Trouble Occurrence]

Processing to be taken when flash trouble occurred in writing to page 17 of the PB10 and normal writing has not been made will be explained hereafter referring to FIGS. 18 to 21.

Figure 19:
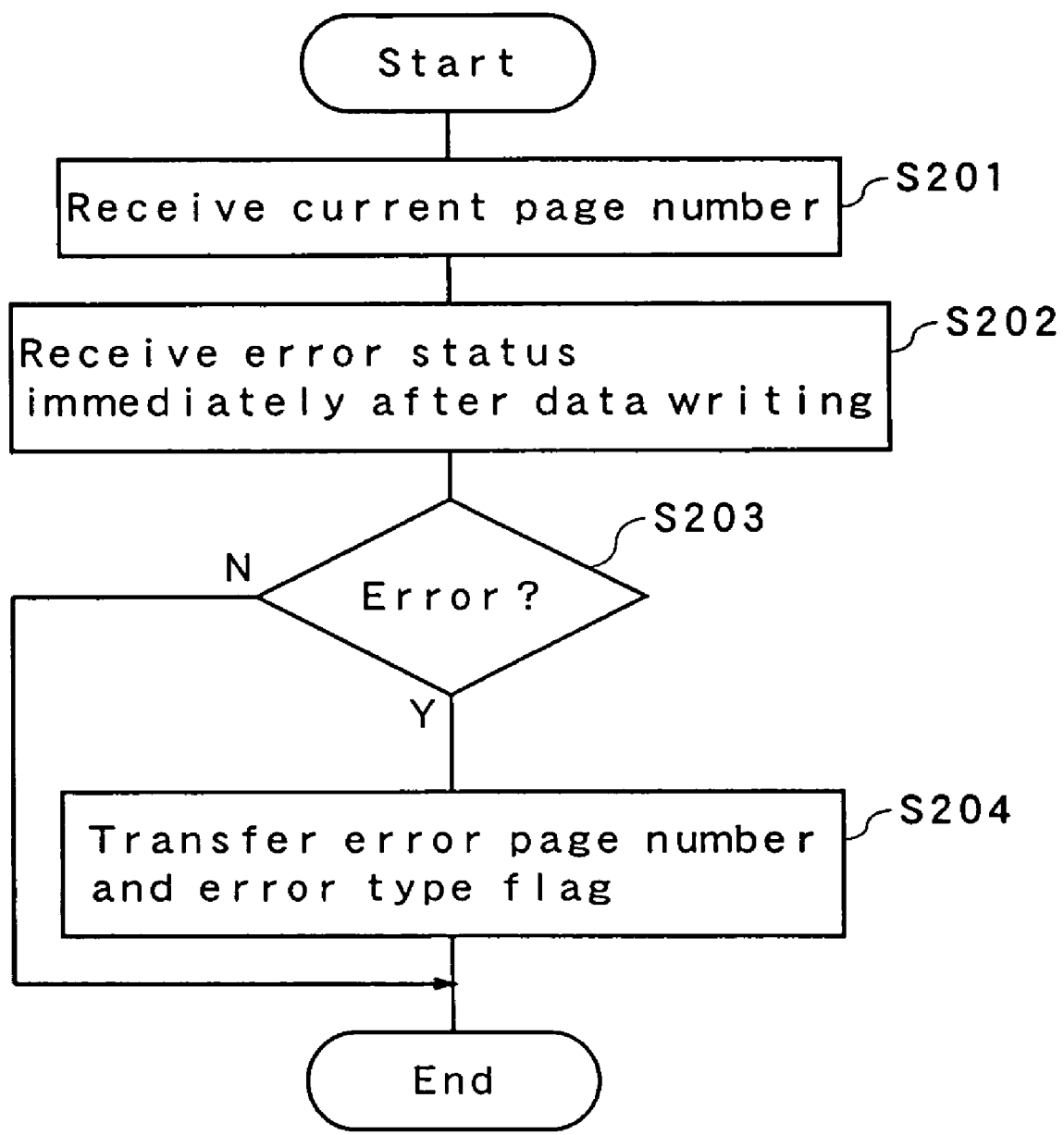
FIG. 19 is a flowchart showing contents of processing by flash trouble judgment unit.

In FIG. 19, the flash trouble judgment unit 133 receives current page number from the address management unit 126 prior to writing into page 17 of the PB10 (S201). Upon completion of writing into page 17 of the PB10, the nonvolatile memory 110 transfers error status to the memory controller 120, and the flash trouble judgment unit 133 receives this (S202). The flash trouble judgment unit 133 checks error status and when a flag showing error occurrence is being set (S203), recognizes that flash trouble occurred under writing into page 17 of the PB10. Then it considers page 17 as the error occurrence page, sets error type flag to value 1 and transfers it together with error page number (physical address) to the restoration page identification part 152 (S204). Meanwhile, as for the error type flag, the value 0 denotes an error due to the power shutdown and the value 1 denotes an error due to flash trouble.

Figure 20:
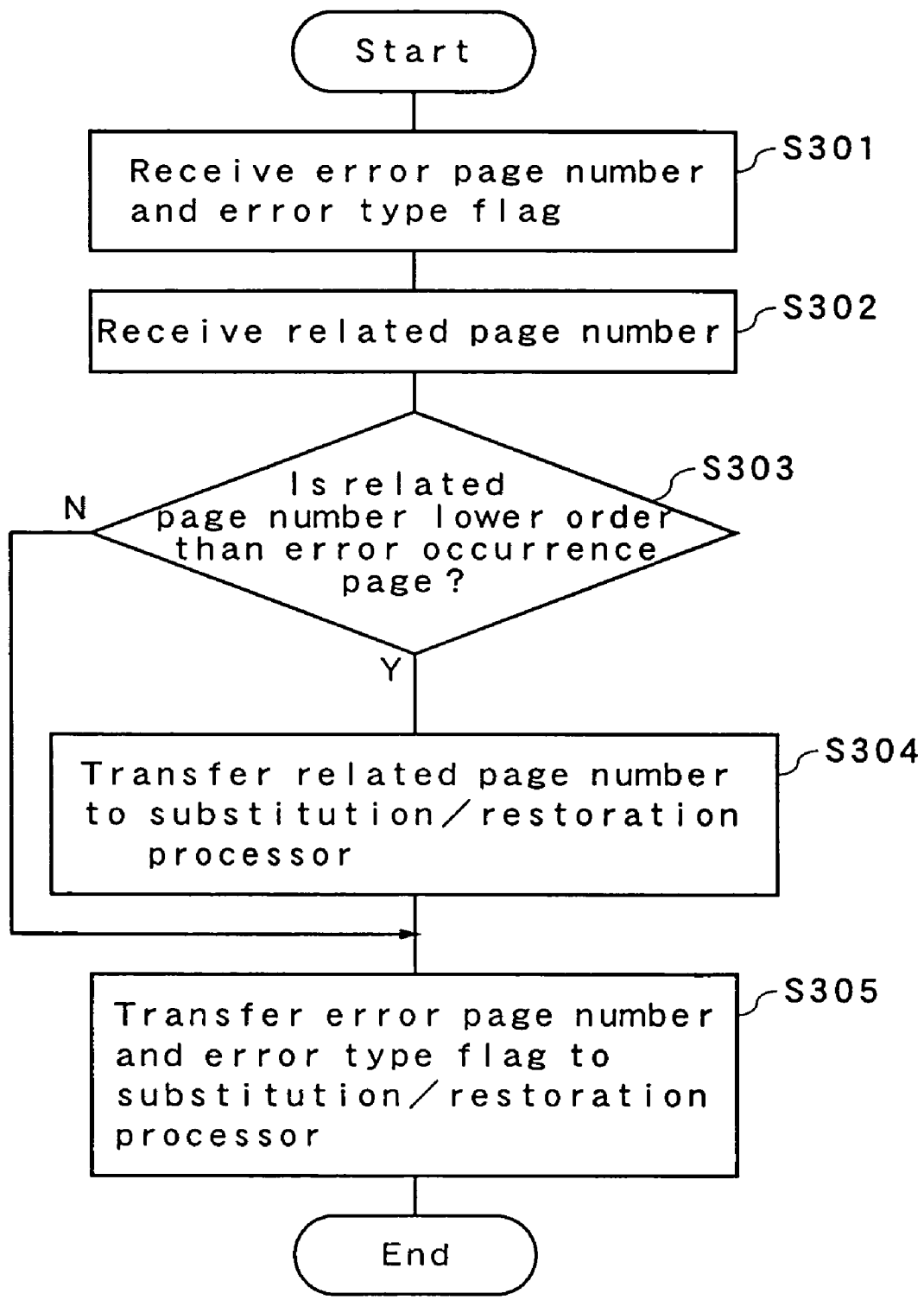
FIG. 20 is a flowchart showing contents of processing by restoration page identification part.

In the flowchart shown in FIG. 20, the restoration page identification part 152 receives error page number and error type flag being transferred from the error page identification part 128 (S301), and transfers error page number to the page information indicator 153. The page information indicator 153 transfers the page number related information 154a corresponding to the error page number to the restoration page identification part 152 by referring to the page information table 154. For example, if error page number is page 17, page 11 is then transferred to the restoration page identification part 152 as related page number.

Next, judgment is made whether or not the related page number is lower order address than the error occurrence page (S303). Regardless of binary or multiple-valued, there is a restriction that the NAND flash memory should write data from lower order address side. Therefore, no data will be written into the page of related page number unless related page number has lower order address than error occurrence page, and data restoration processing for the page of related page number is unnecessary. For example, if related page number is page 11 and error page number is page 17, related page number is transferred to the substitution/restoration processor 151 as the related page number (S304). Further, the restoration page identification part 152 transfers the error page number and the error type flag to the substitution/restoration processor 151 and at the same time moves controls to the substitution/restoration processor 151 (S305). Meanwhile, when S304 is not executed, i.e., when the restoration page identification part 152 does not transfer the restoration page to the substitution/restoration processor 151, the restoration processing is not carried out.

Figure 21:
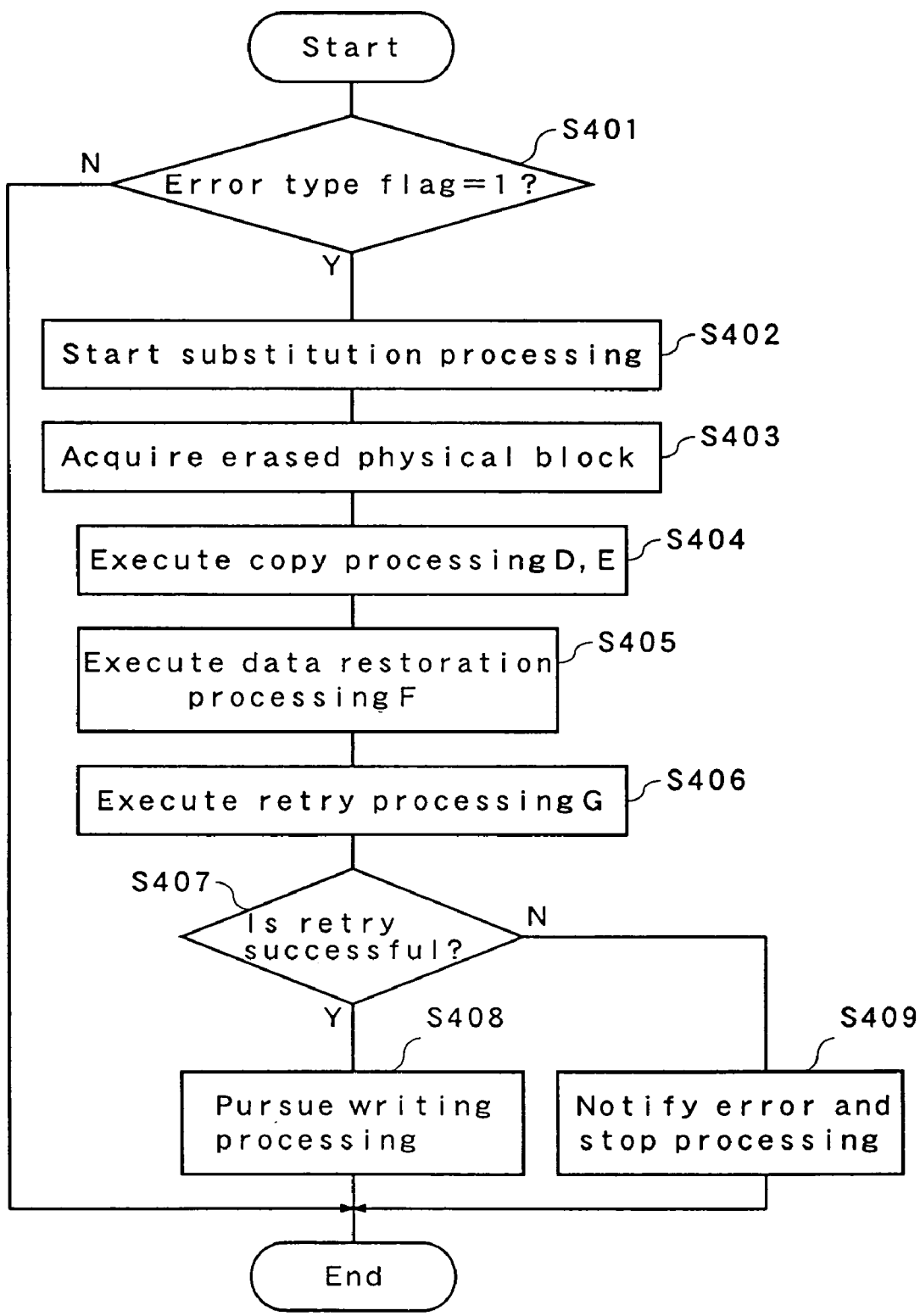
FIG. 21 is a flowchart showing contents of error correction processing in an ordinary processing.
Figure 22:
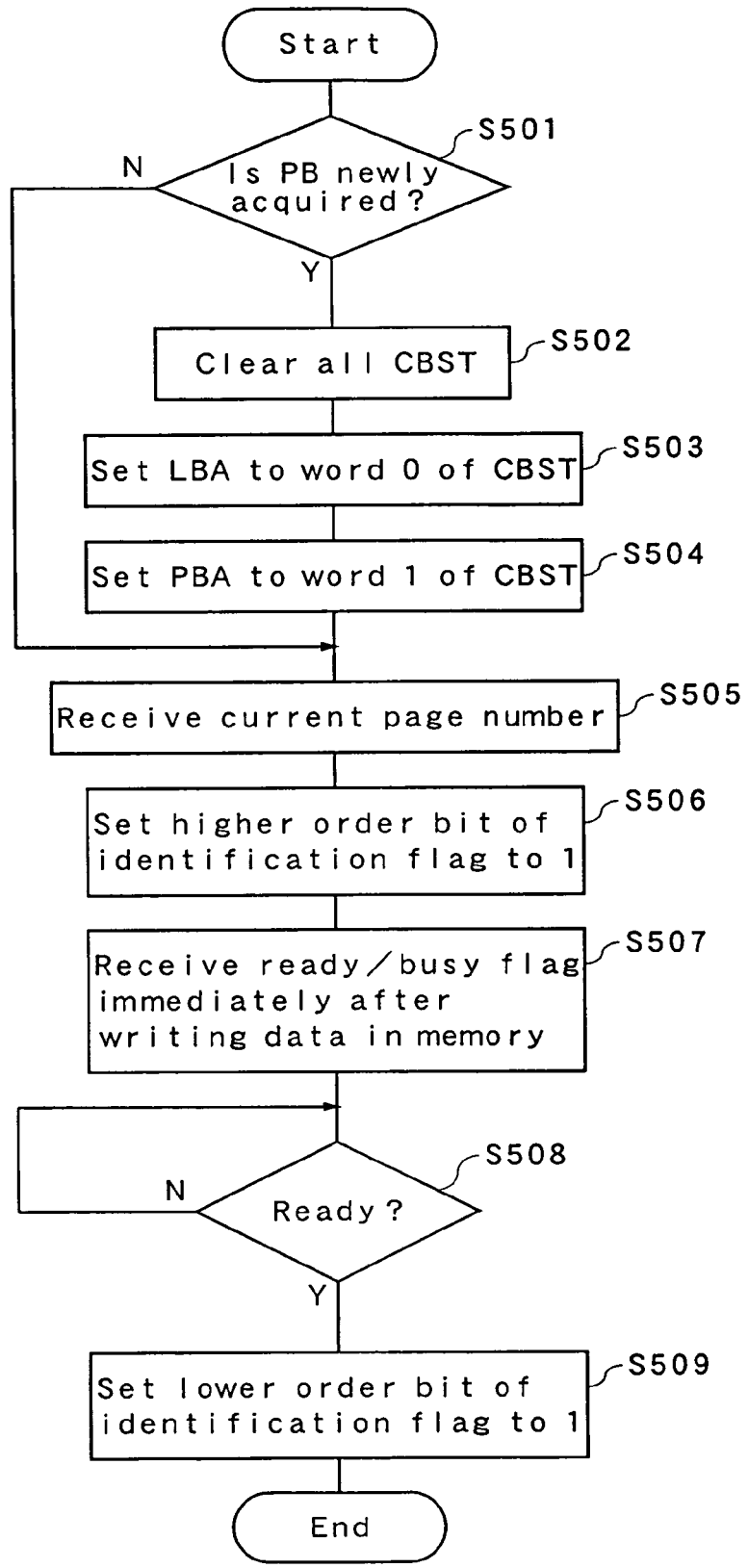
FIG. 22 is a flowchart showing contents of processing of a power shutdown judgment in the ordinary processing.

When controls are transferred to the substitution/restoration processor 151, it is judged whether or not error type flag is 1 (S401) as shown in FIG. 21. If this flag is not 1, the processing is completed. If this flag is 1, i.e., the error is attributable to flash trouble, it proceeds to step S402, and the substitution/restoration processor 151 executes substitution processings (the copy processing and restoration processing and retry processing) (S402)

Figure 18B:
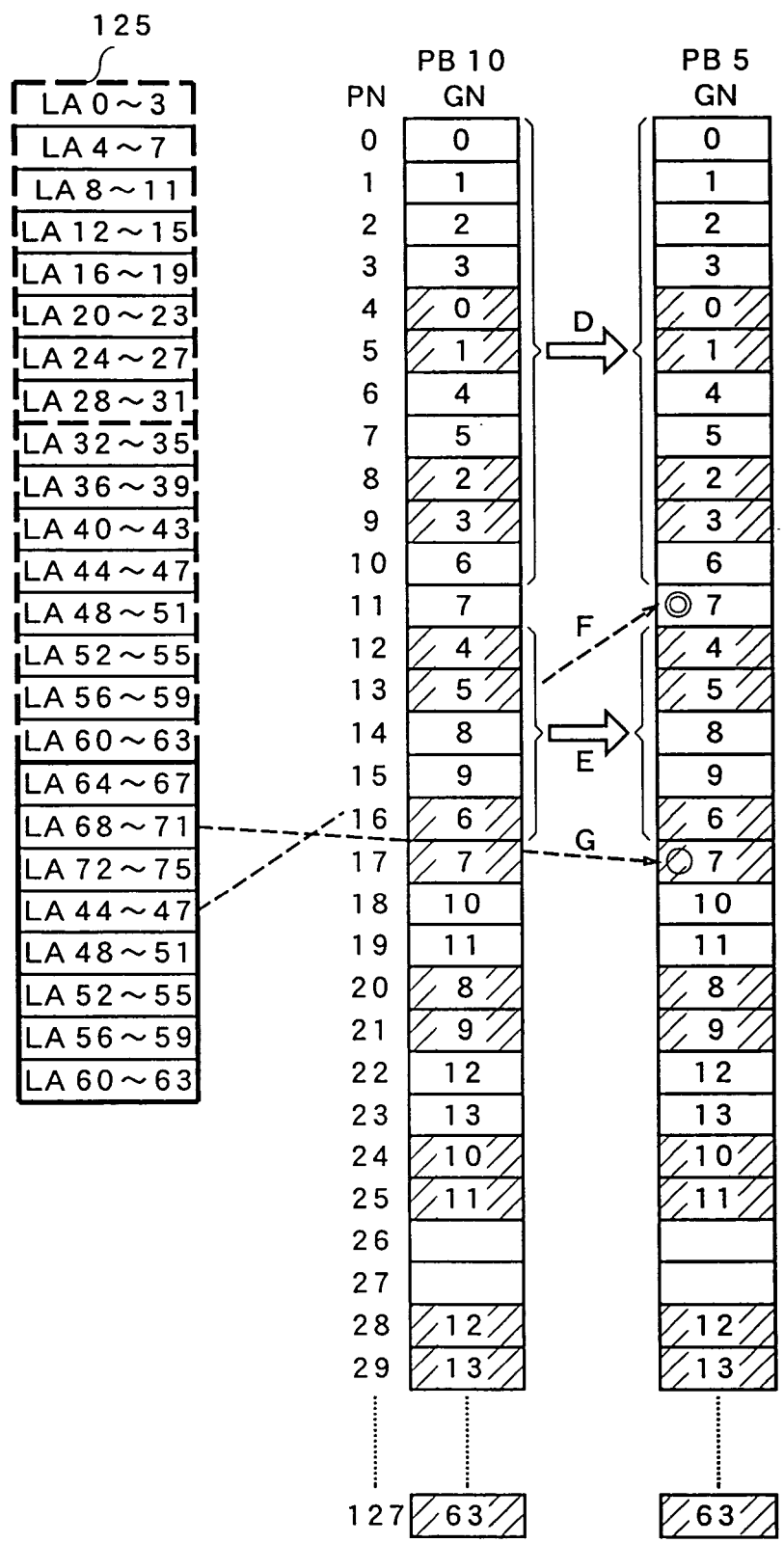
FIG. 18B is a view explaining the operations of the error correction processing to be taken at the flash trouble occurrence.

The copy processing is such a processing that, as shown by open arrows D and F from the PB10 to PB5 in error correction processing in FIG. 18B, a data written in a page free from any error of the PB10 is transcribed to separate erased physical block (e.g., PB5). In the copy processing, first, the address management unit 126 acquires erased physical block PB5 as a copying destination block (S403). The substitution/restoration processor 151 executes copy processing of all pages which have lower order address than the error occurrence page except for the restoration page (page 11) (S404). In this example, error occurrence page is 17 and restoration page is 11, and therefore, pages 0 to 10 and pages 12 to 16 are copied.

Next, the restoration processing is carried out in step S405. The restoration processing is such a processing to attempt writing again into the restoration page using the data remained in the buffer memory 125. For example, in the error correction processing in FIG. 18B, as shown by dotted line arrow F, data corresponding to LA44 to 47 are written from the buffer memory 125 into page 11 (restoration page) of the PB5. The following description deals with a method for making judgment that the data to be written into the restoration page are of data corresponding to LA44 to LA47 of the buffer memory.

In the logical address format shown in FIG. 11, the page 11 corresponds to LA44 to LA47 and it is possible for the substitution/restoration processor 151 to know where the data to be written into the restoration page is stored in the buffer memory 125 by checking the logical address area 125b of the buffer memory 125. In this case, the buffer memory 125 is required to have a capacity more than the maximum value of address interval of pages constituting the memory cell same as that of the nonvolatile memory 110. For example, the nonvolatile memory 110 shown in FIG. 2 has as much as six pages at a maximum (as much as 12 k bytes), the buffer memory 125 should have a buffer size more than 12 k bytes. In the present embodiment, it is considered that the buffer size should be as much as 16 k bytes with slight allowance.

In the meantime, in an error correction processing in FIG. 18B, the retry processing is a processing to write again the data, that once failed to be written into the page 17 of the PB10, into the page 17 of the PB5, and this is represented by broken line arrow G. In retry processing, the address management unit 126 executes retry processing of error occurrence page (S406). When writing is successful (S407), writing into a page 18 and onward are continued (S408). When writing is failed, "Corresponding cluster has not been written normally" is notified to the access device (S409) to remind rewriting command of the cluster.

It is possible to erase the error due to flash trouble by above-mentioned substitution processing. The address management unit 126 sets a corresponding status flag in the physical area management table to an invalid block so that the PB10 may be used next after being erased.

[Error Correction Processing to be Taken at Power Shutdown Occurrence]

Next, an error correction processing to be taken when the power shutdown occurred will be explained referring to FIGS. 22 to 25. First, a flow of the power shutdown judgment unit 132 under normal operation will be explained using FIG. 22. Normal operation in this explanation refers to processings except for initialization processing executed immediately after the power startup, in other words, processings after reception of the command from the access device 101 is permitted. This flowchart consists of initial setting processing and renewal processing of the current block status table 131. In the initial setting processing, first, judgment is made whether or not an invalid physical block should be acquired newly according to the writing instruction from the access device 101 (S501). When to be acquired, the current block status table 131 is all cleared (S502), a physical block address PBA10 is set to word 0 of the current block status table 131 (S503), and the logical block address LBA is set to word 1 of the current block status table 131 (S504).

After that, processings of S505 to S509 are executed every time writing is made to each page of the PB10 regardless of an invalid physical block should be newly acquired or not. The power shutdown judgment unit 132 receives current page number from the address management unit 126 (S505) and when reading the data stored temporarily in the buffer memory 125, the higher order bit of writing status identification flag corresponding to the current page is set to value 1 (S506). Further, the ready/busy flag is received immediately after the reading/writing controller 127 wrote data into the nonvolatile memory 110 (S507). When it is ready (S508), by setting lower order bit of the identification flag corresponding to the current page to value 1 (S509), that a program of the predetermined page has been completed is left as a history in the current block status table 131.

As mentioned above, if status of writing to each page is recorded to the current block status table 131, it is possible, at initialization processing in the power startup immediately after the power shutdown, to identify the page to which writing was being made when the power shutdown occurred. The example of the current block status table 131 shown in FIG. 14 shows that writing is completed up to pages 0 to 16 and the power shutdown occurred under writing to page 17.

A case, where initialization processing is carried out after the power shutdown occurred under writing to page 17, will be explained referring to FIG. 17A. The power shutdown judgment unit 132 checks an identification flag of the current block status table 131 (S106). If there is a page under writing (S107), the page is considered as an error occurrence page, and an error page number and error type flag are transferred to the substitution/restoration processor 151 (S109).

If there is the error occurrence, it proceeds to FIG. 17B after processing of S109, and an identification of restoration page is carried out (S110). This is same as a flowchart in FIG. 20 mentioned previously. Namely, when a related page number has lower order address than error occurrence page (S303), the restoration page identification part 152 transfers the restoration page to the substitution/restoration processor 151 (S304) and further transfers the error page number and error type flag to the substitution/restoration processor 151 (S305). When the related page number has not lower order address than that of the error occurrence page (S303), the restoration page identification part 152 transfers the error page number and error type flag to the substitution/restoration processor 151 (S305), but does not transfer a restoration page.

Figure 23:
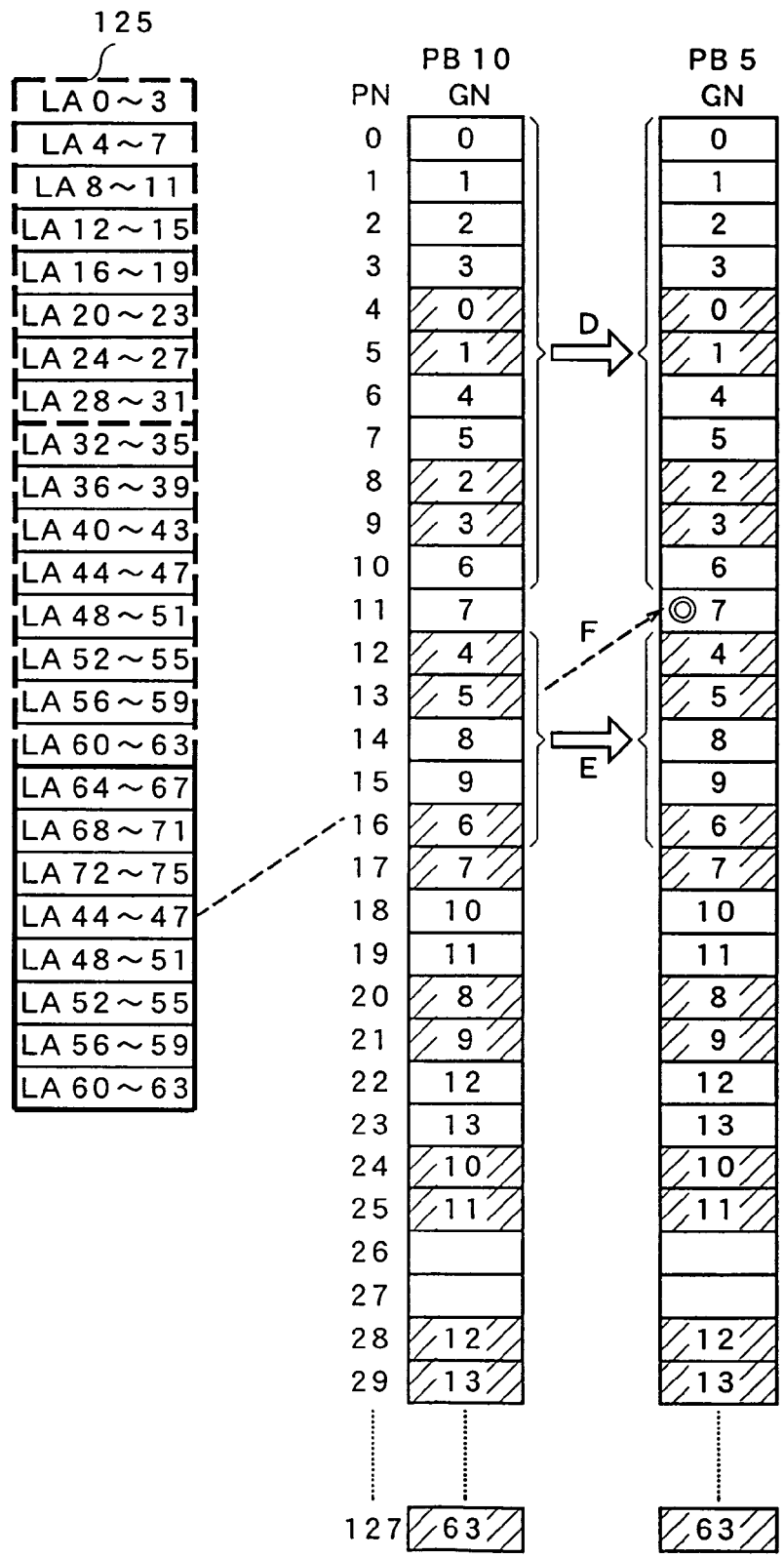
FIG. 23 is a view explaining error correction processing at a power shutdown occurrence.

In the meantime, the substitution/restoration processor 151 checks the error type flag transferred from the restoration page identification part 152 and when it is value 0, i.e., judged to be the error due to the power shutdown, then executes an error correction. FIG. 23 shows error correction to be taken in this case. The substitution/restoration processor 151 starts substitution processing (copy processing and restoration processing) (S112). The substitution/restoration processor 151 acquires the invalid physical block PB5 as the copy destination block (S113). Then, it executes copy processing (arrows D, E) for pages (page 0 to 16) with lower order address than the error occurrence page (page 17). However, it does not carry out copying of the restoration page (page 11). Last, the substitution/restoration processor 151 acquires restoration data from the buffer memory 125 and writes it into the restoration page of page number 11 (S115, arrow F). Meanwhile, a method for acquiring the restoration data is same as the processing for flash trouble case mentioned above.

With the error due to the power shutdown, different from the error due to the flash trouble, the retry processing is not carried out. This is because the retry processing is not needed specifically since, with respect to the cluster where the error occurred, the CPU 122 has not notified to the access device 101 that "Corresponding cluster has been written normally". In addition, since the data to be written into the error occurrence page (page 17) disappeared due to the power shutdown, the retry processing is not possible. Therefore, in the case of the power shutdown, the copy processing may simply be executed for at least cluster amount notified to the access device 101 of successful normal writing. In other words, it is sufficient if copy processing is carried out for lower order address pages (other than restoration page) than the error occurrence page and the restoration processing is executed for the restoration page.

[Error Correction Processing to be Taken when Logical Address is Written Discontinuously]

In FIGS. 18A, 18B and 23, error correction processing to be taken, when the logical addresses are written continuously, i.e., logical addresses LA32 to LA63 are written subsequent to logical addresses LA0 to LA31, are explained. Next, error correction processing to be taken for the cluster is discontinuous on the logical address will be explained using FIGS. 24A and 17B. Discontinuity means, for example, such a case where writing instruction is given for the logical address LA64 and onward after writing of logical address LA0 to LA31, without logical address LA31 to LA63 being written.

Since relationship between the logical address LA and page follows the logical address format, writing from the logical address LA64 onward is made not from page 8 of the PB10, but from page 16 and onward. Namely, pages 8 to 15 of the PB10 remain in erased state.

In the case, in a processing before error occurrence, old data corresponding to logical addresses LA32 to LA63 are being stored in the physical block PB14, these old data are copied to pages 8 to 15 of the PB10 as shown by arrow B before writing into page 16 of the PB10. Following this, data of logical address LA64 and onward are written into page 16 and onward of the PB10 (arrow C).

Figure 24A:
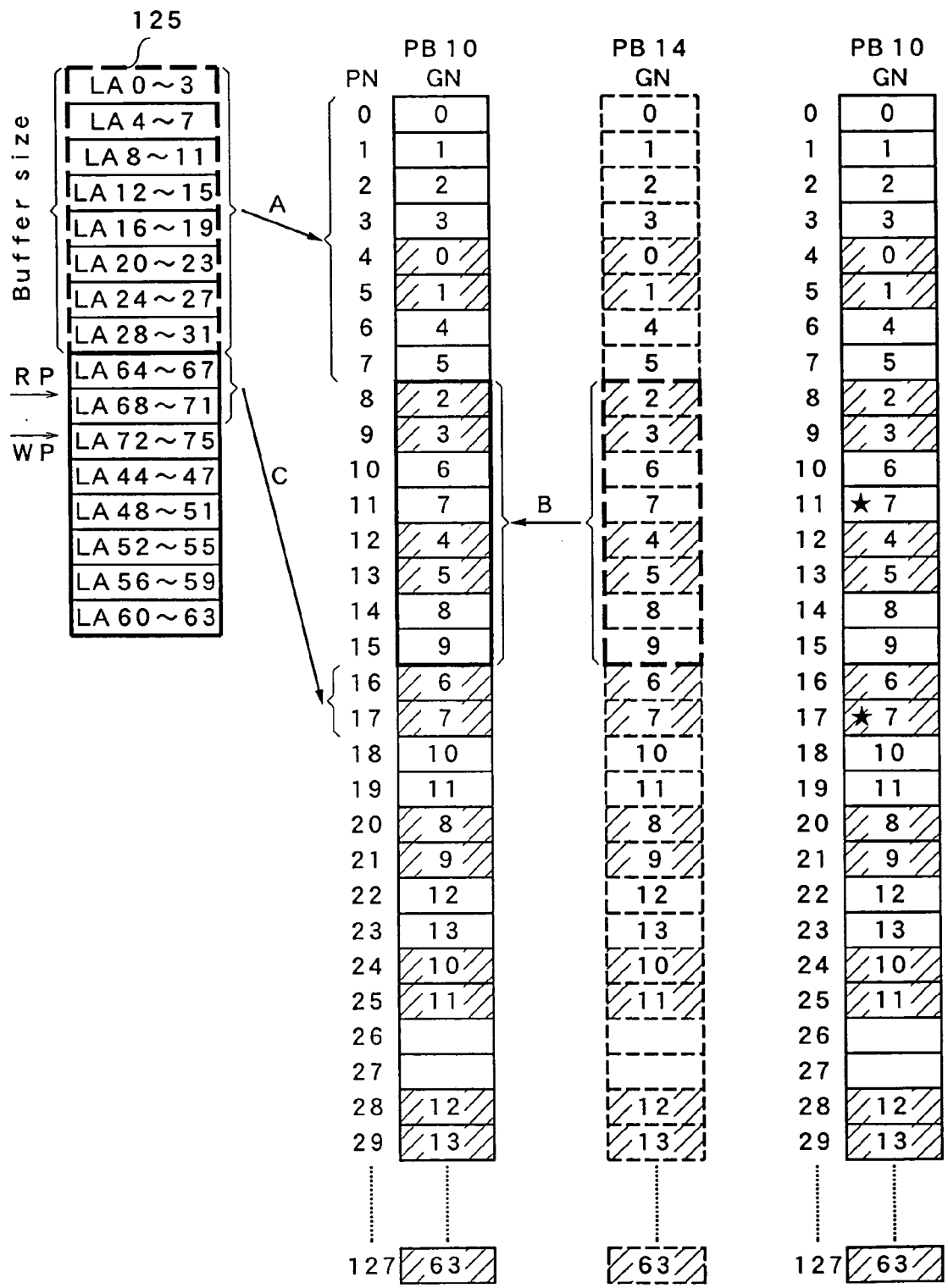
FIG. 24A is a view explaining error correction processing at a flash trouble occurrence when clusters are written discontinuously.
Figure 24B:
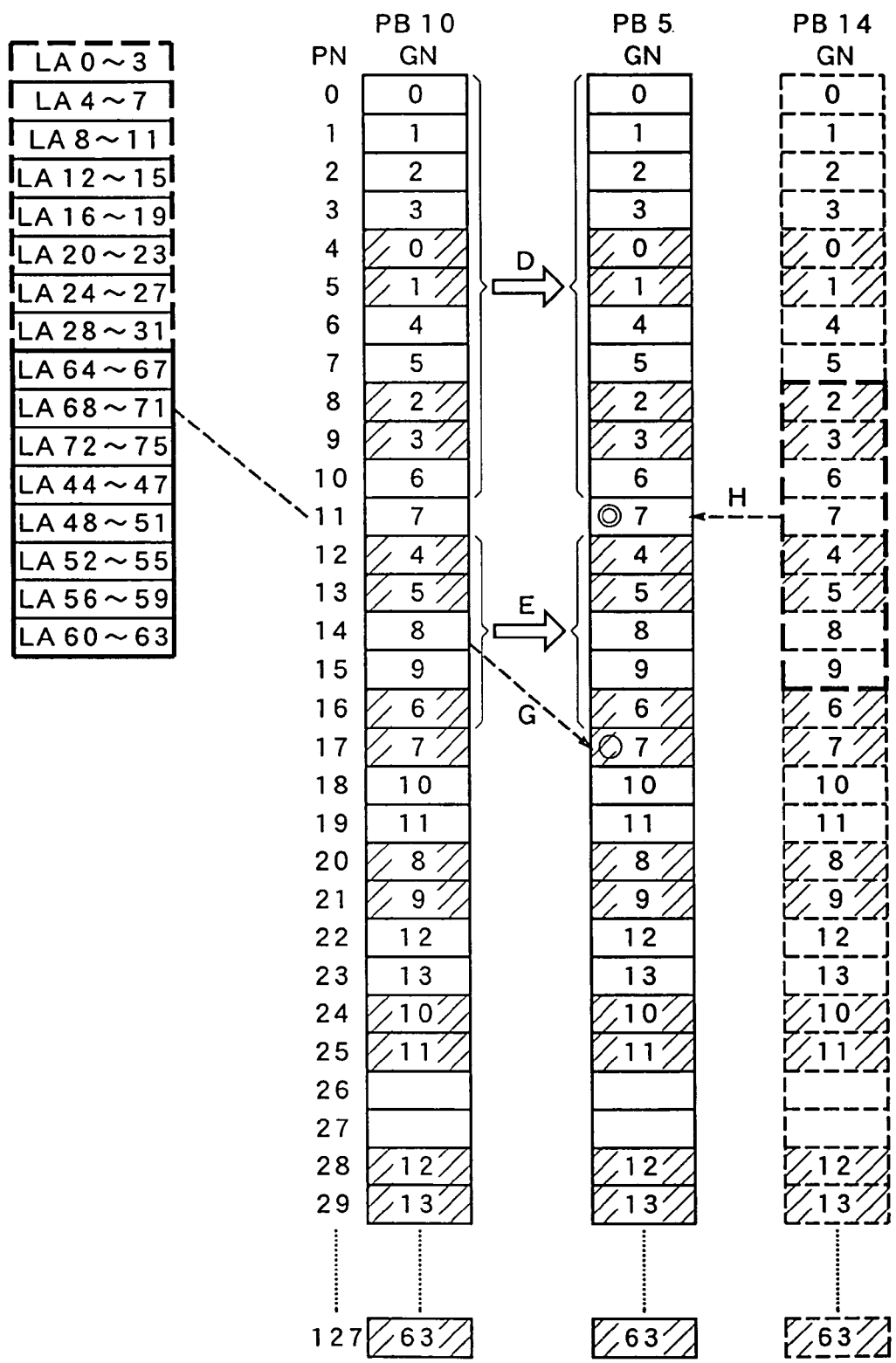
FIG. 24B is a view explaining error correction processing at the flash trouble occurrence when the clusters are written discontinuously.

After that, when flash trouble occurred at page 17 of the PB10, of error correction processings, copying shown by arrows D, E and retry processing by arrow G are same as those for FIG. 18B case. In this example, different from the processing shown in FIG. 18B, data corresponding to the restoration page are acquired from page 11 of the PB14 where old data are stored, as shown in FIG. 24B (arrow H).

The substitution/restoration processor 151 determines whether or not a data corresponding to the restoration page should be acquired from the buffer memory 125 by checking logical address area in the buffer memory 125. For the case shown in FIG. 24A, since data to be written into the restoration page, i.e., data corresponding to the logical addresses LA32 to LA63, are not stored in the buffer memory 125, it is necessary to acquire the data from the nonvolatile memory 110.

In this case, the substitution/restoration processor 151 checks the logical physical conversion table 142 via the address management unit 126 and makes judgment whether or not physical block address PBA corresponding to the logical addresses LA32 to LA63 is being assigned. If it is assigned, it checks the physical area management table 141, investigates a status flag of the corresponding physical block address PBA, and if a valid data exists, executes restoration processing shown by arrow H in FIG. 24B. If there is no valid data, i.e., status the flag is an invalid block, no restoration processing is carried out.

As explained above, embodiment 1 of the present invention is designed to cause the error corrector 129 to execute the restoration processing, and therefore, such an error characteristic to the nonvolatile memory 110 constituting a same memory cell lying astride over two pages, namely, data stored in the first page is changed by second page writing error of the same page, can be corrected.

In the meantime, although such an example, where the buffer memory 125 is composed of nonvolatile memory such as ferroelectric random access memory (FeRAM), is shown, it is also possible to constitute it by the volatile RAM such as SRAM in the conventional case. However, if the power shutdown is caused in this case, restoration data in the buffer memory 125 will be lost and error correction at the error occurrence due to the power shutdown is not possible. In other words, it can be applied to error correction at error occurrence due to the flash trouble.

Further, although the nonvolatile memory 110 explained refers to such type where each of memory cell holds data lying astride over two pages, the present invention is also applicable to a memory of such type that holds data lying astride over three pages. Further, such a memory in which memory cell is closed within the page, e.g., binary NAND flash memory, may be used as the nonvolatile memory 110. In this case, execution of the restoration processing can be masked if designed in such that the page information indicator 153 always returns page 0, as the related page number, to the restoration page identification part 152.

Table 1 is a summary of differences of error processing between the conventional nonvolatile memory System and the nonvolatile memory System according to embodiment 1 of the present invention. By adding the error correction processing, the present embodiment is able to overcome an error characteristic to the nonvolatile memory constituting memory cell lying astride over a plurality of pages as represented by multiple-valued NAND flash memory, which is cited as conventional problem.

TABLE 1

|  | Correction to be taken at flash trouble occurrence | Correction to be taken at power shutdown occurrence |
| --- | --- | --- |
| Conventional | Substitution processing: Copy Retry | Substitution processing: Copy only |
| Embodiment 1 of present invention | Error correction processing: Copy Retry Restoration | Error correction processing: Copy Restoration |

Embodiment 2

The following description deals with nonvolatile memory System according to embodiment 2 of the present invention. With embodiment 2, the same data is written into two physical blocks, and therefore, when a writing error occurred and a data stored in a predetermined page of one physical block is changed, a restoration data is acquired from other physical block.

Figure 25:
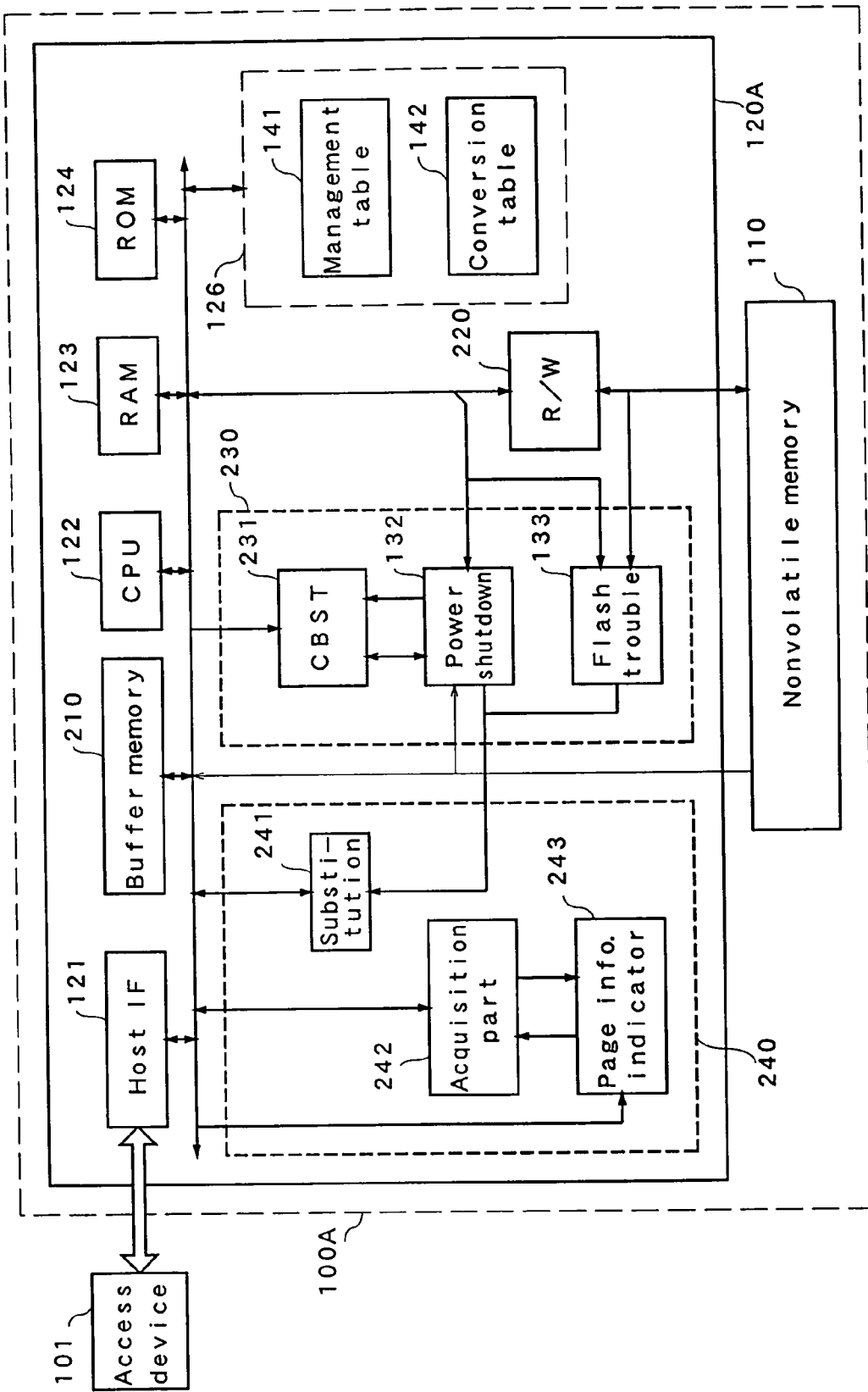
FIG. 25 is a block diagram of nonvolatile memory System according to embodiment 2 of the present invention.

FIG. 25 is a block diagram of a nonvolatile memory System. The nonvolatile memory System includes a nonvolatile memory Device 100A and an access device 101. The access device 101 is same as the access device 101 constituting the nonvolatile memory System of embodiment 1 shown in FIG. 1. The nonvolatile memory Device 100A has a memory controller 120A and a nonvolatile memory 110 including a flash memory. The nonvolatile memory 110 is same as that of embodiment 1.

Next, details of the nonvolatile memory Device 100A will be explained. The memory controller 120A included to the nonvolatile memory Device 100A is provided with a host IF 121 and CPU 122 for controlling whole memory controller 120A. Further, it has a RAM 123 that is a working area of the CPU 122 and a ROM 124 in which programs to be executed by the CPU 122 are stored.

Further, the memory controller 120A has a buffer memory 210 for storing a data temporarily when accessing to the nonvolatile memory 110, and the address management unit 126 for designating address of the nonvolatile memory 110. Storage contents of the buffer memory 210 are same as those of embodiment 1. It is composed of a volatile memory such as the SRAM. It may be composed of the nonvolatile RAM. The address management unit 126 is same as the address management unit 126 constituting the nonvolatile memory System of embodiment 1.

A reading/writing controller 220 has a function to write the same data for a plurality of blocks, for example, two physical blocks acquired by the address management unit 126 according to an instruction by a writing block acquisition part 242. At writing, a time lag is provided to allow writing into positions of the same page number.

An error page identification part 230 includes a current block status table (CBST) 231, power shutdown judgment unit 132 and flash trouble judgment unit 133. The power shutdown judgment unit 132 and the flash trouble judgment unit 133 are same as those of embodiment 1. The current block status table 231 has a plurality of current block status tables 131 of embodiment 1 shown in FIG. 14. The number of tables is equivalent to the number of physical blocks subjected to parallel writing.

An error corrector 240 is composed of a substitution processor 241, writing block acquisition part 242, and page information indication unit 243. The substitution processor 241 receives error occurrence page address and error type flag transferred from an error page identification part 260 and when the error type flag is value 1, i.e., it is the error due to the flash trouble, executes substitution processing of the physical block including the error occurrence page. The substitution processor 241 executes copy processing of pages with lower order address than the error occurrence page and further executes, in the physical block of the copy destination, rewriting (hereafter referred to as the retry processing) to the page bearing the same page number of the error occurrence page. The page information indication unit 243 is to return a page number N in response to output a request signal from the writing block acquisition part 242. The page number N means number of pages of a group constituted by the same memory cell. In embodiment 2, since the page number N is enough as the page information, the page number N alone may be stored simply without waiting for a page information table shown in FIG. 15, or it may be configured that the page number N can be indicated by bit operation processing based on a device code being read from the nonvolatile memory 110. The writing block acquisition part 242 is a block for acquiring writing object physical blocks as many as N based on the page number N.

Next, operation of the nonvolatile memory Device 100A will be explained.

[Initial Status]

Status immediately after shipment is same as that of embodiment 1.

[Initialization Processing at Power Startup]

Next, initialization processing at the power startup shown in FIGS. 17A and 17B is nearly same as that of embodiment 1. However, it is understood that a page information table shown in FIG. 15 is to store simply page number N only.

[Processing Under Ordinary Operation]

Next, processing under ordinary operation after initialization will be explained. The present invention aims to improve error correction in the writing process, and therefore, only writing process is explained hereafter. Besides, in many cases, writing from the access device 101 is normally made in cluster unit, and therefore, only writing in cluster unit is explained.

First, the access device 101 transfers a writing command of 16 k byte (as much as 1 cluster) of the logical addresses LA0 to LA31 to the nonvolatile memory Device 100. Upon receiving the writing command, the host IF 121 notifies reception to the CPU 122, and the CPU 122 writes the transferred data and logical address into the buffer memory 210.

Data holding status flag is in binary form and all are value 00, namely, in data transfer waiting status from the access device 101. In this case, data and logical address are being stored from lower order address side of the buffer memory 210, namely, stored in ascending order from word number 0 side.

Figure 26:
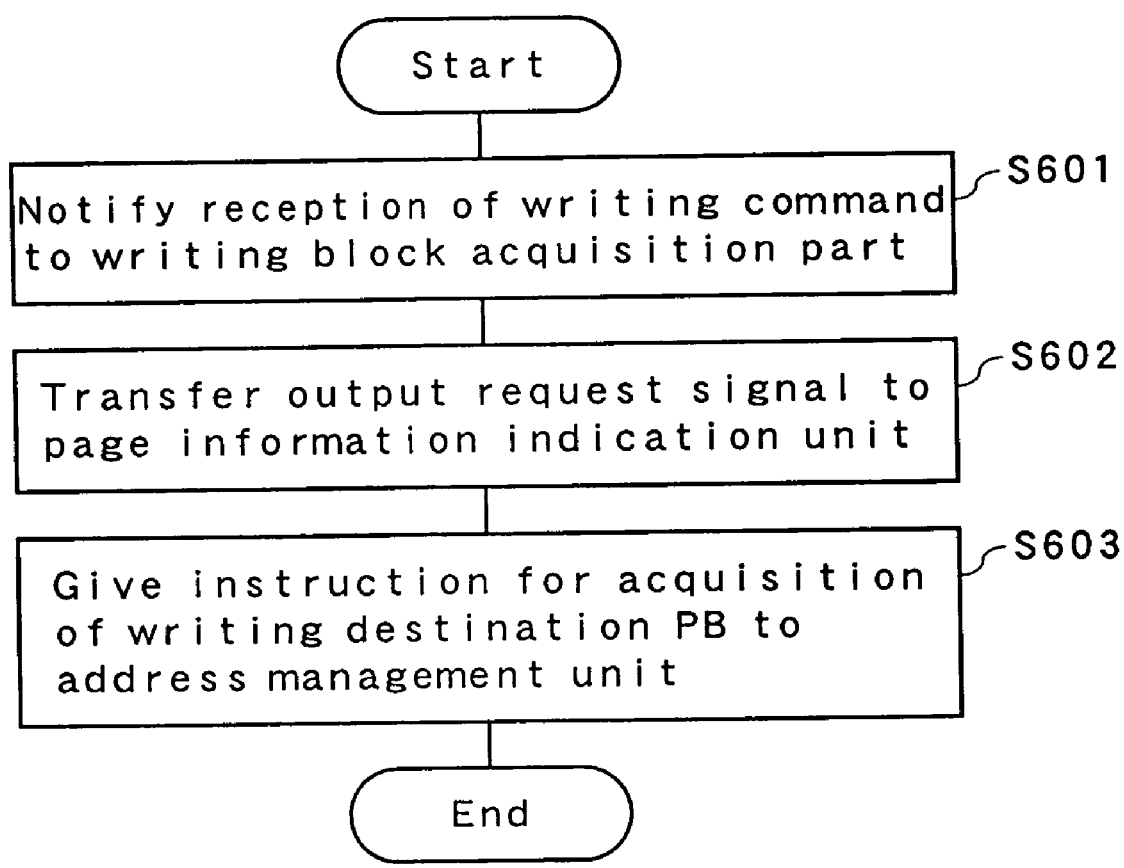
FIG. 26 is a flowchart showing contents of processing by writing block acquisition part and page information indicator according to embodiment 2 of the present invention.

FIG. 26 is a flowchart showing contents of processing of the writing block acquisition part 242 and page information indication unit 243.

When the host IF 121 receives the writing command from the access device 101 simultaneously with the above, it notifies command reception to the writing block acquisition part 242 as shown in FIG. 26 (S601). The writing block acquisition part 242 transfers an output request signal to the page information indication unit 243, and the page information indication unit 243 returns the page number N to the writing block acquisition part 242 (S602). In the present embodiment, N equals to 2. The writing block acquisition part 242 gives an instruction for acquisition of writing destination physical blocks as many as N (two) to the address management unit 126 (S603).

The address management unit 126 refers to the physical area management table 141, searches invalid blocks from the address of the physical area management table 141 selected at random in ascending order, and two invalid blocks, for example, the PB10 and PB8, are considered to be blocks to be written. This allows realization of wear leveling in which the blocks to be written are not concentrated to specific blocks. The reading/writing controller 220 transfers erasing command of the PB10 and PB8 to the nonvolatile memory 110 and executes data writing after the PB10 and PB8 are erased.

Figure 27A:
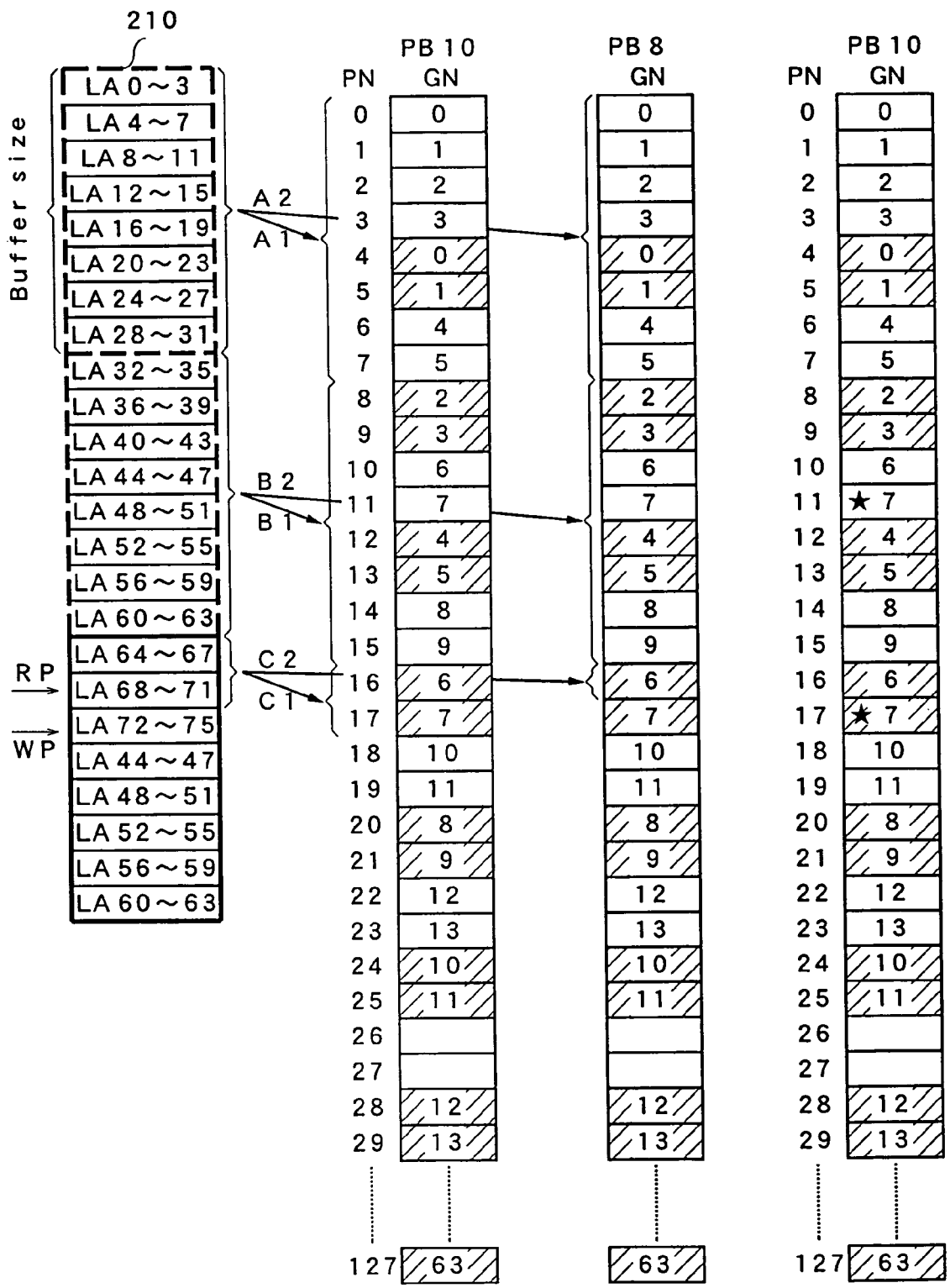
FIG. 27A is a view explaining error correction processing at flash trouble occurrence according to embodiment 2 of the present invention.

Next, flow of writing data stored temporarily in the buffer memory 210 into a physical block in the nonvolatile memory 110 will be explained referring to FIG. 27A. The left end of FIG. 27A is the buffer memory 210 and area in the range of LA0 to LA31 is a buffer size. The area recorded in this buffer is shifted gradually downwardly in FIG. 27A, and as described later, the buffer memory 125 is in a state enclosed by the solid line at error occurrence, i.e., at a point of time when writing has been made to the page 17 of the PB10.

First, the access device 101 transfers data writing command of 16 k byte (as much as 1 cluster) of logical addresses LA0 to LA31 to the nonvolatile memory Device 1006. Upon receiving the writing command, the host IF 121 notifies the reception to the CPU 122, and the CPU 122 writes the transferred data and logical address into the buffer memory 210.

In the case nothing is stored in the buffer memory 210, data holding flag in the buffer memory 210 are all in value 00, and both write pointer and read pointer point to the word number 0. The CPU 122 then stores data as much as one cluster and logical address from the storage position of the word number 0 to which the write pointer points in ascending order, increments write pointers one by one, and sets the data holding flag of the word stored to value 11.

Meanwhile, the writing block acquisition part 242 issues request for acquisition of two writing destination physical blocks to the address management unit 126 and at the same time, executes all clear of the current block status table 1001. The current block status table 231 has two current block status tables 131 shown in FIG. 14, each corresponding to the PB10 and PB8.

The address management unit 126 then refers to the physical area management table 141 and determines selectively physical blocks at the destination from those physical blocks with invalid status flag. In this case, two physical blocks PB10 and PB8 are selected, and the PB10 is assigned to a main block and the PB8 to a sub-block. It writes address PBA10 of the main block PB10 into corresponding logical block address LBA0 on the logical physical conversion table 142 and at the same time, notifies to the CPU 122 physical block address PBA10, PBA8 of the PB10, PB8.

The CPU 122 writes PBA10 and corresponding LBA0 and PBA8 and corresponding LBA0 in the current block status table 231 and then proceeds to writing processing to write data stored temporarily in the buffer memory 210 into the PB10 and PB8.

The CPU 122 executes storing processing into the buffer memory 210 and executes simultaneously data writing processing into the PB10 and PB8 depending on stored state. Specifically, when it is points to a position where the write pointer is advanced by more than four words than the read pointer, a data writing instruction to the PB10 and PB8 is issued to the address management unit 126. For example, when the read pointer points to the word number 0 and the write pointer points to the word number 4, which means that data is being stored temporarily in the area of word numbers 0 to 3 of the buffer memory 210, it is possible to issue to the PB10 and PB8 a data writing instruction as much as one page.

The CPU 122 transfers data stored in the area of the word numbers 0 to 3 of the buffer memory 210 to the reading/writing controller 220 and sets the data holding flag of word numbers 0 to 3 of the buffer memory 210 to value 10. Simultaneously with this, the address management unit 126 refers to logical address LA stored in the buffer memory 210, considers a page number in the logical address format shown in FIG. 11 as a page number (current page number) of writing destination, and transfers it sequentially to the reading/writing controller 220 and the error page identification part 230.

The reading/writing controller 220 writes data into corresponding page of the PB10 in the nonvolatile memory 110. Upon completion of writing, the nonvolatile memory 110 puts the ready/busy flag into ready state, and notifies the state to the error page identification part 230 and the CPU 122. When, as a result of notification, it is judged that normal writing has been made without error occurrence, the same data is written into the corresponding page of the PB10.

When normal writing has not been made due to error occurrence with both or either of the PB10 or PB8, it proceeds to the error correction processing.

Further, when no error occurred, the CPU 122, after receiving said ready/busy flag, sets data holding flag of the word numbers 0 to 3 of the buffer memory 210 to value 00, and updates so that the read pointer may point to the word number 4. When the write pointer is pointing word number more than word number 8, it writes the data stored in word numbers 4 to 7 into the PB10. After writing, the data of the word numbers 4 to 7 is written into the PB8.

In the manner as stated above, the data stored in the buffer memory 210 is written sequentially into corresponding page of the PB10 and PB8. As for temporary storage of data from the access device 101 to the buffer memory 210, writing is made with circulating manner depending on above mentioned write pointer. In other words, the write pointer returns to the word number 0 subsequent to the word number 28. On this occasion, if data holding status flag value of word number 0 is not 00, it means that temporary storage into the buffer memory 210 is prohibited. If this is the case, and if the access device 101 is under the writing command, the memory controller 120B outputs a wait signal to the access device 101 via the host IF 121 to interrupt data transfer. The access device 101 continues interruption of data transfer until this wait signal is released.

At the point when data is being stored temporarily in all areas of the buffer memory 210, writing processing of one cluster from the access device 101 is completed, and the data of logical addresses LA0 to LA31 stored in the buffer memory 210 are written in the pages 0 to 7 of the PB10 and PB8. This processing is represented by arrow A1, A2 shown in FIG. 27A. Upon completion of this writing, the nonvolatile memory 110 puts the ready/busy flag into ready state, and notifies the state to the error page identification part 230 and CPU 122. When, as a result of notification, normal writing has been made without error occurrence, the CPU 122 notifies the access device 101 via the IF 121 of "Corresponding cluster has been written normally".

When the access device 101 executes continually writing processing as much as one cluster of the logical addresses LA32 to LA63, the nonvolatile memory Device 100A executes a series of processings similar to processing mentioned above to store the data into pages 8 to 15 of the PB10 and PB8. This processing corresponds to B1, B2 in FIG. 27A. Further, when the access device 101 executes continually the writing processing of as much as one cluster of the logical addresses LA64 to LA95, the nonvolatile memory Device 100A executes a series of processings (C1, C2) similar to mentioned above to store the data into pages 16 to 23 of the PB10 and PB8.

[Error Correction Processing to be Taken at Flash Trouble Occurrence]

Here, processing to be taken when normal writing is not possible due to flash trouble occurrence in writing to the page 17 of the PB10 will be explained using FIGS. 27A and 27B. Processing of the flash trouble judgment unit 133 is similar to that of FIG. 19 of embodiment 1.

In FIG. 19, in writing into the page 17 of the PB10, the address management unit 126 transfers a current page number to the reading/writing controller 220 and error page identification part 230. Upon completion of writing into the page 17 of the PB10, the nonvolatile memory 110 transfers error status to the memory controller 120A, and the flash trouble judgment unit 133 receives this (S202). The flash trouble judgment unit 133 checks error status and when the flag showing error occurrence is being set (S203), recognizes that flash trouble occurred under writing into page 17 of the PB10, sets the error page number (physical address) and the error type flag to value 1 and transfers them to the substitution processor 241 (S204), while the page 17 is considered to be error occurrence page. Meanwhile, as for the error type flag, value 0 denotes the error due to the power shutdown and value 1 denotes the error due to the flash trouble.

The substitution processor 241 receives the error page number transferred from the error page identification part 230 and error type flag, and when error type flag is value 1, the substitution processor 241 executes the copy processing and retry processing as substitution processing.

Figure 27B:
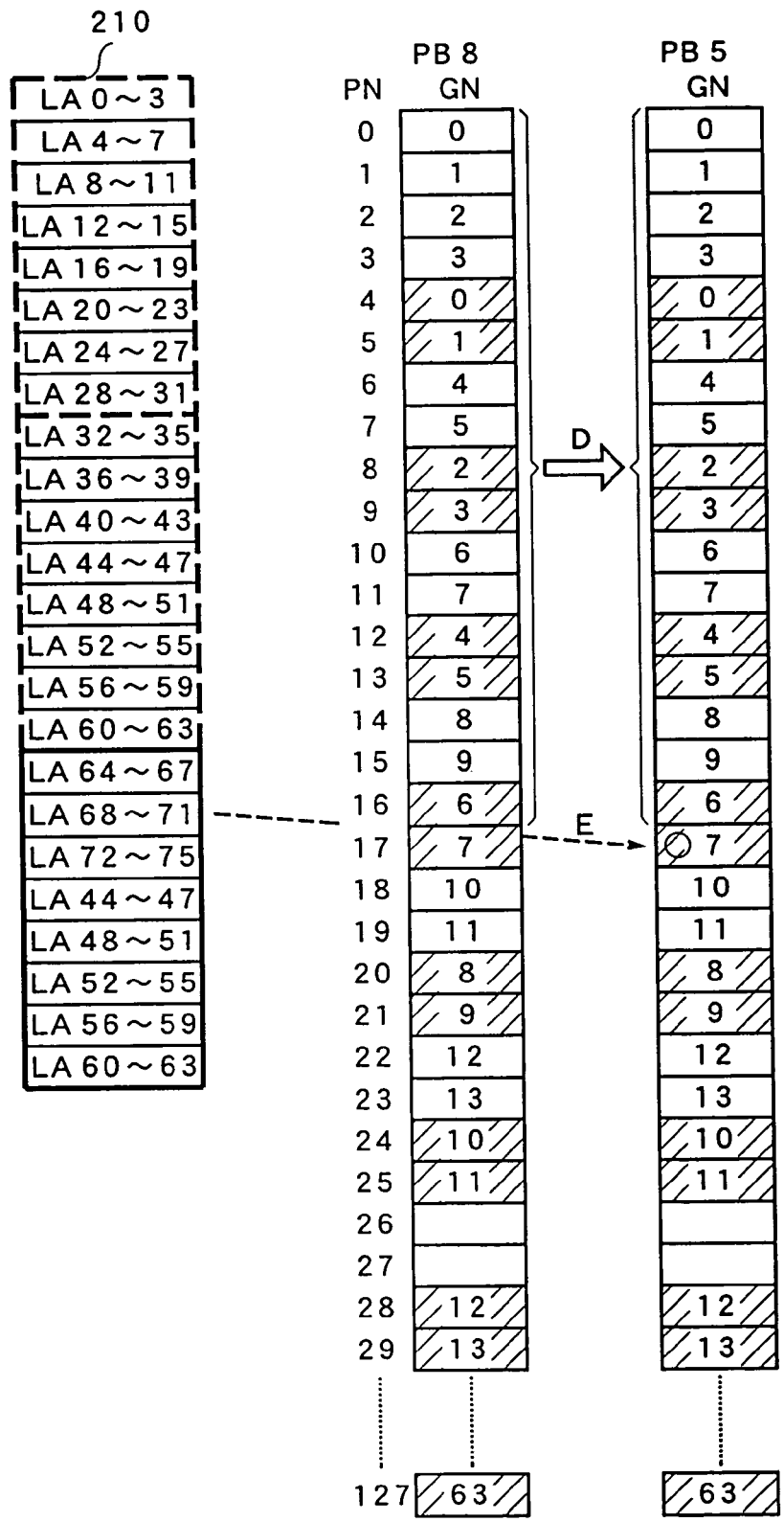
FIG. 27B is a view explaining the error correction processing at the flash trouble occurrence according to embodiment 2 of the present invention.

The copy processing is such processing that, data written in pages 0 to 16 of sub-block PB8 free from any error is copied to separate erased physical block (PB5) to construct a new main block, and this processing is represented by arrow D in FIG. 27B. In copy processing, first, the address management unit 126 acquires an erased physical block, for example, the PB5 as a copying destination block, and the substitution processor 241 executes copy processing of lower order address pages (page 0 to 16) than error occurrence page (page 17).

In the meantime, the retry processing is a processing to write again the data, that once failed to be written into page 17 of the PB10, into page 17 of the PB5, and this is represented by arrow E in FIG. 27B. In the retry processing, the substitution processor 241 executes retry processing of the error occurrence page, and when writing is successful, writing into the page 18 and onward are continued. When writing fails, "Corresponding cluster has not been written normally" is notified to the access device to remind rewriting command of the cluster.

By substitution processing as mentioned above, it is possible to correct errors due to the flash trouble. The address management unit 126 sets a corresponding status flag in the physical area management table 141 to an invalid block so that the PB10 may be used next after being erased.

[Error Correction Processing to be Taken at Powder Shutdown Occurrence]

As for error correction processing to be taken at the power shutdown occurrence is to execute above-mentioned error correction processing at flash trouble occurrence in initial state after the power startup, and as for processing contents, only copy processing shown in FIG. 27B is carried out. Namely, the retry processing is not carried out.

Figure 28A:
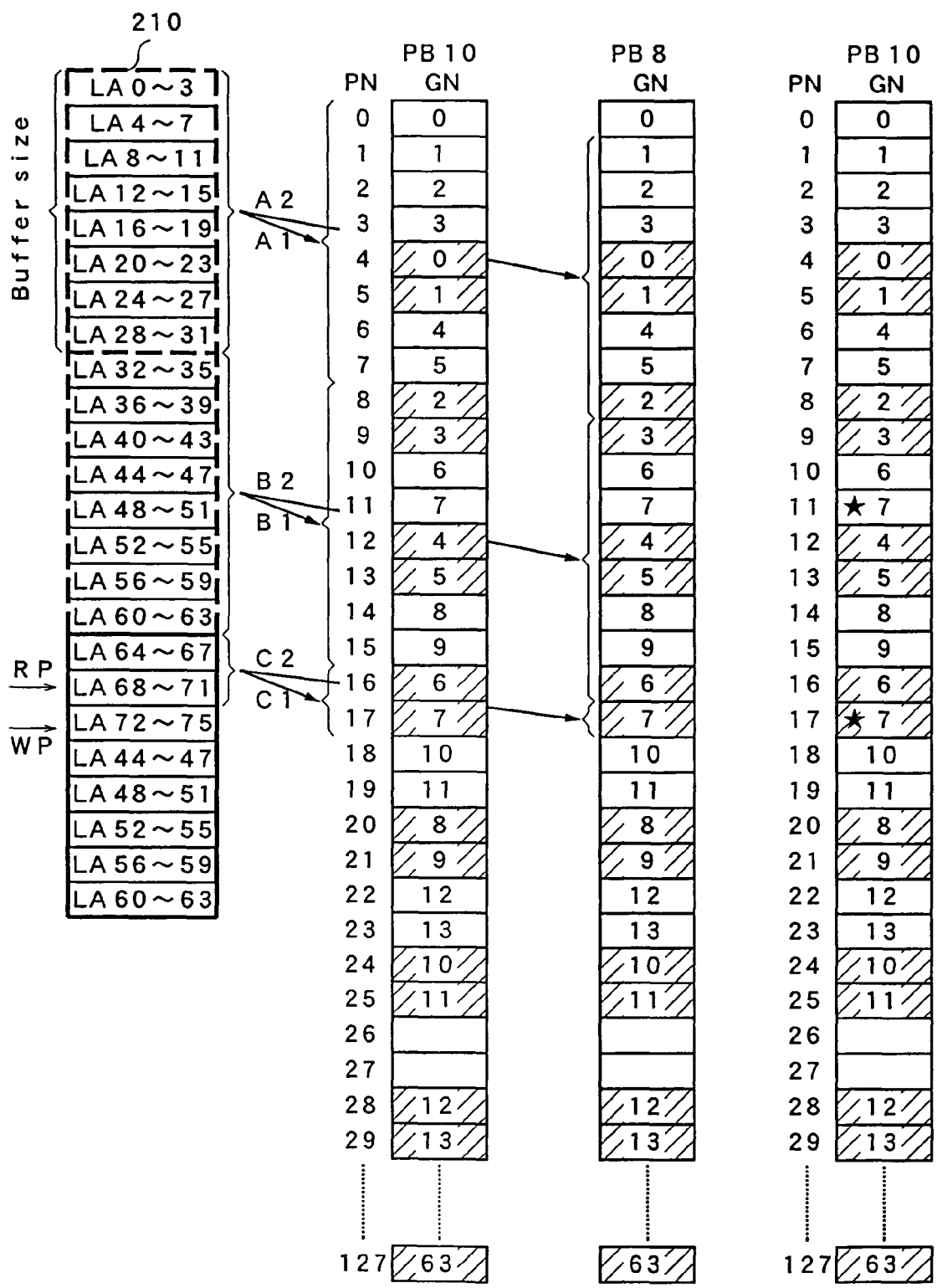
FIG. 28A is a view explaining the error correction processing at the flash trouble occurrence according to a modification of embodiment 2.
Figure 28B:
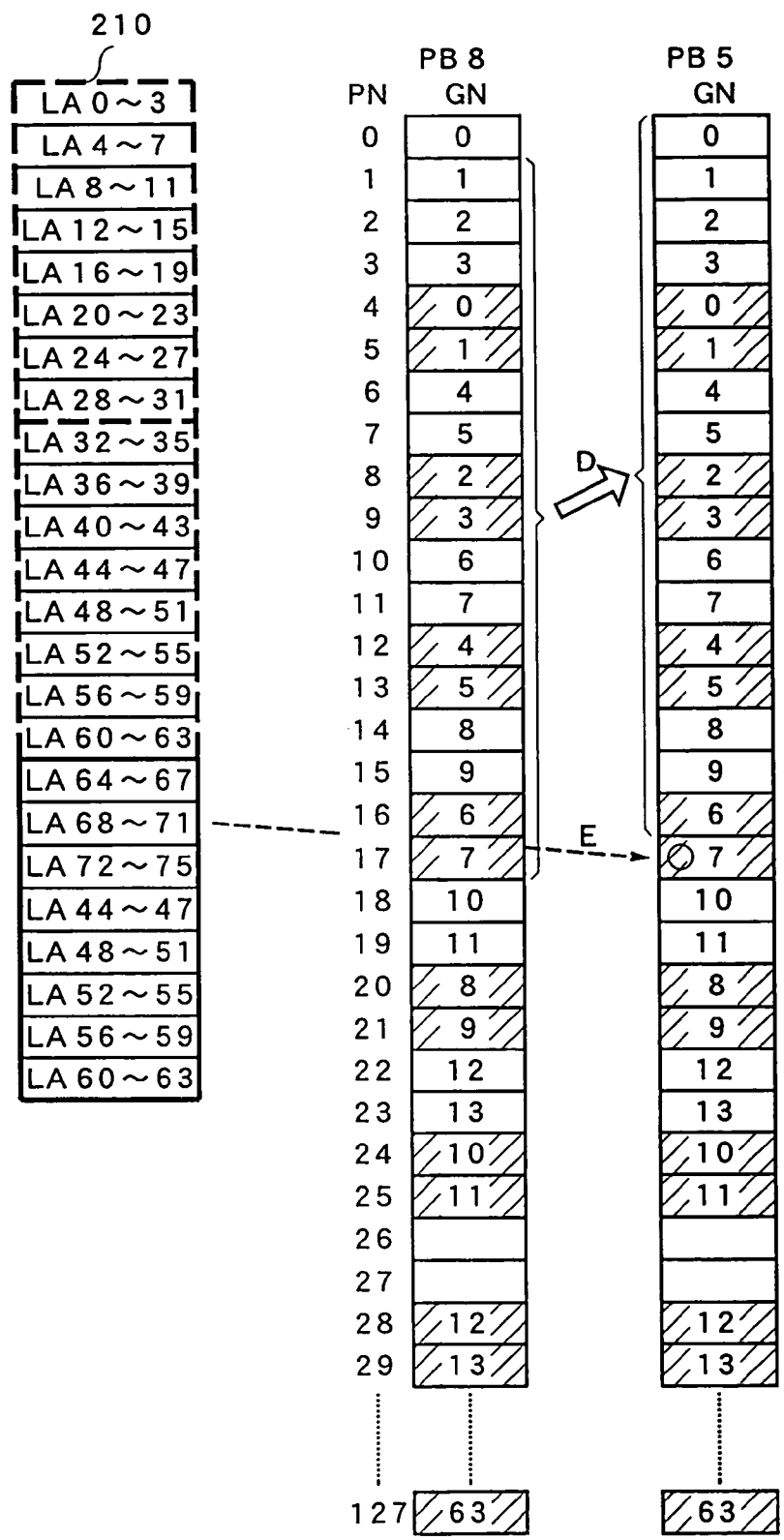
FIG. 28B is a view explaining the error correction processing at the flash trouble occurrence according to a modification of embodiment 2.

Next, a modification of embodiment 2 will be explained. In this variation, as shown in FIGS. 28A and 28B, data is written simultaneously into the main block PB10 and sub-block PB8 while page numbers are shifted. For example, logical addresses LA0 to LA31 of the buffer memory is written into the page numbers 0 to 7 of the physical block PBA10, and in this case, the same is also written into the page numbers 1 to 8 of the PB8. Page numbers are shifted similarly in the following description. In this case, it is possible to write into the main block PB10 and sub-block PB8 simultaneously. In above-mentioned case, it is probable that if simultaneous writing is attempted and the power shutdown or flash trouble is caused, a page 11 may become abnormal state in both main block and sub-lock, and the page 11 can not be restored by copy processing. For this reason, writing is made alternately to the main block and sub-block. In this modification, since page numbers are shifted, it is possible to write the same logical address data simultaneously into the main block and sub-block. In other words, writing speed is doubled thereby improving writing performance.

Table 2 is a summary of differences of error processing between conventional nonvolatile memory System and the nonvolatile memory System according to embodiment 2 of the present invention. By adding an error correction processing, the present embodiment is able to overcome an error characteristic to the nonvolatile memory in which each memory cell holds data lying astride over a plurality of pages.

TABLE 2

| | Correction to be taken at flash trouble occurrence | Correction to be taken at power shutdown occurrence |
|---|---|---|
| Conventional | Substitution processing: Copy Retry | Substitution processing: Copy only |
| Embodiment 2 of present invention | Error correction processing: Copy Retry | Error correction processing: Copy |

As described above, embodiment 2 of the present invention is designed that the writing block acquisition part 242 writes the same data into a plurality of physical blocks according to the writing command from the access device 101, and when a writing error occurred in the physical block, the substitution processing can be provided using the data (all are normal data) being stored in other physical block. Therefore, it is possible to correct an error characteristic to the nonvolatile memory 110 constituting the same memory cell lying astride over two pages, namely, such an error that data stored in the first page is changed by a writing error in the second page.

Since the nonvolatile memory 110 is a memory in which each memory cell holds data lying astride over two pages, it is designated to be N=2. When a memory that holds data lying astride over three pages is used, the page information indicator 153 may simply indicate N=3.

Embodiment 3

Nonvolatile memory System according to embodiment 3 of the present invention will be explained hereafter. Embodiment 3 is a nonvolatile memory System for writing the same data into two physical blocks as described in embodiment 2. In embodiment 3, different from embodiment 2, error correction is realized in such that writing is made to the first page only of one of two physical blocks (first block) and writing is made to the second page only of other physical block (second block), and following this, the first page of the first block and the second page of the second block are read to be unified into one physical block.

Figure 29:
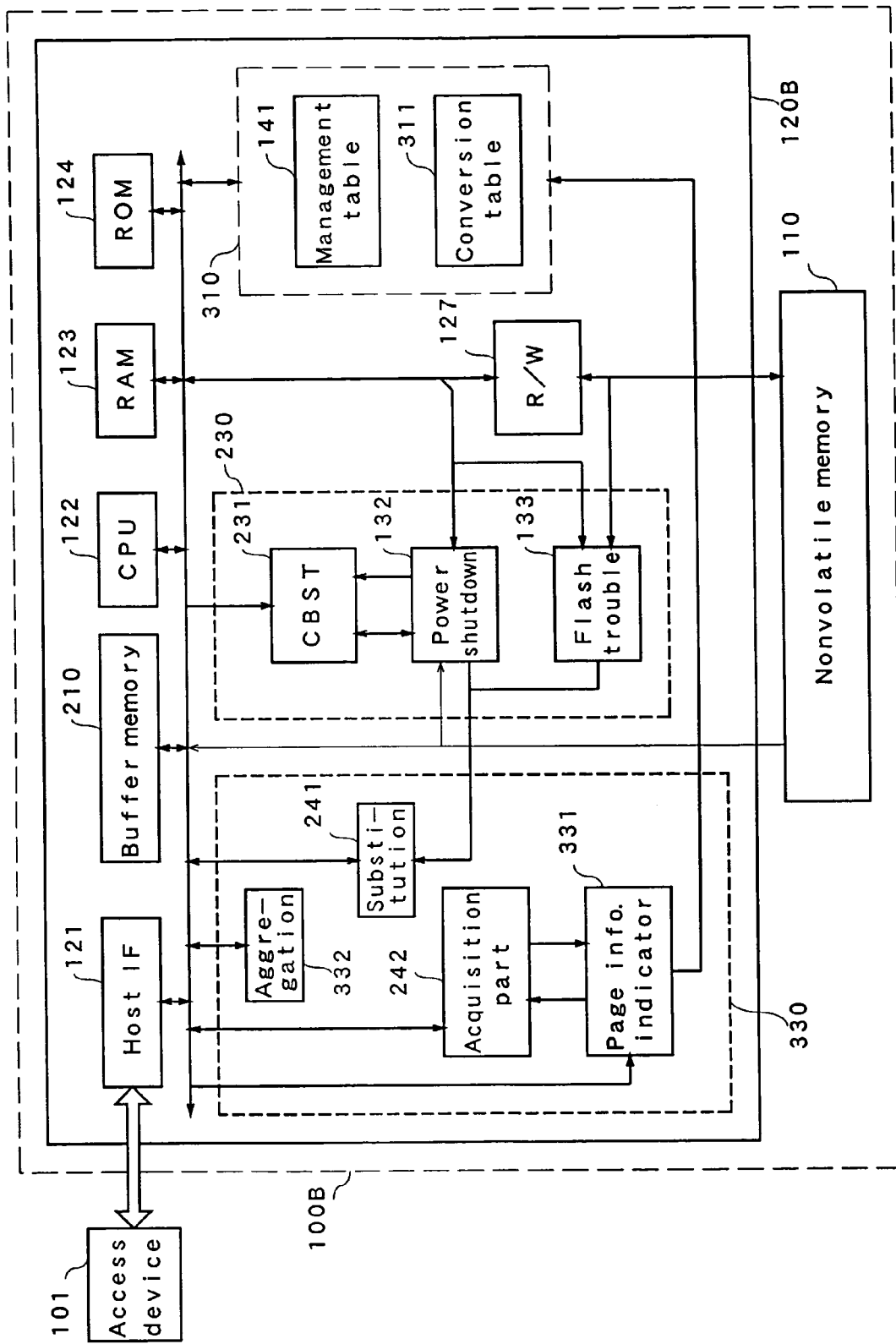
FIG. 29 is a block diagram of a nonvolatile memory System according to embodiment 3 of the present invention.

FIG. 29 is a block diagram of a nonvolatile memory System. The nonvolatile memory System includes a nonvolatile memory Device 100B and an access device 101 to which the nonvolatile memory Device 100B is connected. The access device 101 is same as that of the nonvolatile memory System of embodiment 1.

The nonvolatile memory Device 100B has a nonvolatile memory 110 including a memory controller 120B and flash memory.

Details of the nonvolatile memory Device 100B will be explained hereafter. The memory controller 120B included to the nonvolatile memory Device 100B is provided with the host IF 121 and CPU 122 for controlling whole memory controller 120B. Further, it has the RAM 123 that is a working area of the CPU 122 and the ROM 124 in which programs to be executed by the CPU 122 are stored.

Furthermore, the memory controller 120B has the buffer memory 210 for storing data temporarily when accessing to the nonvolatile memory 110, the reading/writing controller 127 similar to that of embodiment 1 and an address management unit 310. The buffer memory 210 is composed of the volatile memory such as the SRAM, but it may be composed of the nonvolatile RAM.

The address management unit 310 is different from embodiment 1 in that writing destination block is selected according to page type information indicated by the page information indicator 331 while others are identical. The address management unit 310 includes the physical area management table 141 and a logical physical conversion table 311. The physical area management table 141 is same as the physical area management table 141 in embodiment 1. The logical physical conversion table 311 includes, different from the logical physical conversion table 142 shown in FIG. 13, a storage area as much as 26 bits for one logical block address and in the 26 bit area, there are two physical block address storage areas each consisting 13 bits. One storage area is used as a storage area for the first block and other storage area is used as a storage area for the second block.

The error page identification part 230 is similar to that of embodiment 2. An error corrector 330 includes the substitution processor 241, the writing block acquisition part 242, the page information indicator 331, and the aggregation processor 332. The substitution processor 241 is similar to the substitution processor 241 in embodiment 2. The page information indicator 331 holds a page information table and returns the page number N and page type information according to an output request signal from the writing block acquisition part 242. In addition, the page number N means the number of pages of a group composed of one memory cell. In embodiment 3, the page number N and page type information are enough for the page information. In addition, with a NAND flash memory with comparatively simple page composition as shown in FIG. 1, there is no need for a page information table shown in FIG. 15, and for example, based on the current page number, least significant bit thereof may be output as the page type information. The writing block acquisition part 242 is similar to that of embodiment 1. The aggregation processor 332 is a block that issues a writing command for aggregation into one physical block at the point of time writing into two blocks to be written (first block and second block) has been completed.

Operations of the nonvolatile memory device 100b will be explained hereafter.

[Initial State]

State immediately after shipment is similar to that of embodiment 1.

[Initialization Processing at Power Startup]

Next, initialization processing at the power startup will be explained. A page information table is generated in the page information indicator 331 with a similar manner as embodiment 1.

[Processing Under Ordinary Operation]

Next, processing under ordinary operation after initialization will be explained. Since the aim of the present invention is to improve error correction at writing process, the following description deals writing process only. Further, in many cases, writing from the access device 101 is normally made in cluster unit, writing in cluster unit is solely explained here for simplicity reason.

First, the access device 101 transfers the writing command of 16 k byte (one cluster) of logical addresses LA0 to LA31 to the nonvolatile memory Device 100. Upon receiving the writing command, the host IF 121 notifies the reception to the CPU 122 and the CPU 122 writes the transferred data and logical address into the buffer memory 125.

The data holding status flag is in binary form and all are in value 00, i.e., it is waiting for data transfer from the access device 101. In this case, data and logical address are stored from lower order address side of the buffer memory 210, namely, in ascending order from the word number 0 side.

When the host IF 121 receives the writing command from the access device 101 simultaneously with the above, the host IF 121 notifies command reception to the writing block acquisition part 242 as shown in FIG. 30 (S701). The writing block acquisition part 242 transfers output request signal to the page information indication unit 331, and receives the number of page N from the page information indication unit 331 (S702). In this embodiment, N equals to 2. The writing block acquisition part 242 gives an instruction for acquisition of writing destination physical blocks as many as N (two) to the address management unit 310 (S703).

Upon receiving output request signal from the writing block acquisition part 242 (S704), the page information indication unit 331 transfers the page information table provided inside (see FIG. 15) to the address management unit 310 (S705). The address management unit 310 needs SRAM for storing temporarily the page information table. Meanwhile, the address management unit 310 may attempt to refer sequentially to the page information table provided inside the page information indication unit 331.

The address management unit 310 refers to the physical area management table 141, searches in ascending order invalid physical blocks from the address selected at random, and two invalid blocks, for example, the PB10 and PB8, are considered to be blocks to be written. This allows realization of wear leveling in which the writing object physical blocks are not concentrated to specific blocks. The address management unit 310 transmits the PB10 and PB8 erasing commands to the nonvolatile memory 110 via the reading/writing controller 220 and executes data writing after the PB10 and PB8 are erased.

Next, flow of writing data stored temporarily in the buffer memory 210 into physical block in the nonvolatile memory 110 will be explained referring to FIG. 31A. The left end of FIG. 31A is the buffer memory 210 and areas in the range of LA0 to LA31 is a buffer size. The area recorded in this buffer is shifted gradually downwardly in FIG. 31A, and as will be explained later, the buffer memory 125 is in a state enclosed by the solid line at error occurrence, i.e., at the point of time when writing has been made to the page 17 of the PB10.

First, the access device 101 transfers the writing command of 16 k byte (as much as 1 cluster) of logical addresses LA0 to LA31 to the nonvolatile memory Device 100B. Upon receiving the writing command, the host IF 121 notifies the reception to the CPU 122, and the CPU 122 writes the transferred data and logical address into the buffer memory 210.

In the case nothing is stored in the buffer memory 210, a data holding flag in the buffer memory 210 are all in value 00, and both write pointer WP and read pointer RP point to the word number 0. The CPU 122 then stores in ascending order data as much as one cluster and logical address from the storage position of the word number 0 to which the write pointer points, increments the write pointers one by one, and sets the data holding flag of the word stored to value 11.

Meanwhile, the writing block acquisition part 242 issues request for acquisition of two writing destination physical blocks to the address management unit 310 and at the same time, executes all clear of the current status table 231. The current block status table 231 has two current block status tables 131 shown in FIG. 14 each corresponding to the PB10 and PB8.

Here, the PB10 is defined to be a first block and the PB8 to be a second block. Then, address PBA10 of the first block PB10 is written into a physical block address storage area for corresponding first block on logical block address LAB0 of the logical physical conversion table 311. The address PBA8 of the second block PB8 is written into physical block address storage area for second block on logical block address LBA0 of the logical physical conversion table 311. Then, the PBA10 and PBA8 are notified to the CPU 122.

The CPU 122 writes logical block address (LBA0) corresponding to the physical block address (PBA10) and logical block address (LBA0) corresponding to the physical block address (PBA8) into current block status table, respectively, and then, the CPU 122 proceeds to writing of the data stored temporarily in the buffer memory 210 into the PB10 and PB8.

The CPU 122 executes writing process to the buffer memory 210 and at the same time, executes data writing process into the PB10 and PB8 depending on stored state. Specifically, when the write pointer WP points to a position more than four words ahead of the read pointer RP, a data writing instruction to the PB10 and PB8 is issued to the reading/writing controller 127. For example, when the read pointer points to the word number 0 and the write pointer points to the word number 4, it is meant that the data is stored temporarily in the word numbers 0 to 3 of the buffer memory 210, and the data writing instruction as much as one page can be issued to the PB10 and PB8.

The CPU 122 transfers the data stored in the area of word number 0 to 3 of the buffer memory 210 to the reading/writing controller 127 and sets the data holding flag of the word numbers 0 to 3 of the buffer memory 210 to value 10. Simultaneously with this, the address management unit 310 refers to the logical address LA stored in the buffer memory 210, considers page number in the logical address format shown in FIG. 11 as the page number (current page number) of writing destination, and transfers it to the reading/writing controller 127 and the error page identification part 230 sequentially.

Upon receiving data writing command to the PB10 and PB8, the CPU 122 compares the page number of writing destination (current page number) with the page identification information transferred from the page information indicator 331. As shown in FIG. 31A, the CPU 122 controls the reading/writing controller 127 in that if the current page number is the first page, data is written into the first block side and if the current page number is the second page, data is written into the second block side.

When normal writing has not been made due to error occurrence with either of the PB10 or PB8, it proceeds to the error correction processing.

Besides, when no error occurred, the CPU 122, after received the ready/busy flag, sets the data holding flag of the word numbers 0 to 3 of the buffer memory 210 to value 00, and executes renewal so that the read pointer may point to the word number 4. When the write pointer is pointing to a word number more than to the word number 8, it writes data stored in the word numbers 4 to 7.

The reading/writing controller 127 writes data into corresponding page of the PB10 or PB8 in the nonvolatile memory 110. At a point when data is being stored temporarily in all areas of the buffer memory 210, writing processing as much as one cluster from the access device 101 is completed, and data of logical addresses LA0 to LA31 stored in the buffer memory 210 are being stored in corresponding page of the PB10 and PB8. This processing is represented by arrows A to C shown in FIG. 31A.

When writing is completed, the nonvolatile memory 110 puts the ready/busy flag into ready state, and notifies the state to the error page identification part 230 and the CPU 122. When, as a result of notification, the CPU 122 judges that normal writing has been made without error occurrence, the CPU 122 notifies the access device 101 via the IF 121 of "Corresponding cluster has been written normally".

As mentioned above, data stored in the buffer memory 210 are written alternately into corresponding page of the PB10 and PB8 one by one. As for temporary storage of data from the access device 101 to the buffer memory 210, writing is made with circulating manner according to above mentioned write pointer. In other words, the write pointer returns to the word number 0 subsequent to the word number 28. On this occasion, if the value of the data holding status flag of the word number 0 is not 00, it means that temporary storage into the buffer memory 210 is prohibited. If this is the case, and if the access device 101 is under the writing command, the memory controller 1304 outputs a wait signal to the access device 101 via the host IF 121 to interrupt data transfer. The access device 101 continues interruption of data transfer until this wait signal is released.

When the access device 101 writes continually data as much as one cluster of the logical addresses LA32 to LA63, a series of processings similar to those mentioned above are carried out to store the data into corresponding pages of the PB10 and PB8. This processing corresponds to D to G shown in FIG. 31A. Further, when the access device 101 executes continually writing processing as much as one cluster of the logical addresses LA64 to LA95, a series of processings similar to those mentioned above are carried out to store the data into corresponding pages of the PB10 and PB8.

[Error Correction Processing to be Taken at Flash Trouble Occurrence]

Here, processing to be taken when normal writing is not possible due to flash trouble occurrence in writing to page 17 of the PB8 will be explained using FIG. 31B. In FIG. 31B, a star mark denotes a trouble. Processing of the flash trouble judgment unit 133 is similar to that of FIG. 19 for embodiment 1.

In FIG. 19, in writing to page 17 of the PB8, the address management unit 310 transfers the current page number to the reading/writing controller 127 and the error page identification part 203. Upon completion of writing into page 17 of the PB8, the nonvolatile memory 110 transfers error status to the memory controller 1304, and the flash trouble judgment unit 133 receives this (S202). The flash trouble judgment unit 133 checks error status and when a flag showing error occurrence is being set (S203), recognizes that flash trouble occurred under writing into page 17 of the PB8. The flash trouble judgment unit 133 then sets the error page number (physical address) and error type flag to value 1 considering page 17 as error occurrence page and transfers them to the substitution processor 241 (S204). Meanwhile, as for the error type flag, value 0 denotes an error due to the power shutdown and value 1 denotes the error due to the flash trouble.

The substitution processor 241 receives error page number and error type flag transferred from the error page identification part 230, and when error type flag is value 1, the substitution processor 241 executes the copy processing and the retry processing as substitution processing.

The copy processing is such processing that data written in pages 0 to 16 of sub-block PB8 is transcribed to separate erased physical block (PB5) to construct a new second block, and this processing is represented by arrow I in FIG. 31B. In the copy processing, first, the address management unit 310 acquires an erased physical block, for example, the PB5 as the copying destination block, and executes the copy processing of lower order address pages (page 0 to 16) than error occurrence page (page 17). Here, page number 11 of the physical block PB8 is data which caused trouble, however, this data is stored in the first block and is not used in the second block side, and therefore, there is no problem if copied as it is.

In the meantime, the retry processing is processing to write again the data, that once failed to be written into page 17 of the PB8, into page 17 of the PB5, and this is represented by arrow J in FIG. 31B. In the retry processing, the address management unit 310 executes the retry processing of error occurrence page, and when writing is successful, writing into page 18 and onward is continued. When writing fails, "Corresponding cluster has not been written normally" is notified to the access device to remind rewriting command of the cluster.

By substitution processing as described above, it is possible to correct errors due to flash trouble. The address management unit 310 sets a corresponding status flag in the physical area management table to invalid block so that the PB8 may be used next after being erased.

[Error Correction Processing to be Taken at Powder Shutdown Occurrence]

As for error correction processing to be taken at the power shutdown occurrence is to execute above-mentioned error correction processing at flash trouble occurrence in initial state after the power startup, and as for the processing contents, only the copy processing shown in FIG. 31B is carried out. Namely, the retry processing is not carried out.

[Aggregation Processing]

After writing of a predetermined logical address has been completed and at a point of time when moved to writing into separate logical block, the CPU 122 notifies the aggregation processor 332 that logical block address has been moved. It shows a state where writing processing of FIG. 32A has been completed normally. Upon receiving this notification, the aggregation processor 332 executes the aggregation processing.

The aggregation processor 332 copies the data stored in the first block PB10 and second block PB8 to a new erased block PB22 as shown in FIG. 32B. The aggregation processor 332 writes physical block address PBA22 of the PB22 into physical block address storage area for the first block of logical block address position corresponding to the logical physical conversion table 311 and at the same time, sets status flag of a physical block address PBA22 of the PB22 of the physical area management table 141 to effective block.

Besides, the address management unit 310 sets status flag of the physical area management table 141 to an invalid block so that the PB10 and PB8 may be used next.

As described above, according to embodiment 3 of the present invention, the writing block acquisition part 242 responds to the writing command from the access device 101, the address management unit 310 considers the first and second block as the blocks to be written, and writing to the first page is made to the first block and writing to the second page is made to the second block. Further, at the point the aggregation processor 332 completed writing of a predetermined logical block, the first block and second block are aggregated into separate block and written. With this manner, as a result, it is possible to correct an error characteristic to the nonvolatile memory 110 in which each memory cell holds data lying astride over a plurality of pages, namely, such an error that data stored in other page is changed by writing error in a certain page.

Since the nonvolatile memory 110 is a memory in which each memory cell holds data lying astride over two pages, it is designated by N=2. However, when a memory that holds data lying astride over three pages is used, the page information indicator 333 may simply indicate N=3.

Table 3 is a summary of differences of error processing between conventional nonvolatile memory System and nonvolatile memory System according to embodiment 3 of the present invention. By adding the error correction processing, the present embodiment is able to overcome an error, which is conventional problem, characteristic to the nonvolatile memory in which memory cells are constituted over a plurality of pages.

TABLE 3

|  | Correction to be taken at flash trouble occurrence | Correction to be taken at power shutdown occurrence |
| --- | --- | --- |
| Conventional | Substitution processing: Copy Retry | Substitution processing: Copy only |
| Embodiment 3 of present invention | Error correction processing: Copy Retry | Error correction processing: Copy |

Embodiment 4

A nonvolatile memory System according to embodiment 4 of the present invention will be explained hereafter. Meanwhile, embodiment 4 is an embodiment in which features of embodiment 2 and embodiment 3 are integrated together. Namely, processing to write the same data into two physical blocks is made, processing to aggregate these two physical blocks into one is made by the aggregation processing, and with this manner, even if writing error occurred and the data stored in a predetermined page of one physical block is changed, error correction is possible.

FIG. 33 is a block diagram of the nonvolatile memory System. The nonvolatile memory System includes a nonvolatile memory Device 100C and the access device 101. The access device 101 is similar to the nonvolatile memory System of embodiment 1.

The nonvolatile memory Device 100C has a memory controller 120C and the nonvolatile memory 110 including flash memory. The nonvolatile memory 110 is similar to that of embodiment 1.

Next, details of the nonvolatile memory Device 100C will be explained. The memory controller 120C included to the nonvolatile memory Device 100C is provided with the host IF 121 and CPU 122 for controlling whole memory controller 120C. Further, it has the RAM 123 that is a working area of the CPU 122 and the ROM 124 in which programs to be executed by the CPU 122 are stored.

Further, the memory controller 120C has a buffer memory 210 for storing data temporarily when accessing to the nonvolatile memory 110, and an address management unit 410 for designating an address of the nonvolatile memory 110.

Further, the address management unit 410 has the physical area management table 141 and a logical physical conversion table 411. The physical area management table 141 is similar to the physical area management table 141 of embodiments 1 and 2. The logical physical conversion table 411 includes, different from the logical physical conversion table 142 shown in FIG. 13, storage area as much as 26 bits for one logical block address. This storage area includes two physical block address storage areas each consisting of 13 bits. One of the physical block address storage areas is considered to be physical block address storage area for the first block and other is for the second block.

The reading/writing controller 220 is similar to the reading/writing controller 220 of embodiment 2. The error page identification part 230 is similar to the error page identification part 230 of embodiment 2. Meanwhile, a page information table shown in FIG. 15 is generated to the current block status tables 131. However, in embodiment 4, since the page number N is enough as the page information, only the number of pages N may be stored simply without a page information table shown in FIG. 15, or the page number N may be indicated by bit operation processing based on a device code being read from the nonvolatile memory 110.

An error corrector 420 consists of the substitution processor 241, writing block acquisition part 242, page information indication unit 243, and an aggregation processor 332. The substitution processor 241 is similar to the substitution processor 241 of embodiment 2. The page information indication unit 243 is similar to the page information indication unit 243 of embodiment 2. The writing block acquisition part 242 is similar to the writing block acquisition part 242 of embodiment 2. The aggregation processor 332 is similar to the aggregation processor 332 of embodiment 3.

FIGS. 34A and 34B are views showing the error correction processing to be taken when the flash error occurred. In the meantime, the retry processing is unnecessary for error correction to be taken after the power shutdown occurred.

Next, operations of the nonvolatile memory Device 100C will be explained.

[Initial State]

State immediately after shipment is similar to that of embodiment 1.

[Initialization Processing at Power Startup]

Next, initialization processing at the power startup will be explained. A page information table is generated in the page information indicator 243 with a similar manner as embodiment 1.

[Processing Under Ordinary Operation]

Next, processing under ordinary operation after initialization will be explained. Since the aim of the present invention is to improve error correction at writing process, the following description deals writing process only. Further, in many cases, writing from the access device 101 is normally made in cluster unit, only writing in cluster unit is solely explained here for simplicity reason.

First, the access device 101 transfers a writing command of 16 k byte (one cluster) of logical addresses LA0 to LA31 to the nonvolatile memory Device 100C. Upon receiving the writing command, the host IF 121 notifies the reception to the CPU 122 and the CPU 122 writes the transferred data and logical address into the buffer memory 210.

The data holding status flag is in binary form and all are in value 00, i.e., it is waiting for data transfer from the access device 101. In this case, data and logical address are being stored from lower order address side of the buffer memory 210, namely, in ascending order from word number 0 side.

When the host IF 121 receives the writing command from the access device 101 simultaneously with the above, the host IF 121 notifies command reception to the writing block acquisition part 242 as shown in FIG. 26 (S601). The writing block acquisition part 242 transfers output request signal to the page information indication unit 243, and the page information indication unit 243 returns the page number N to the writing block acquisition part 242 (S602). In this embodiment, N equals to 2. The writing block acquisition part 242 gives an instruction for acquisition of writing destination physical blocks as many as N (two) to the address management unit 126 (S603).

The address management unit 410 refers to the physical area management table 141, searches in ascending order invalid blocks from the address of the physical area management table 141 selected at random, and two invalid blocks, for example, the PB10 and PB8, are considered to be blocks to be written. This allows realization of wear leveling in which the blocks to be written are not concentrated to specific blocks. The address management unit 410 transmits the PB10 and PB8 erasing commands to the nonvolatile memory 110 via the reading/writing controller 220 and executes data writing after the PB10 and PB8 are erased.

Next, flow of writing data stored temporarily in the buffer memory 210 into physical block in the nonvolatile memory 110 will be explained referring to FIG. 34A. The left end of FIG. 34A is the buffer memory 210 and areas in the range of LA0 to LA31 is a buffer size. The area recorded in this buffer is shifted gradually downwardly in FIG. 34A, and as will be explained later, the buffer memory 125 is in a state enclosed by the solid line at error occurrence, i.e., at a point of time when writing has been made to page 17 of the PB10.

First, the access device 101 transfers writing command of 16 k byte (as much as 1 cluster) of logical addresses LA0 to LA31 to the nonvolatile memory Device 100C. Upon receiving the writing command, the host IF 121 notifies the reception to the CPU 122, and the CPU 122 writes the transferred data and logical address into the buffer memory 210.

In the case nothing is stored in the buffer memory 210, the data holding flag in the buffer memory 210 are all in value 00, and both write pointer and read pointer point to the word number 0. The CPU 122 then stores in ascending order data as much as one cluster and logical address from the storage position of the word number 0 to which the write pointer points, increments write pointers one by one, and sets the data holding flag of the word stored to value 11.

Meanwhile, the writing block acquisition part 242 issues request for acquisition of two writing destination physical blocks to the address management unit 410 and at the same time, executes all clear of the current status table 231. Meanwhile, the current block status table 231 has two current block status tables 131 shown in FIG. 14 each corresponding to the PB10 and PB8.

The address management unit 410 then refers to the physical area management table 141 and determines selectively physical blocks at the writing destination from those physical blocks in which status flag are invalid blocks. In this embodiment, the PB10 and PB8 are used as the physical block. Here, the PB10 is assigned to a first block and the PB8 to a second block. The address management unit 410 writes the physical block address PBA10 of the first block PB10 into storage area for the first block of corresponding logical block address position LBA0 on the logical physical conversion table 411 and writes the physical block address PBA8 of the second block PB8 into storage area for the second block of corresponding logical block address position LBA0 on the logical physical conversion table 411. Then the address management unit 410 notifies the CPU 122 of physical block address PBA10 of the PB10 and physical block address PBA8 of the PB8.

The CPU 122 writes LBA0 corresponding to PBA10 and LBA0 corresponding to PBA8 into current block status table 231 and after that, the CPU 122 proceeds to writing processing of the data stored temporarily in the buffer memory 210 into the PB10 and PB8.

The CPU 122 executes storage processing to the buffer memory 210 and at the same time, executes data writing processing into the PB10 and PB8 depending on stored state. Specifically, when the write pointer points to a position more than four words ahead of the read pointer, the data writing instruction to the PB10 and PB8 is issued to the reading/writing controller 220. For example, when the read pointer points to the word number 0 and the write pointer points to the word number 4, it means that the data is stored temporarily in word numbers 0 to 3 of the buffer memory 210, therefore the data writing instruction as much as one page to the PB10 and PB8 can be issued.

The CPU 122 transfers the data stored in the area of the word numbers 0 to 3 of the buffer memory 210 to the reading/writing controller 220 and sets the data holding flag of word numbers 0 to 3 of the buffer memory 210 to value 10. Simultaneously with this, the address management unit 410 refers to the logical address LA stored in the buffer memory 210, considers a page number in the logical address format shown in FIG. 11 as the page number (current page number) of writing destination, and transfers it sequentially to the reading/writing controller 220 and error page identification part 230.

The reading/writing controller 220 writes data into corresponding page of the PB10 in the nonvolatile memory 110 and upon completion of writing, the nonvolatile memory 110 puts the ready/busy flag into ready state, and notifies the state to the error page identification part 230 and CPU 122. When, as a result of notification, it is judged normal writing has been made without error occurrence, the same data is also written into corresponding page of the PB8.

Besides, when no error occurred, the CPU 122, after received the ready/busy flag, sets the data holding flag of the word numbers 0 to 3 of the buffer memory 210 to value 00, and executes renewal so that the read pointer may point to the word number 4. When the write pointer is pointing to a word number more than the word number 8, the CPU 122 writes the data stored in the word numbers 4 to 7 into the PB10 and PB8 similarly.

At a point when data is being stored temporarily in all areas of the buffer memory 210, the writing processing as much as one cluster from the access device 101 is completed, and data of the logical addresses LA0 to LA31 stored in the buffer memory 210 are being stored in pages 0 to 7 of the PB10 and PB8. This processing is represented by arrows A1, A2 shown in FIG. 34A.

When writing is completed, the nonvolatile memory 110 puts the ready/busy flag into ready state, and notifies the state to the error page identification part 230 and CPU 122. When, as a result of notification, the CPU 122 judges that normal writing has been made without error occurrence, the CPU 122 notifies the access device 101 via the IF 121 of "Corresponding cluster has been written normally".

As mentioned above, data stored in the buffer memory 210 are written into corresponding page of the PB10 and PB8 one by one. As for temporary storage of data from the access device 101 to the buffer memory 210, writing is made into the buffer memory 210 with rotational manner depending on above mentioned write pointer. In other words, the write pointer returns to the word number 0 subsequent to the word number 28. On this occasion, if data holding status flag value of the word number 0 is not 00, it means that temporary storage into the buffer memory 210 is prohibited. If this is the case, and if the access device 101 is under the writing command, the memory controller 120C outputs the wait signal to the access device 101 via the host IF 121 to interrupt data transfer. The access device 101 continues interruption of data transfer until this wait signal is released.

When normal writing has not been made due to error occurrence with both or either of the PB10 or PB8, it proceeds to the error correction processing.

When the access device 101 writes continually data as much as one cluster of the logical addresses LA32 to LA63, a series of processings similar to those mentioned above are carried out to store the data into pages 8 to 15 of the PB10 and PB8. This processing corresponds to B1, B2 shown in FIG. 34A. Further, when the access device 101 executes continually writing processing as much as one cluster of the logical addresses LA64 to LA95, a series of processings similar to those mentioned above are carried out to store the data into corresponding pages 16 to 23 of the PB10 and PB8.

[Error Correction Processing to be Taken at Flash Trouble Occurrence]

Here, processing to be taken when normal writing is not possible due to the occurrence of the flash trouble in writing to the page 17 of the PB10 will be explained using FIG. 34B. Processing of the flash trouble judgment unit 133 is similar to that of FIG. 19 of embodiment 1.

In FIG. 19, in writing to the page 17 of the PB8, the address management unit 310 transfers the current page number to the reading/writing controller 127 and error page identification part 203. Upon completion of writing into the page 17 of the PB8, the nonvolatile memory 110 transfers error status to the memory controller 100*c*, and the flash trouble judgment unit 133 receives the error status (S202). The flash trouble judgment unit 133 checks error status and when a flag showing error occurrence is being set (S203), recognizes that flash trouble occurred under writing into the page 17 of the PB8. The flash trouble judgment unit 133 then sets error page number (physical address) and error type flag to value 1 considering page 17 is to be error occurrence page and transfers them to the substitution processor 241 (S204). Meanwhile, as for the error type flag, value 0 denotes the error due to the power shutdown and value 1 denotes the error due to the flash trouble.

The substitution processor 241 receives the error page number and error type flag transferred from the error page identification part 230 and when the error type flag is value 1, the substitution processor 241 executes the copy processing and retry processing as the substitution processing.

The copy processing is such processing that, data written into the block where no error occurred, i.e., data written into pages 0 to 16 of sub-block PB8, is transcribed to separate invalid physical block (PB5) to construct a new main block, and this processing is represented by arrow D in FIG. 34B. In the copy processing, first, the address management unit 126 acquires the erased physical block PB5 as the copying destination block, and the substitution processor 241 executes the copy processing of lower order address pages (page 0 to 16) than error occurrence page (page 17).

In the meantime, the retry processing is processing to write again the data, that once failed to be written into page 17 of the PB10, into the page 17 of the PB5, and this is represented by arrow E in FIG. 34B. In the retry processing, the substitution processor 241 executes the retry processing of the error occurrence page, and when writing is successful, writing into page 18 and onward is continued. When writing fails, "Corresponding cluster has not been written normally" is notified to the access device to remind rewriting command of the cluster.

By the substitution processing as explained above, it is possible to correct the errors due to the flash trouble. The address management unit 410 sets a corresponding status flag in the physical area management table to an invalid block so that the PB10 may be used next after being erased.

[Error Correction Processing to be Taken at Power Shutdown Occurrence]

As for error correction processing to be taken at the power shutdown occurrence is to execute above-mentioned error correction processing at flash trouble occurrence in initial state after the power startup, and as for processing contents, only the copy processing shown in FIG. 34B is carried out. Namely, the retry processing is not carried out.

[Aggregation Processing]

After writing of a predetermined logical address has been completed and at a point of time when moved to writing into separate logical block, the CPU 122 notifies the aggregation processor 332 that the logical block address has been moved. Upon receiving this notification, the aggregation processor 332 executes the aggregation processing.

The aggregation processor 332 copies the data stored in the first block PB10 and the second block PB8 to a new invalid block PB22, as shown in FIG. 35. The aggregation processor 332 writes the PBA22 into storage area at corresponding logical block address position of the logical physical conversion table 411 and at the same time, sets status flag of the PBA22 of the physical area management table 141 to a valid block.

Besides, the address management unit 410 sets status flag of the physical area management table 141 to invalid block so that the PB10 and PB8 may be used next.

As described above, according to embodiment 4 of the present invention, the writing block acquisition part 242 responds to the writing command from the access device 101, and gives an instruction to the address management unit 126 to acquire the same number (N=2) of physical blocks as instructed by the page information indication unit 243, and two physical blocks are acquired as the block to be written. The reading/writing controller 220 writes the same data to these physical blocks. Therefore, when an error occurred in one physical block, substitution processing is provided using the data (all are normal data) being stored in other physical block, and the aggregation processor 332 copies the data of the first page of the first block and of the second page of the second block to an invalid physical block, and therefore, it is possible to correct an error characteristic to the nonvolatile memory 110 in which each of memory cells holds data lying astride over two pages, namely, such an error that data stored in the first page is changed by writing error in the second page.

Since the nonvolatile memory 110 is a memory in which each memory cell holds data lying astride over two pages, it is designated to be N=2. When a memory that holds data lying astride over three pages is used, the page information indicator 153 may simply indicate N=3.

Table 4 is a summary of differences of error processing between conventional nonvolatile memory System and nonvolatile memory System according to embodiment 4 of the present invention. By adding an error correction processing, the present embodiment is able to overcome such conventional problem, that is, an error characteristic to the nonvolatile memory (multiple-valued NAND flash memory) in which each memory cell holds data lying astride over a plurality of pages.

TABLE 4

|  | Correction to be taken at flash trouble occurrence | Correction to be taken at power shutdown occurrence |
|---|---|---|
| Conventional | Substitution processing: Copy Retry | Substitution processing: Copy only |
| Embodiment 4 of present invention | Error correction processing: Copy Retry | Error correction processing: Copy |

The present invention is not limited to above described embodiments.

The memory controller, the nonvolatile memory Device and the nonvolatile memory System according to the present invention are able to improve the reliability of the device employing nonvolatile memory in which each memory cell holds data lying astride over a plurality of pages. The present invention can be applied to recording media provided in portable AV equipment such as still image recording and playback device, moving image recording and playback device or the like, or portable communication equipment such as cellular phone or the like.

Although preferred embodiments are described in the present specification, it is understood that other embodiments and modifications which those skilled in the art can come up with are covered by the scope and spirit of the present invention and, such other embodiments and modifications are included in the claims described hereinafter.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2005-142558 filed on 16 May 2005 is hereby incorporated by reference.

What is claimed is:

1. A memory controller for writing data from outside to a nonvolatile memory composed of a plurality of pages in which each memory cell holds data in a plurality of pages constituting a group, and for reading data in said nonvolatile memory comprising:
   an error corrector for correcting an error that has occurred to data stored in other pages of the same group of a writing error occurrence page;
   a reading/writing controller for writing data into said nonvolatile memory and for reading data in said nonvolatile memory; and
   an error page identification part for identifying a page having an error occurrence, when an error has occurred during writing into a certain page of said nonvolatile memory;
   wherein said error corrector comprises:
   a page information indication unit for outputting page information relating to pages constituting a same group;
   a restoration page identification part for identifying a page in the same group as the error occurrence page as a restoration page, based on said error occurrence page and said page information; and
   a substitution/restoration processor for executing restoration of data including the restoration page identified by said restoration page identification part.

2. The memory controller according to claim 1, further comprising a buffer memory for temporarily storing data given from outside,
   wherein said buffer memory has a storage capacity greater than a storage capacity of an area including all pages for each of the groups.

3. The memory controller according to claim 2,
   wherein said buffer memory is a nonvolatile RAM.

4. The memory controller according to claim 2,
   wherein said nonvolatile memory comprises a plurality of physical blocks,
   and said substitution/restoration processor executes copy processing by transcribing data written into an error free page of a physical block by writing to a separate invalid physical block of said nonvolatile memory and restoration processing by writing the data again, that has an error in writing and remains in said buffer memory, into a restoration page of said invalid physical block.

5. The memory controller according to claim 3,
   wherein said nonvolatile memory comprises a plurality of physical blocks,
   and said substitution/restoration processor executes:
   copy processing by transcribing data written into error free page of the physical block under writing to a separate invalid physical block of said nonvolatile memory;
   restoration processing by writing the data again, that has an error in writing and remains in said buffer memory, into a restoration page of said invalid physical block; and
   retry processing by writing data that has the error in writing into said invalid physical block.

6. The memory controller according to claim 1,
   wherein said nonvolatile memory comprises a plurality of physical blocks,
   and said error corrector comprises:
   a page information indication unit for outputting information of a page number N (N is an integer greater than or equal to 2) constituting a same group;
   a writing block acquisition part for acquiring writing object physical blocks as many as N based on page number N obtained from said page information indication unit, as a writing destination of data given from outside; and
   a substitution processor for correcting an error by copying data stored in said writing object physical block that is different from a writing object physical block including said error page into a separate invalid physical block.

7. The memory controller according to claim 6,
   wherein said substitution processor executes copy processing by transcribing data written into an error free page of the physical block under writing to a separate invalid physical block of said nonvolatile memory.

8. The memory controller according to claim 6, wherein said substitution processor executes copy processing by transcribing data written into an error free page of the physical block to a separate invalid physical block of said nonvolatile memory, and retry processing by writing data that has error in writing into said invalid physical block.

9. The memory controller according to claim 1,
   wherein said nonvolatile memory comprises a plurality of physical blocks;
   said error corrector comprises:
   a page information indication unit for outputting a page number N (N is an integer greater than or equal to 2) constituting a same group and page type information;
   a writing block acquisition part for acquiring, as writing destination of data given from outside, writing object physical blocks as many as N based on page number N obtained from said page information indication unit;
   a writing block acquisition part for acquiring writing object physical blocks as many as N based on page number N obtained from said page information indication unit, as a writing destination of data given from outside; and
   an aggregation processor for rewriting data written into said writing object physical block with a predetermined timing by aggregation into at least one physical block; and
   a substitution processor for correcting an error, when an error occurred, by copying data stored in said writing object physical block including said error page into a separate invalid physical block; and
   wherein said memory controller further includes an address management unit for selecting a physical block as a writing destination based on said page type information and a writing destination page.

10. The memory controller according to claim 9,
    wherein said substitution processor comprises, in addition to said copy processing, retry processing by writing data that has an error in writing into said physical block again into said invalid physical block.

11. The memory controller according to claim 1,
    wherein said nonvolatile memory comprises a plurality of physical blocks;
    said error corrector comprises:
    a page information indication unit for outputting the number of pages N (N is an integer greater than or equal to 2) constituting a same memory cell,
    a writing block acquisition part for acquiring writing object physical blocks as many as N based on the number of pages N obtained from said page information indication unit, as a writing destination of data given from outside;
    an aggregation processor for rewriting the data written into said writing object physical block with a predetermined timing by aggregation into at least one physical block; and
    a substitution processor for correcting an error, when an error occurred, by copying a data stored in said writing object physical block, that is different from a physical block including said error occurrence page, into a separate invalid physical block.

12. The memory controller according to claim 11, wherein said substitution processor further includes, in addition to said copy processing, retry processing for writing data that has an error in writing into said physical block again into said invalid physical block.

13. A nonvolatile memory device comprises a nonvolatile memory which has a plurality of pages and in which each memory cell holds data over a plurality of pages constituting a group, and a memory controller for writing data given from outside and for reading data from said nonvolatile memory,
wherein said memory controller has an error corrector for correcting an error that has occurred to data stored in other pages of the same group as the error page with the writing error;
a reading/writing controller for writing data into said nonvolatile memory and for reading data in said nonvolatile memory; and
an error page identification part for identifying, when an error occurred during writing into a certain page of said nonvolatile memory;
wherein said error corrector comprises:
a page information indication unit for outputting page information relating to pages constituting a same group;
a restoration page identification part for identifying a page in the same group as the error occurrence page as a restoration page, based on said error occurrence page and said page information, a page constituting a group same as the error occurrence page as a restoration page; and
a substitution/restoration processor for executing restoration of data including the restoration page identified by said restoration page identification part.

14. The nonvolatile memory device according to claim 13, further comprising a buffer memory for temporarily storing data given from outside,
wherein said buffer memory has a storage capacity greater than a storage capacity of an area including all pages for each of the groups.

15. The nonvolatile memory device according to claim 14, wherein said buffer memory is a nonvolatile RAM.

16. The nonvolatile memory device according to claim 14, wherein said nonvolatile memory comprises a plurality of physical blocks,
and said substitution/restoration processor executes copy processing by transcribing data written into an error free page of a physical block by writing to a separate invalid physical block of said nonvolatile memory and restoration processing by writing the data again, that has an error in writing and remains in said buffer memory, into a restoration page of said invalid physical block.

17. The nonvolatile memory device according to claim 15, wherein said nonvolatile memory comprises a plurality of physical blocks,
and said substitution/restoration processor executes:
copy processing by transcribing data written into error free page of the physical block under writing to a separate invalid physical block of said nonvolatile memory;
restoration processing by writing the data, that has an error in writing and remains in said buffer memory, into a restoration page of said invalid physical block; and
retry processing by writing data that has the error in writing again into said invalid physical block.

18. The nonvolatile memory device according to claim 13, wherein said nonvolatile memory comprises a plurality of physical blocks,
and said error corrector comprises:
a page information indication unit for outputting information of a page number N (N is an integer greater than or equal to 2) constituting a same group;
a writing block acquisition part for acquiring, as writing destination of data given from outside, writing object physical blocks as many as N based on page number N obtained from said page information indication unit, as a writing destination of data given from outside; and
a substitution processor for correcting an error by copying data stored in said writing object physical block that is different from a writing object physical block including said error page into a separate invalid physical block.

19. The nonvolatile memory device according to claim 18, wherein said substitution processor executes copy processing by transcribing data written into an error free page of the physical block under writing to a separate invalid physical block of said nonvolatile memory.

20. The nonvolatile memory device according to claim 18, wherein said substitution processor executes copy processing by transcribing data written into an error free page of the physical block to a separate invalid physical block of said nonvolatile memory, and retry processing by writing data that has error in writing into said invalid physical block.

21. The nonvolatile memory device according to claim 13, wherein said nonvolatile memory comprises a plurality of physical blocks;
said error corrector comprises:
a page information indication unit for outputting a page number N (N is an integer greater than or equal to 2) constituting a same group and page type information;
a writing block acquisition part for acquiring writing object physical blocks as many as N based on page number N obtained from said page information indication unit, as a writing destination of data given from outside;
an aggregation processor for rewriting data written into said writing object physical block with a predetermined timing by aggregation into at least one physical block; and
a substitution processor for correcting an error, when an error occurred, by copying data stored in said writing object physical block including said error page into a separate invalid physical block; and
wherein said memory controller further includes an address management unit for selecting a physical block as a writing destination based on said page type information and a writing destination page.

22. The nonvolatile memory device according to claim 21, wherein said substitution processor comprises, in addition to said copy processing, retry processing for writing data again that has an error in writing into said physical block into said invalid physical block.

23. The nonvolatile memory device according to claim 13, wherein said nonvolatile memory comprises a plurality of physical blocks;
said error corrector comprises:
a page information indication unit for outputting the number of pages N (N is an integer greater than or equal to 2) constituting a same memory cell,
a writing block acquisition part for acquiring writing object physical blocks as many as N based on the number of pages N obtained from said page information indication unit, as a writing destination of data given from outside;

an aggregation processor for rewriting the data written into said writing object physical block with a predetermined timing by aggregation into at least one physical block; and a substitution processor for correcting an error, when an error occurred, by copying a data stored in said writing object physical block, that is different from a physical block including said error occurrence page, into a separate invalid physical block.

24. The nonvolatile memory device according to claim 23, wherein said substitution processor further includes, in addition to said copy processing, retry processing for writing data again that has an error in writing into said physical block into said invalid physical block.

25. A data writing method for writing data given from outside to a nonvolatile memory which is composed of a plurality of pages and in which each memory cell holds data in a plurality of pages constituting a group, wherein an error that occurred to data stored in another page of a same group as an error page with a writing error, is erased;

storing temporarily data given from outside in a buffer memory;

writing data from said buffer memory to a nonvolatile memory; and identifying a page where an error has occurred when writing into a certain page of said nonvolatile memory;

correcting an error using an error corrector that comprises the steps of: outputting page information relating to pages comprising a same group;

identifying a page in the same group as the error occurrence page as a restoration page using a restoration page identification part based on said error occurrence page and said page information; and executing restoration of data including the restoration page identified by said restoration page identification part, using a substitution/restoration processor.

* * * * *